United States Patent
Kwon et al.

(10) Patent No.: US 10,734,585 B2
(45) Date of Patent: Aug. 4, 2020

(54) ORGANIC LIGHT-EMITTING APPARATUS

(71) Applicants: Samsung Electronics Co., Ltd., Suwon-si, Gyeonggi-do (KR); UNIVERSITY OF UTAH RESEARCH FOUNDATION, Salt Lake City, UT (US)

(72) Inventors: Ohyun Kwon, Seoul (KR); Hyeonho Choi, Seoul (KR); Kyuyoung Hwang, Anyang-si (KR); Youngjae Park, Seoul (KR); Byoungki Choi, Hwaseong-si (KR); Zeev Valentine Vardeny, Salt Lake City, UT (US); Dali Sun, Salt Lake City, UT (US); Tek Prasad Basel, Santa Barbara, CA (US)

(73) Assignees: SAMSUNG ELECTRONICS CO., LTD., Gyeonggi-Do (KR); UNIVERSITY OF UTAH RESEARCH FOUNDATION, Salt Lake City, UT (US)

(*) Notice: Subject to any disclaimer, the term of this patent is extended or adjusted under 35 U.S.C. 154(b) by 400 days.

(21) Appl. No.: 15/050,833

(22) Filed: Feb. 23, 2016

(65) Prior Publication Data

US 2017/0244042 A1 Aug. 24, 2017

(51) Int. Cl.
*H01L 51/00* (2006.01)
*H01L 51/50* (2006.01)
(Continued)

(52) U.S. Cl.
CPC .......... *H01L 51/0051* (2013.01); *C09K 11/02* (2013.01); *C09K 11/06* (2013.01);
(Continued)

(58) Field of Classification Search
CPC .............. H01L 51/0069; H01L 51/008; H01L 51/0085; H01L 2251/552; H01L 51/52;
(Continued)

(56) References Cited

U.S. PATENT DOCUMENTS 6,866,947 B1 * 3/2005 Fukuoka ................ C09K 11/06
313/504
7,645,525 B2 1/2010 Aziz et al.
(Continued)

FOREIGN PATENT DOCUMENTS

JP 2007227509 9/2007
KR 1020070069022 7/2007
(Continued)

OTHER PUBLICATIONS

Zhang et al, Efficient Triplet Application in Exciplex Delayed-Fluorescence OLEDs Using a Reverse Intersystem Crossing Mechanism Based on a _ES-T of Around Zero, Applied Material & Interfaces, vol. 6, Issues 15, pp. 11907-11914, (2014).*
(Continued)

*Primary Examiner* — Alexander C Kollias
(74) *Attorney, Agent, or Firm* — Cantor Colburn LLP

(57) ABSTRACT

An organic light-emitting apparatus includes an organic light-emitting device and a magnetic field-applying member that applies a magnetic field to the organic light-emitting device. The organic light-emitting device includes a host and a dopant.

13 Claims, 2 Drawing Sheets

(51) Int. Cl.
- *C09K 11/02* (2006.01)
- *C09K 11/06* (2006.01)
- *H01L 27/32* (2006.01)
- *H01L 51/52* (2006.01)

(52) U.S. Cl.
CPC ........ *H01L 27/3232* (2013.01); *H01L 51/006* (2013.01); *H01L 51/008* (2013.01); *H01L 51/0054* (2013.01); *H01L 51/0055* (2013.01); *H01L 51/0056* (2013.01); *H01L 51/0058* (2013.01); *H01L 51/0059* (2013.01); *H01L 51/0061* (2013.01); *H01L 51/0067* (2013.01); *H01L 51/0069* (2013.01); *H01L 51/0072* (2013.01); *H01L 51/0073* (2013.01); *H01L 51/0074* (2013.01); *H01L 51/5012* (2013.01); *C09K 2211/1007* (2013.01); *C09K 2211/1011* (2013.01); *H01L 51/0085* (2013.01); *H01L 51/0087* (2013.01); *H01L 51/5016* (2013.01); *H01L 51/5024* (2013.01); *H01L 51/52* (2013.01); *H01L 2251/5376* (2013.01); *H01L 2251/552* (2013.01)

(58) Field of Classification Search
CPC ............. H01L 51/0087; H01L 51/5016; H01L 51/5024; H01L 2251/5376; H01L 51/0051; H01L 51/0073; H01L 51/0072; H01L 51/0067; H01L 51/0061; H01L 51/006; H01L 51/0055; H01L 51/0074; H01L 27/3232; H01L 51/5012; H01L 51/0054; H01L 51/0056; H01L 51/0058; H01L 51/0059; C09K 2211/1011; C09K 2211/1007; C09K 11/02; C09K 11/06
See application file for complete search history.

(56) References Cited

U.S. PATENT DOCUMENTS

| | | | |
|---|---|---|---|
| 2003/0146443 A1* | 8/2003 | Yamazaki | H01L 51/0059 257/80 |
| 2006/0141286 A1* | 6/2006 | Tada | H01L 51/0057 428/690 |
| 2012/0104940 A1* | 5/2012 | Shin | C09K 11/06 313/504 |
| 2014/0368555 A1 | 12/2014 | Namkung | |
| 2015/0162557 A1 | 6/2015 | Vardeny et al. | |

FOREIGN PATENT DOCUMENTS

| KR | 1020140146792 | 12/2014 |
|---|---|---|
| WO | 2014008429 | 1/2014 |

OTHER PUBLICATIONS

Extended Search Report issued by the European Patent Office for Application No. 16184356.0-1555 dated Jun. 20, 2017.
Jie Zhou et al. "Charge-transfer-featured materials-promising hosts for fabrication of efficient OLEDs through triplet harvesting via triplet fusion", Chem. Commun., 2014, vol. 50, No. 57, 7586-7589.
Tek Basel et al. "Magnetic Field Enhancement of Organic Light-Emitting Diodes Based on Electron Donor-Acceptor Exciplex", Adv. Electron. Mater. 2016, vol. 2, 1500248, 9 pages.
Tony C. Wu et al. "Solid state photon upconversion utilizing thermally activated delayed fluorescence molecules as triplet sensitizer", Applied Physics Letters 2015, 107, 031103, 4 pages.
Yifei Wang et al. "Immense Magnetic Response of Exciplex Light Emission due to Correlated Spin-Charge Dynamics", American Physical Society, Physical Review X 6 011011 (2016), 12 pages.

\* cited by examiner

ORGANIC LIGHT-EMITTING APPARATUS

BACKGROUND

1. Field

The present disclosure relates to organic light-emitting apparatuses.

2. Description of the Related Art

Organic light-emitting devices are self-emission devices that may have wide viewing angles, high contrast ratios, short response times, and excellent brightness, driving voltage, and response speed characteristics, and produce full-color images.

For example, an organic light-emitting device may include an anode, a cathode, and an organic layer between the anode and the cathode and including an emission layer. A hole transport region may be provided between the anode and the emission layer, and an electron transport region may be provided between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons change from an excited state to a ground state, thereby generating light.

SUMMARY

Provided is an organic light-emitting apparatus including: an organic light-emitting device which includes an emission layer including a host and a dopant; and a magnetic field-applying member which applies a magnetic field to the organic light-emitting device.

Additional aspects will be set forth in part in the description which follows and, in part, will be apparent from the description, or may be learned by practice of the presented exemplary embodiments.

According to an aspect of an embodiment, an organic light-emitting apparatus includes an organic light-emitting device, and a magnetic field-applying member that applies a magnetic field to the organic light-emitting device, wherein the organic light-emitting device includes: a first electrode; a second electrode facing the first electrode; and an organic layer between the first electrode and the second electrode and including an emission layer, the emission layer includes a host and a dopant, and an absolute value of a difference between a singlet ($S_1$) energy of the host and a triplet ($T_1$) energy of the host is 0.3 eV or less.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
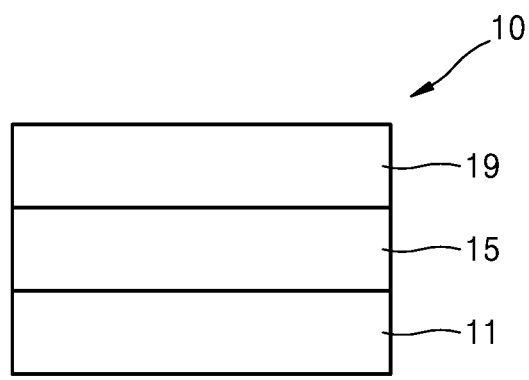
FIG. 1 is a schematic cross-sectional view of an organic light-emitting device according to an embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects.

When a first element is referred to as being "on" a second element, the first element can be directly on, directly connected to, or directly coupled to the second element, or one or more intervening elements may be present. In contrast, when a first element is referred to as being "directly on", "directly connected to", or "directly coupled to" a second element, there are no intervening elements intentionally provided between the first element and the second element. Like numbers may refer to like elements in this application. Spatially relative terms, such as "under", "above", "upper", and the like, may be used for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-section illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of embodiments.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations of the stated value.

As used herein, the term "and/or" includes any and all combinations of one or more of the associated listed items. Expressions such as "at least one of", when preceding a list of elements, modify the entire list of elements and do not modify the individual elements of the list. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An organic light-emitting apparatus includes an organic light-emitting device and a magnetic field-applying member which applies a magnetic field to the organic light-emitting device.

The organic light-emitting device may include a first electrode, a second electrode facing the first electrode, and an organic layer between the first electrode and the second electrode, the organic layer including an emission layer.

The emission layer includes a host and a dopant. In the emission layer, an amount of the host may be greater than that of the dopant.

An absolute value of a difference between singlet ($S_1$) energy of the host and triplet ($T_1$) energy of the host is 0.3 eV or less, for example, 0.2 eV or less. In some embodiments, the absolute value of a difference between singlet ($S_1$) energy of the host and triplet ($T_1$) energy of the host may be 0.1 eV or less. Within these conditions, up-conversion from a triplet state to a singlet state may effectively occur, thereby enabling emission of high efficiency-delayed fluorescence. Accordingly, the host may be a material that is capable of emitting delayed fluorescence.

The host may include a combination of a hole transport compound and an electron transport compound (for example, a mixture consisting of a hole transport compound and one or more electron transport compounds), or may consist of a single compound.

When the host includes a mixture of a hole transport compound and an electron transport compound, the hole transport compound and the electron transport compound may form an exciplex. The exciplex is an excited state complex formed between the hole transport compound and the electron transport compound.

In some embodiments, an absolute value of a difference between singlet ($S_1$) energy of the exciplex and triplet ($T_1$) energy of the exciplex may be 0.3 eV or less, for example, 0.2 eV or less. In some embodiments, the absolute value of a difference between singlet ($S_1$) energy of the exciplex and triplet ($T_1$) energy of the exciplex may be 0.1 eV or less. Within these conditions, up-conversion from a triplet state to a singlet state may effectively occur, thereby enabling emission of high efficiency-delayed fluorescence. Accordingly, the exciplex may be a material that is capable of emitting delayed fluorescence.

The hole transport compound may be a compound represented by at least one of Formulae 1 to 5:

Formula 1

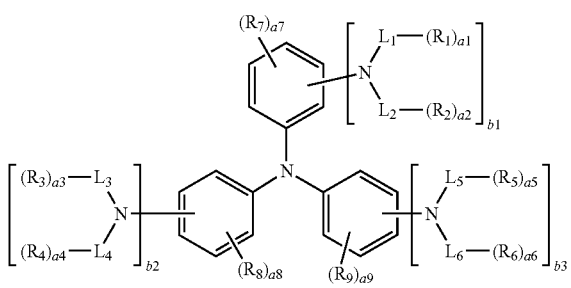

Formula 2

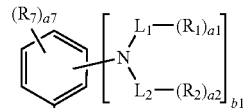

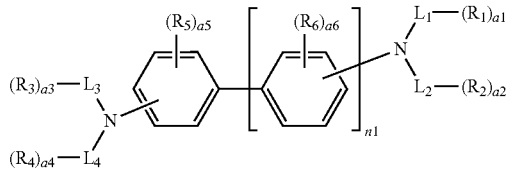

Formula 3

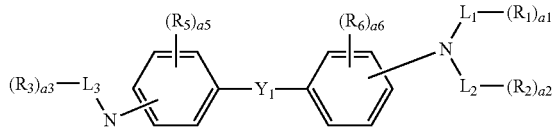

Formula 4

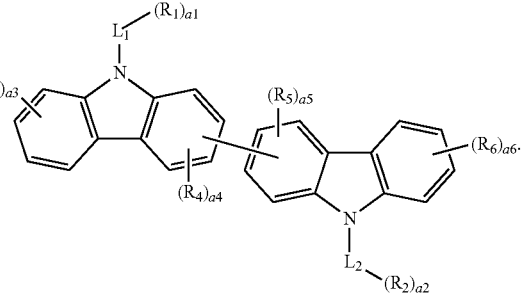

Formula 5

In Formulae 1 to 5, $L_1$ to $L_6$ and $Y_1$ may each independently be a substituted or unsubstituted $C_5$-$C_{60}$ carbocyclic group, $X_1$ may be N or C($R_{21}$), $X_2$ may be N or C($R_{22}$), $X_3$ may be N or C($R_{23}$), and at least one of $X_1$ to $X_3$ may be N, $R_1$ to $R_9$ and $R_{21}$ to $R_{23}$ may each independently be selected from hydrogen, deuterium, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and —N($Q_1$)($Q_2$), wherein $Q_1$ and $Q_2$ may each independently be selected from hydrogen, deuterium, a substituted or unsubstituted $C_1$-$C_{60}$ alkyl group, a substituted or unsubstituted $C_1$-$C_{60}$ alkoxy group, and a substituted or unsubstituted $C_6$-$C_{60}$ aryl group, and $R_1$ and $R_2$ may optionally be chemically linked, i.e., bind to each other and form a saturated or unsaturated ring, $R_3$ and $R_4$ may optionally bind to each other and form a saturated or unsaturated ring, and $R_5$ and $R_6$ may optionally bind to each other and form a saturated or unsaturated ring.

a1 to a9 may each independently be an integer of 0 to 5, b1 to b3 may each independently be 1 or 2, and n1 may be 0 or 1.

In some embodiments, $L_1$ to $L_6$ and $Y_1$ may each independently be selected from a cyclopentane group, a cyclohexane group, a cyclohexene group, a benzene group, a naphthalene group, an anthracene group, and a fluorene group; and a cyclopentane group, a cydohexane group, a cyclohexene group, a benzene group, a naphthalene group, an anthracene group, and a fluorene group, each substituted with at least one substituent independently selected from deuterium, a $C_1$-$C_{10}$ alkyl group, a $C_1$-$C_{10}$ alkoxy group, and a phenyl group.

In some embodiments, in Formula 2, $X_1$ to $X_3$ may all be N, or $X_1$ may be $C(R_{21})$, and $X_2$ and $X_3$ may be N, but embodiments are not limited thereto.

In some embodiments, $R_1$ to $R_9$ and $R_{21}$ to $R_{23}$ may each independently be selected from hydrogen, deuterium, a $C_1$-$C_{10}$ alkyl group, a $C_1$-$C_{10}$ alkoxy group, a phenyl group, and —$N(Q_1)(Q_2)$, wherein $Q_1$ and $Q_2$ may each independently be selected from hydrogen, deuterium, a $C_1$-$C_{10}$ alkyl group, a $C_1$-$C_{10}$ alkoxy group, and a phenyl group.

In some embodiments, a1 to a9 may each independently be 0, 1, or 2.

For example, the hole transport compound may be at least one of TCTA, CBP, NPB, MeO-TPD, or Compounds 1 to 32, but is not limited thereto:

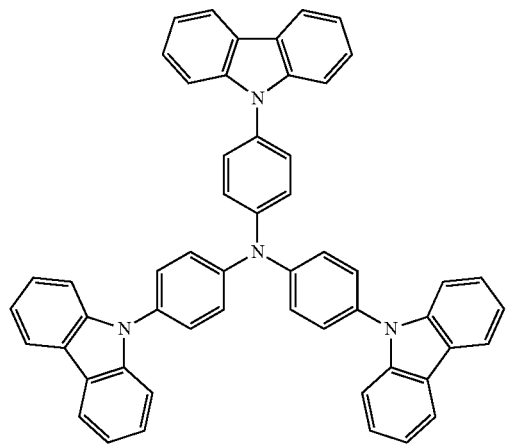

TCTA

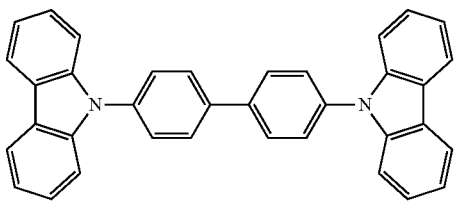

CBP

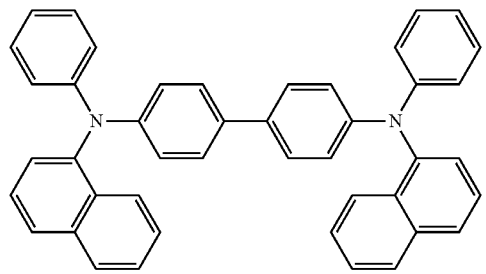

CBP

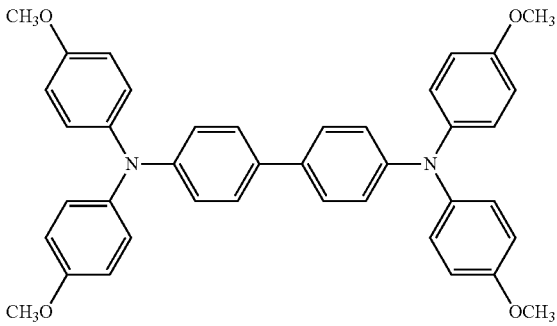

MeO-TPD

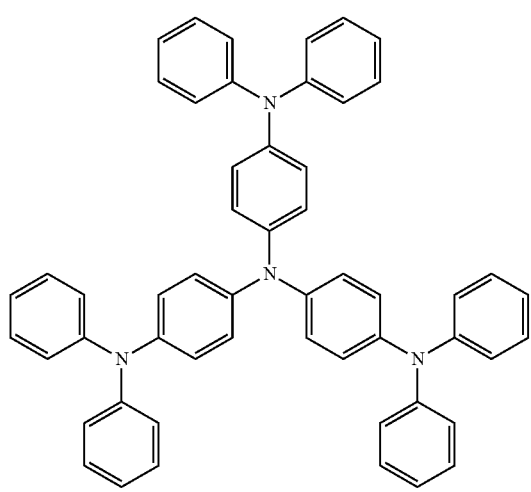

1

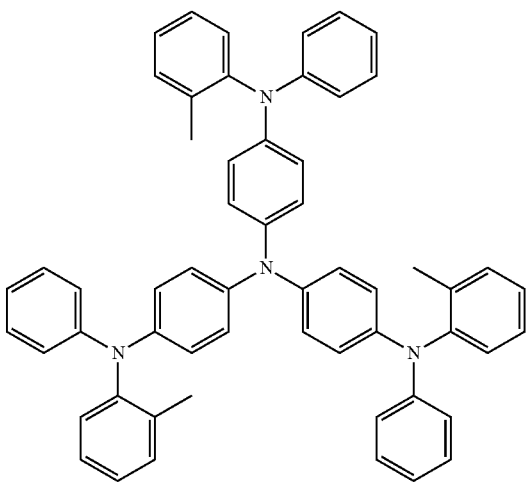

2

-continued
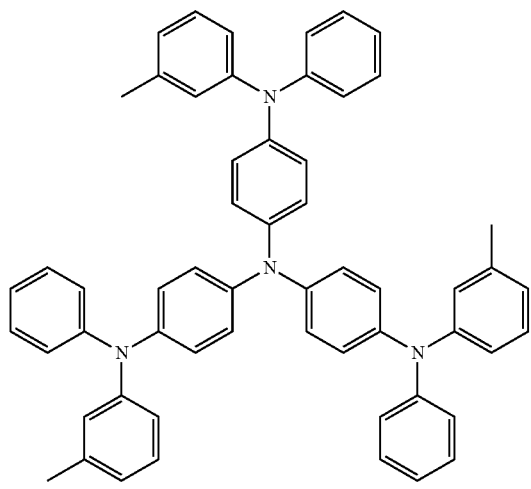
3
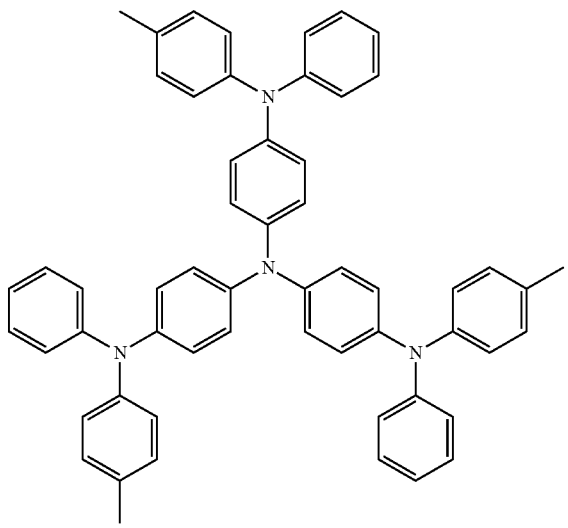
4
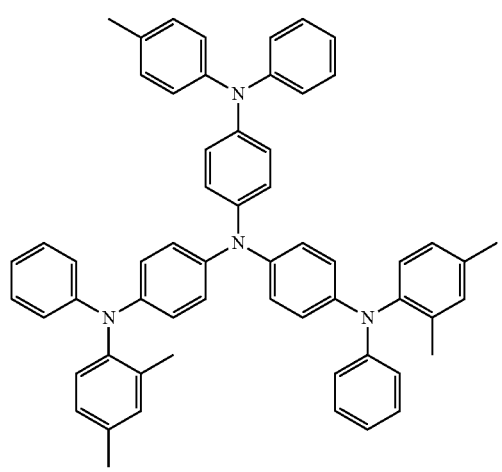
5
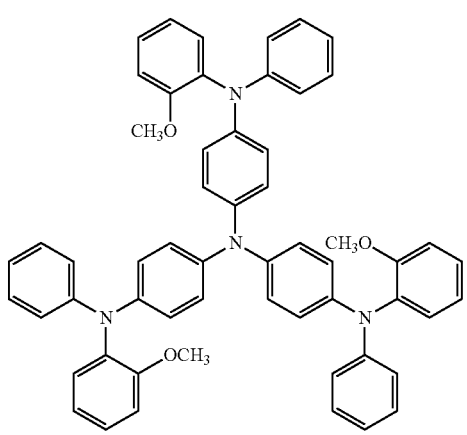
6
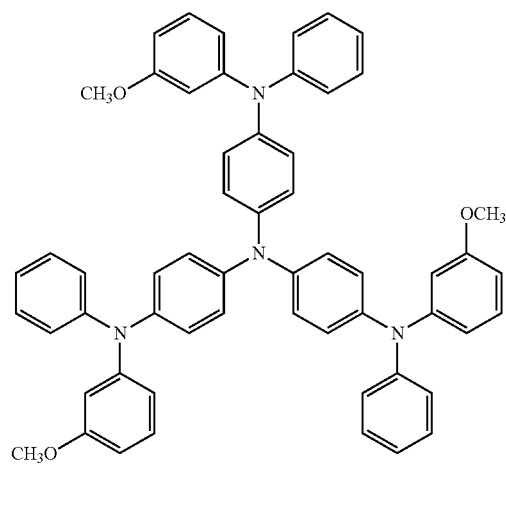
7
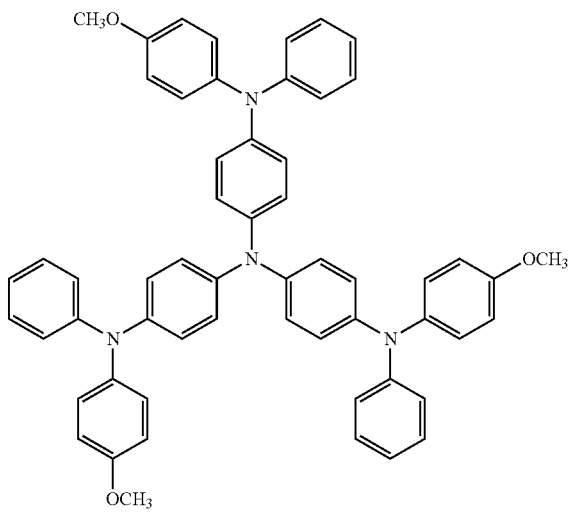
8

-continued
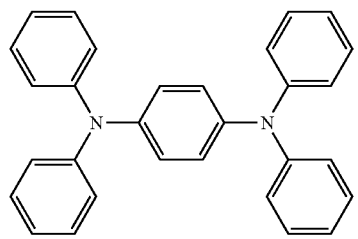
9
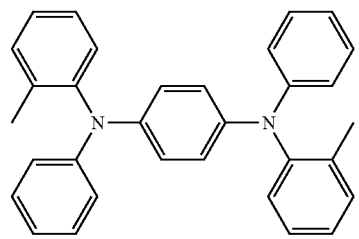
10
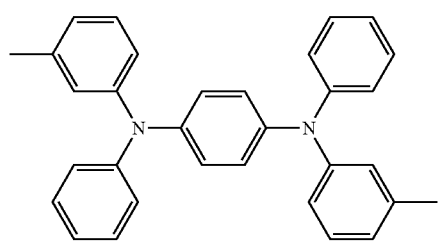
11
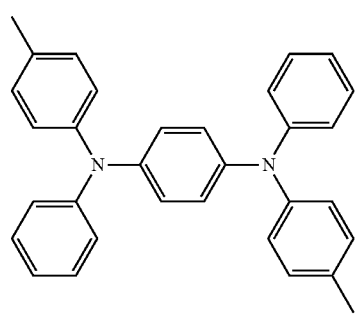
12
13
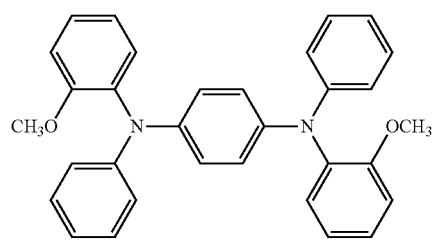
14
15
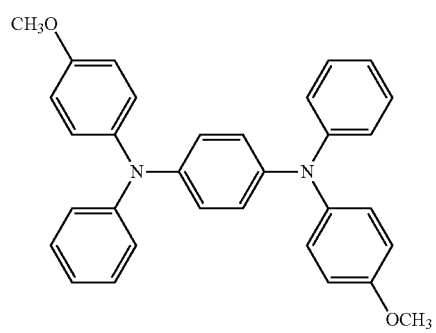
16

-continued
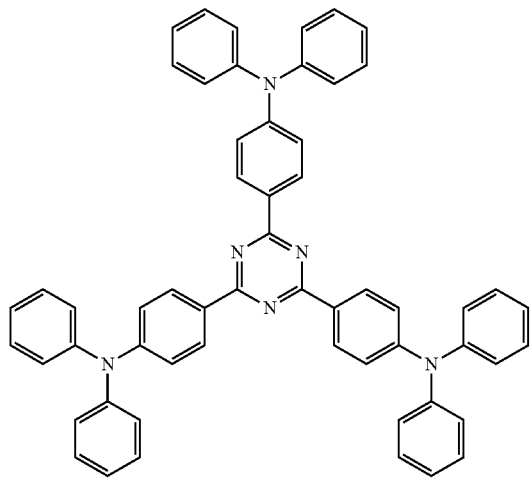
17
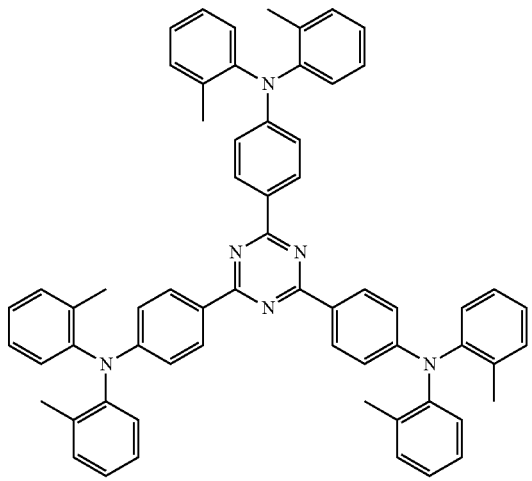
18
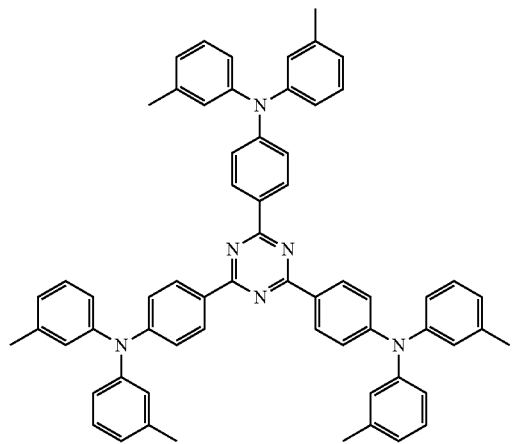
19
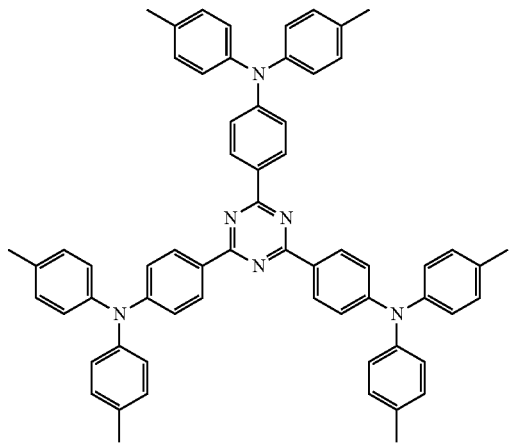
20
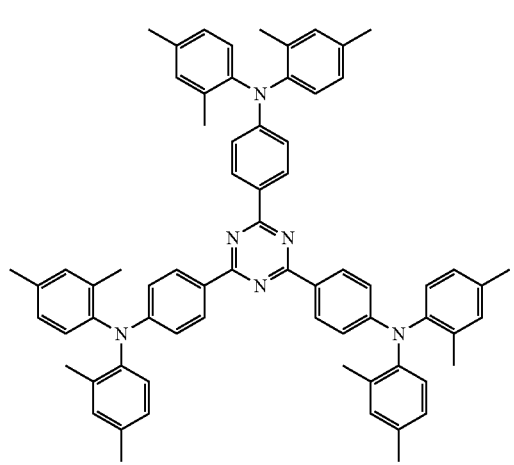
21
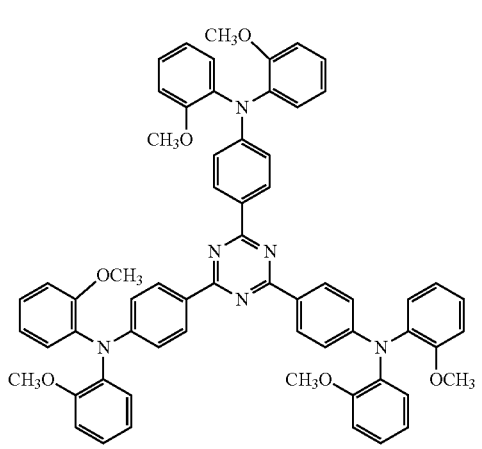
22

23
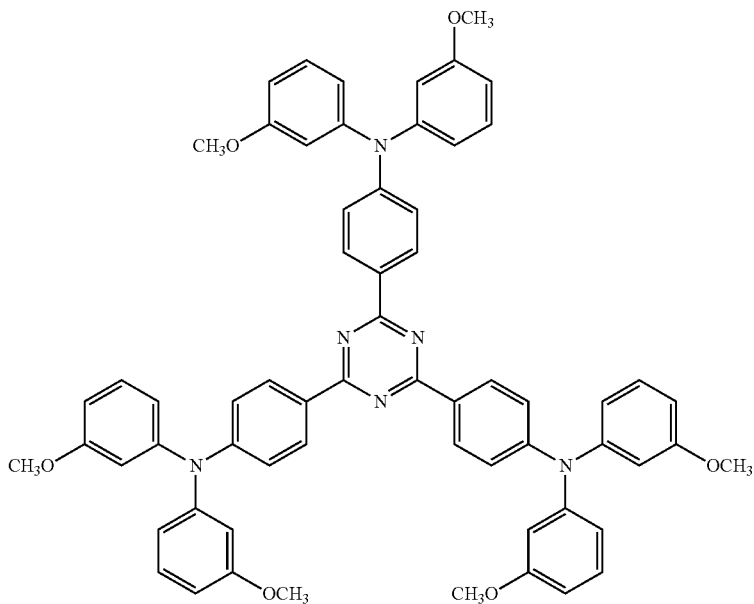
24
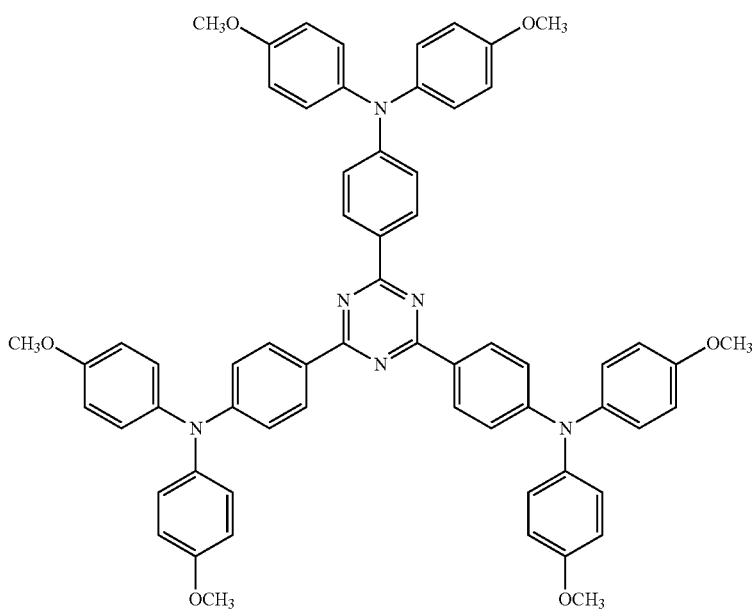

-continued
25
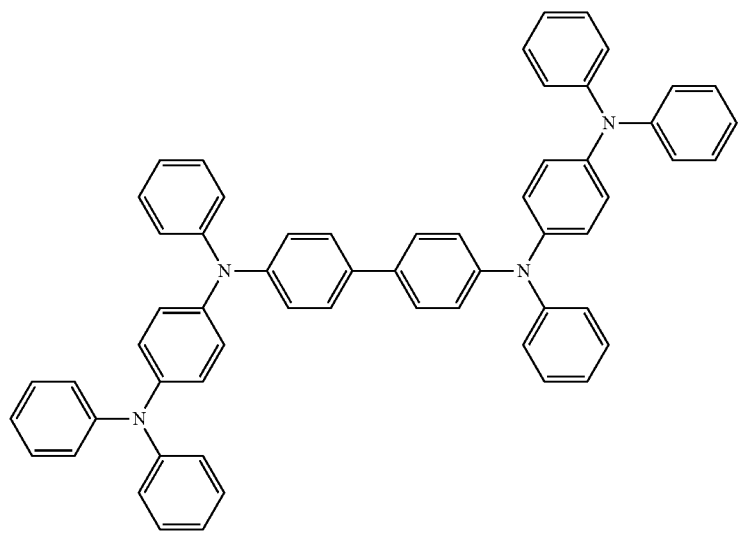
26
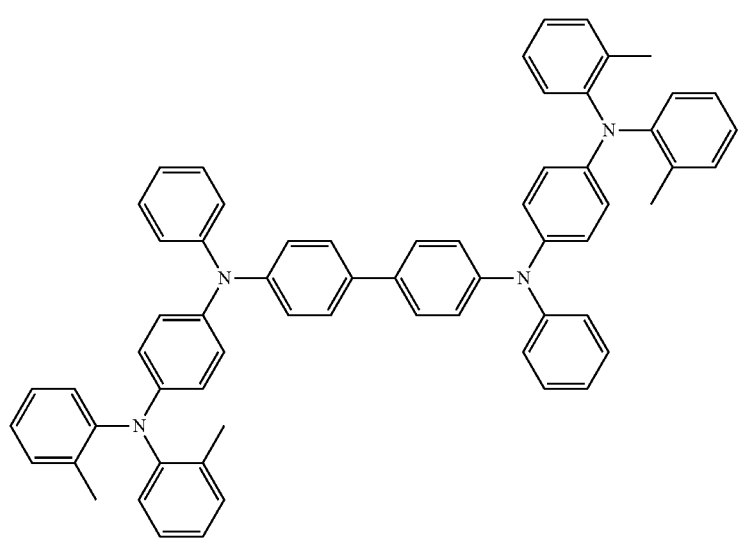
27
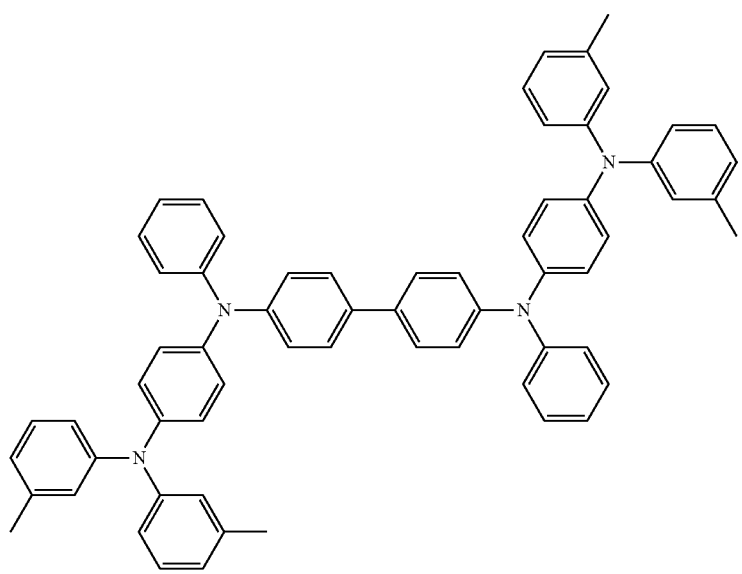

-continued
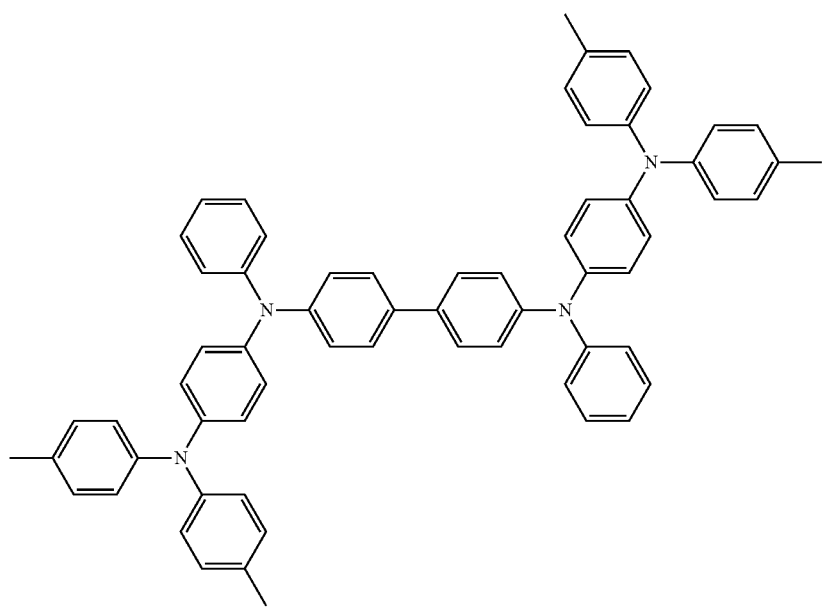
28
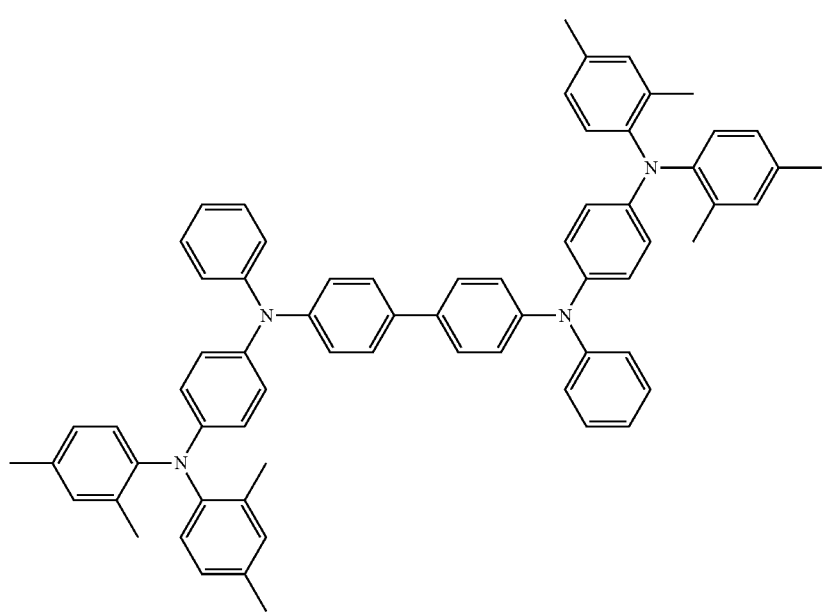
29

-continued
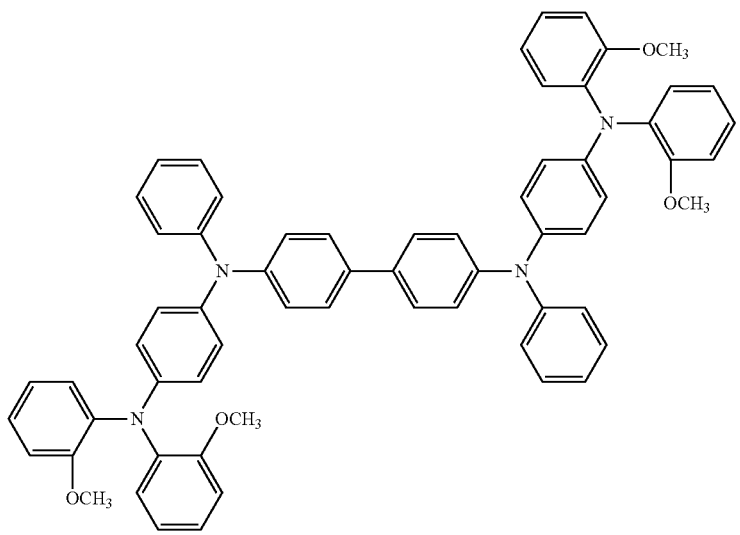
30
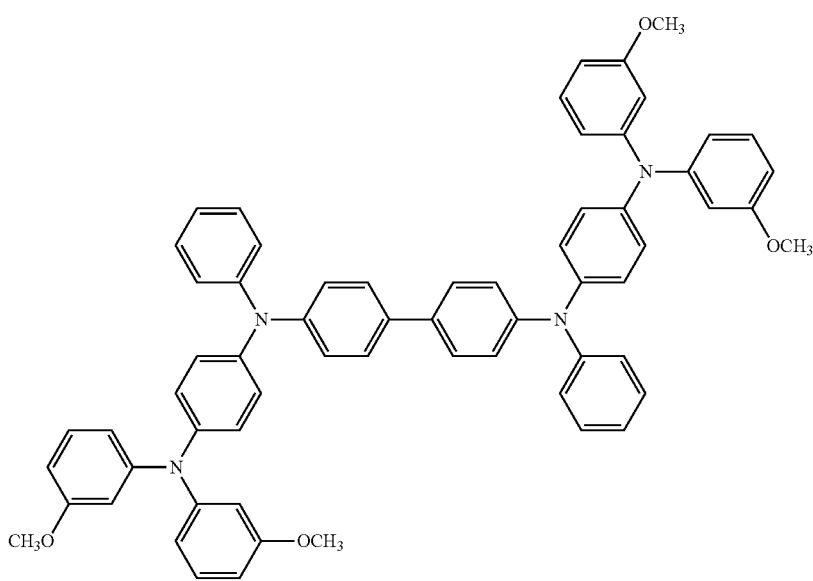
31

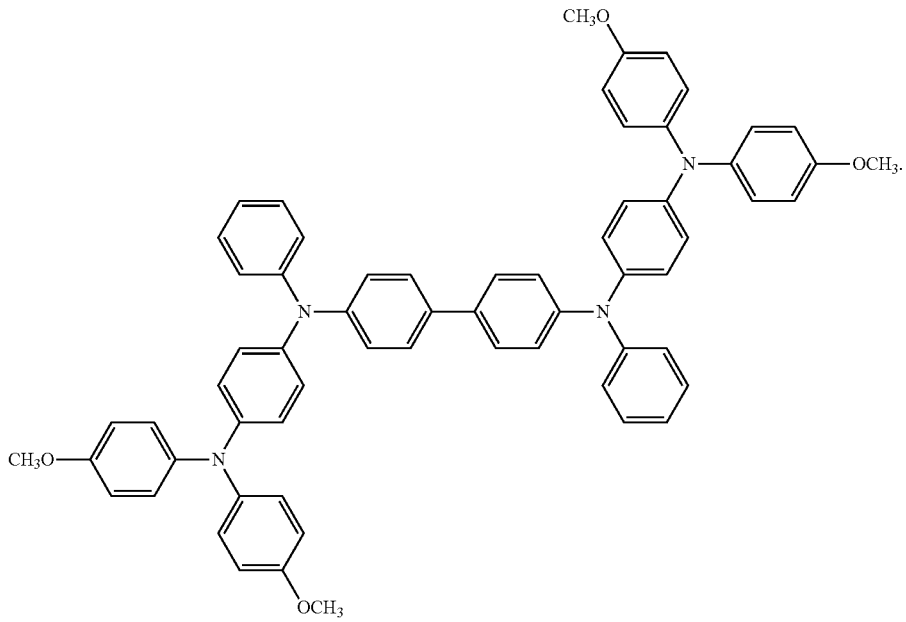

The electron transport compound may be a compound represented by one of Formulae 11 to 15:

Formula 11
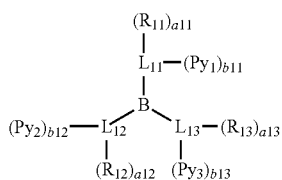

Formula 12
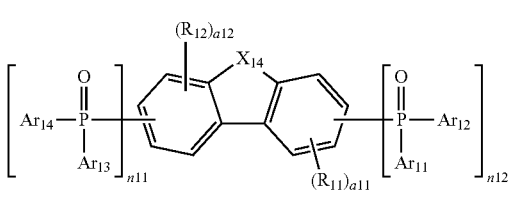

Formula 13
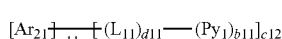

Formula 14
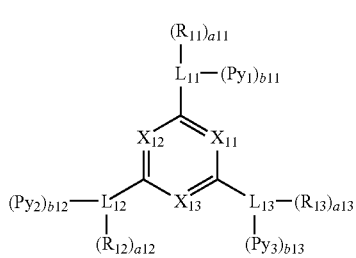

Formula 15
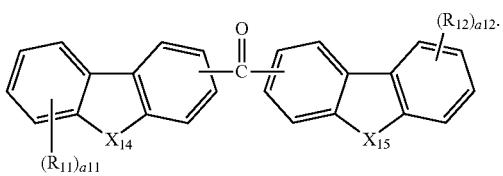

In Formulae 11 to 15, $L_{11}$ to $L_{13}$ and $Ar_{21}$ may each independently be a substituted or unsubstituted $C_5$-$C_{60}$ carbocyclic group or a $C_1$-$C_{60}$ heterocyclic group, c111 may be an integer of 1 to 3, and when c111 is 2 or more, two or more $Ar_{21}$(s) may be condensed, i.e., fused with each other or may bind to each other via a single bond, d11 may be 0, 1, or 2, $X_{11}$ may be N or $C(R_{31})$, $X_{12}$ may be N or $C(R_{32})$, $X_{13}$ may be N or $C(R_{33})$, and at least one of $X_{11}$ to $X_{13}$ may be N, $X_{14}$ may be S, $S(=O)_2$, or $C(R_{34})(R_{35})$, $X_{15}$ may be S, $S(=O)_2$, or $C(R_{36})(R_{37})$, $R_{11}$ to $R_{13}$ and $R_{31}$ to $R_{33}$ may each independently be selected from hydrogen, deuterium, a substituted or unsubstituted $C_1$-$C_{60}$ alkyl group, a substituted or unsubstituted $C_1$-$C_{60}$ alkoxy group, and a substituted or unsubstituted $C_6$-$C_{60}$ aryl group, $R_{34}$ to $R_{37}$ may each independently be selected from a substituted or unsubstituted $C_1$-$C_{60}$ alkyl group and a substituted or unsubstituted $C_6$-$C_{60}$ aryl group, $R_{34}$ and $R_{35}$ may optionally bind to each other and form a saturated or unsaturated ring, and $R_{36}$ and $R_{37}$ may optionally bind to each other and form a saturated or unsaturated ring, a11 to a13 may each independently be an integer of 0 to 5, $Py_1$ to $Py_3$ may each independently be selected from a pyridinyl group, a pyrimidinyl group, a pyrazinyl group, a pyridazinyl group, a triazinyl group, a benzoimidazolyl group, a quinolinyl group, an isoquinolinyl group, a quinazolinyl group, a quinoxalinyl group, an imidazopyridinyl group, and an imidazopyrimidinyl group; and a pyridinyl group, a pyrimidinyl group, a pyrazinyl group, a pyridazinyl group, a triazinyl group, a benzoimidazolyl group, a quinolinyl group, an isoquinolinyl group, a quinazolinyl group, a quinoxalinyl group, an imidazopyridinyl group, and an imidazopyrimidinyl group, each substituted with at least one substituent independently selected from deuterium, a $C_1$-$C_{10}$ alkyl group, a $C_1$-$C_{10}$ alkoxy group, a phenyl group, a biphenyl group, and a terphenyl group, b11 may be 1, 2, or 3, b12 and b13 may each independently be 0, 1, 2, or 3, $Ar_{11}$ to $Ar_{14}$ may each independently be selected from a substituted or unsubstituted $C_8$-$C_{60}$ aryl group, n11 and n12 may each independently be 0, 1, 2, or 3, and the sum of n11 and n12 may be 1 or greater, and c12 may be an integer of 1 to 6.

In some embodiments, $L_{11}$ to $L_{13}$ and $Ar_{21}$ may each independently be selected from a cyclopentane group, a cyclopentadiene group, a benzene group, a naphthalene group, an anthracene group, an indene group, a fluorene group, a phenanthrene group, a pyridine group, a pyrimidine group, a pyrazine group, a pyridazine group, a triazine group, a benzoimidazole group, a quinoline group, an isoquinoline group, a quinazoline group, a quinoxaline group, an imidazopyridine group, and an imidazopyrimidine group; and a cyclopentane group, a cyclopentadiene group, a benzene group, a naphthalene group, an anthracene group, an indene group, a fluorene group, a phenanthrene group, a pyridine group, a pyrimidine group, a pyrazine group, a pyridazine group, a triazine group, a benzoimidazole group, a quinoline group, an isoquinoline group, a quinazoline group, a quinoxaline group, an imidazopyridine group, and an imidazopyrimidine group, each substituted with at least one substituent independently selected from deuterium, a $C_1$-$C_{10}$ alkyl group, a $C_1$-$C_{10}$ alkoxy group, and a phenyl group.

In some embodiments, $X_{11}$ to $X_{13}$ in Formula 14 may all be N.

In some embodiments, $R_{11}$ to $R_{13}$ and $R_{31}$ to $R_{33}$ may each independently be selected from hydrogen, deuterium, a $C_1$-$C_{10}$ alkyl group, and a $C_1$-$C_{10}$ alkoxy group.

In some embodiments, $R_{34}$ to $R_{37}$ may each independently be selected from a phenyl group and a naphthyl group; and a phenyl group and a naphthyl group, each substituted with at least one selected from deuterium, a $C_1$-$C_{10}$ alkyl group, and a $C_1$-$C_{10}$ alkoxy group, $R_{34}$ and $R_{35}$ may bind to each other via a single bond, and $R_{36}$ and $R_{37}$ may bind to each other via a single bond.

In some embodiments, a11 to a13 may each independently be 0, 1, or 2.

In some embodiments, $Py_1$ to $Py_3$ may each independently be selected from a pyridinyl group, a pyrimidinyl group, a triazinyl group, and a benzoimidazolyl group; and a pyridinyl group, a pyrimidinyl group, a triazinyl group, and a benzoimidazolyl group, each substituted with at least one substituent independently selected from deuterium, a $C_1$-$C_{10}$ alkyl group, a $C_1$-$C_{10}$ alkoxy group, a phenyl group, a biphenyl group, and a terphenyl group.

In some embodiments, b11 may be 1 or 2, and b12 and b13 may each independently be 0, 1, or 2.

In some embodiments, $Ar_{11}$ to $Ar_{14}$ may each independently be selected from a phenyl group, a naphthyl group, an anthracenyl group, and a fluorenyl group; and a phenyl group, a naphthyl group, an anthracenyl group, and a fluorenyl group, each substituted with at least one substituent independently selected from deuterium, a $C_1$-$C_{10}$ alkyl group, and a $C_1$-$C_{10}$ alkoxy group.

In some embodiments, in Formula 12, n11 may be 0 or 1, and n12 may be 1.

In some embodiments, in Formula 13, c11 may be 1, and c12 may be 1, 2, or 3.

For example, the electron transport compound may be at least one of B3PYMPM, TPBi, 3TPYMB, BmPyPB, BSFM, or any one of Compounds 101 to 120, but is not limited thereto:

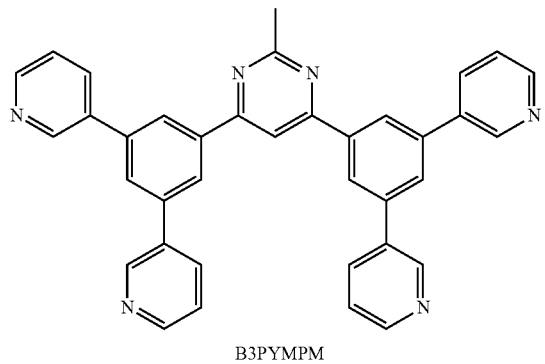

B3PYMPM

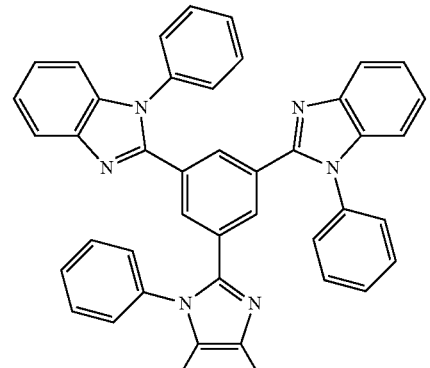

TPBi

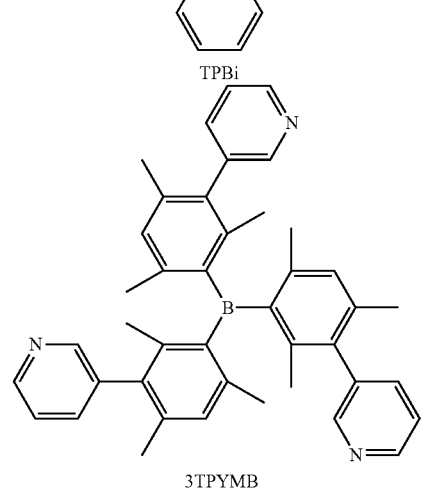

3TPYMB

-continued
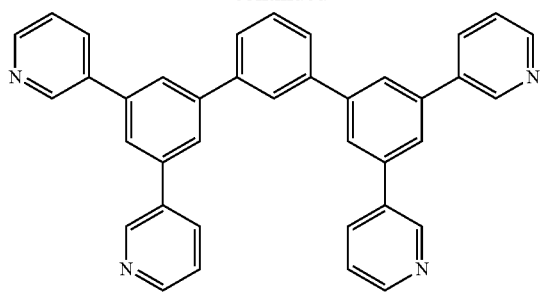
BmPyPB
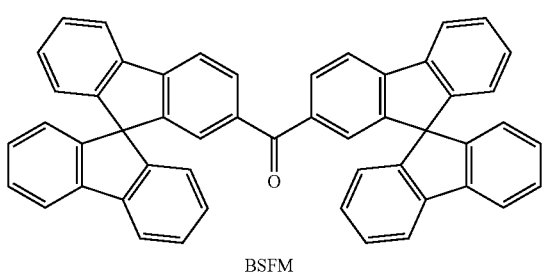
BSFM
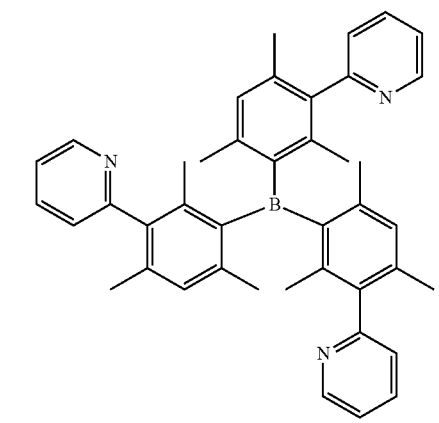
101
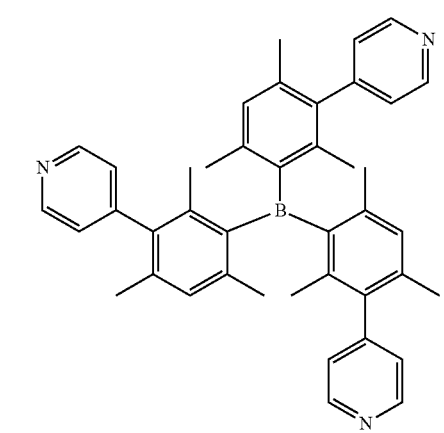
102
-continued
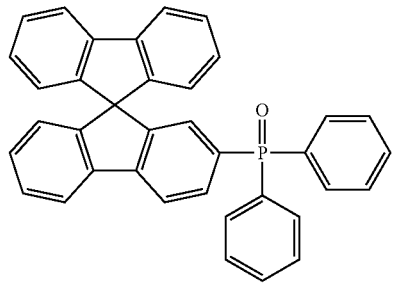
103
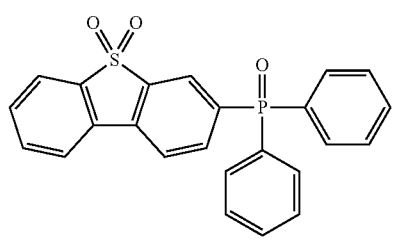
104
105
106
107
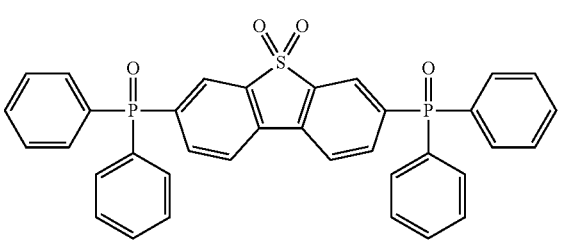
108

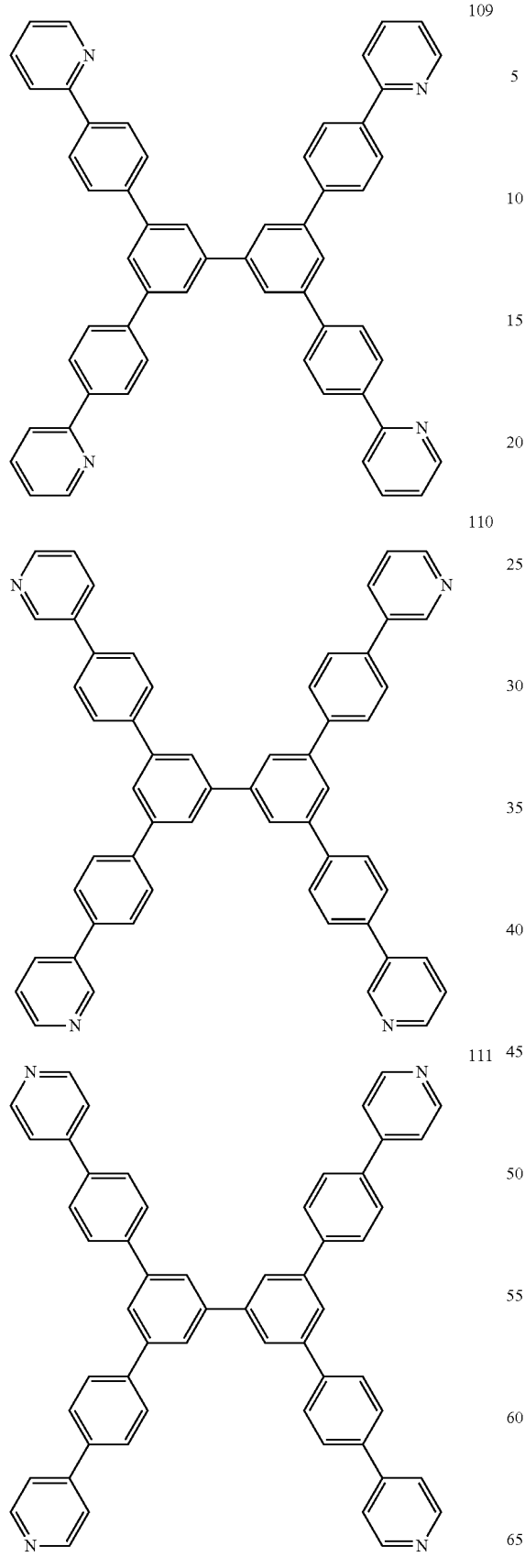
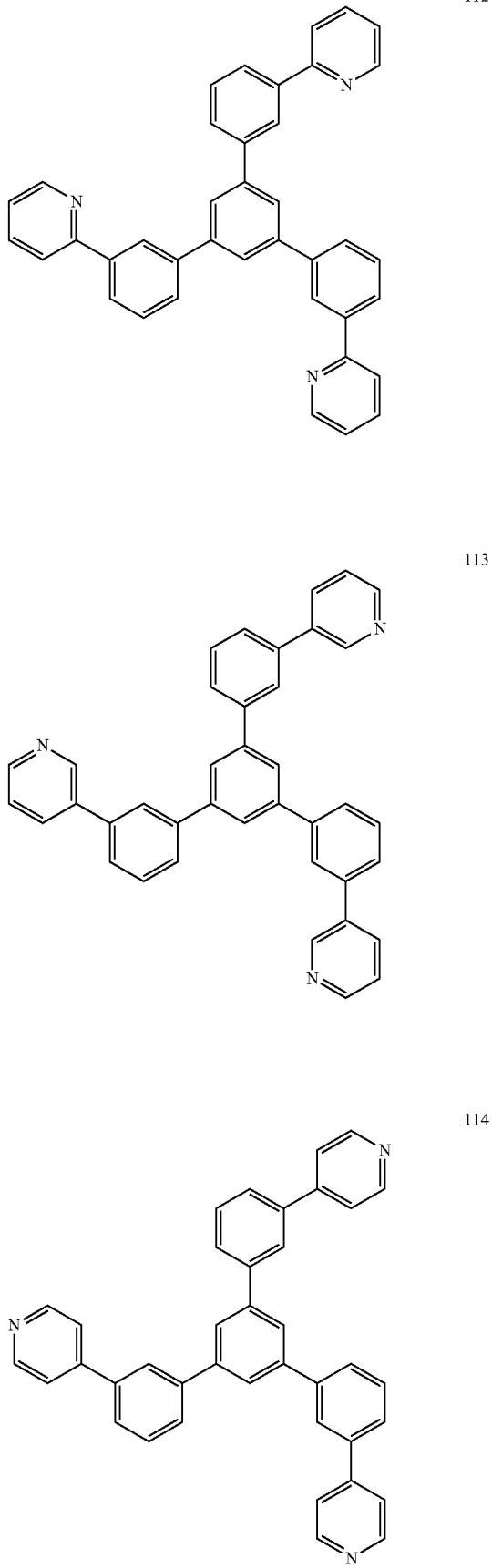

115
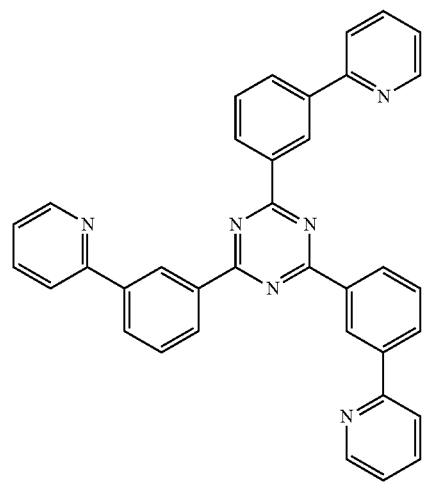
116
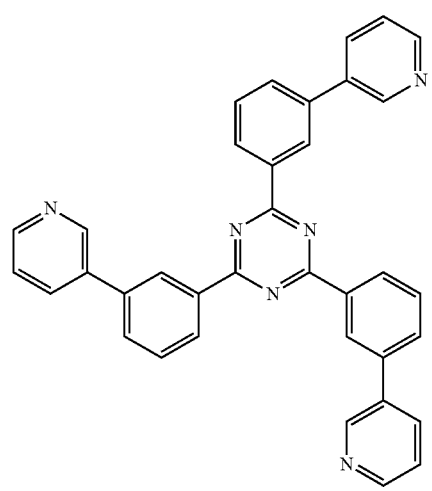
117
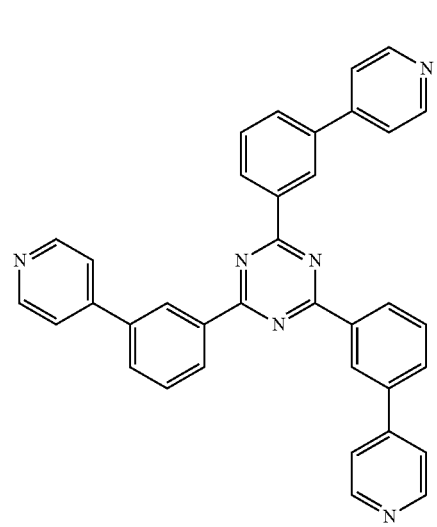
118
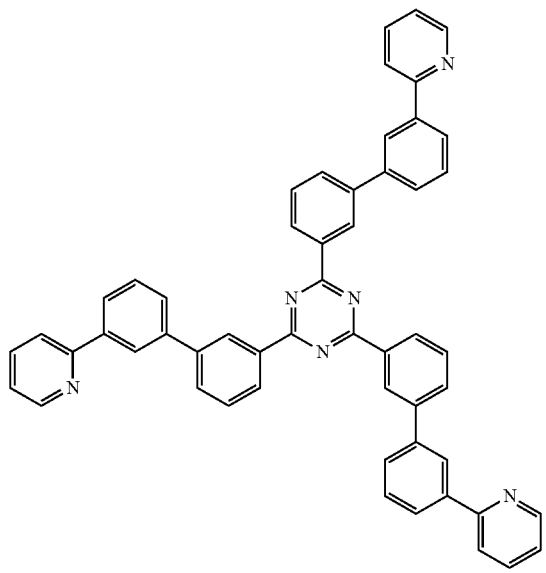
119
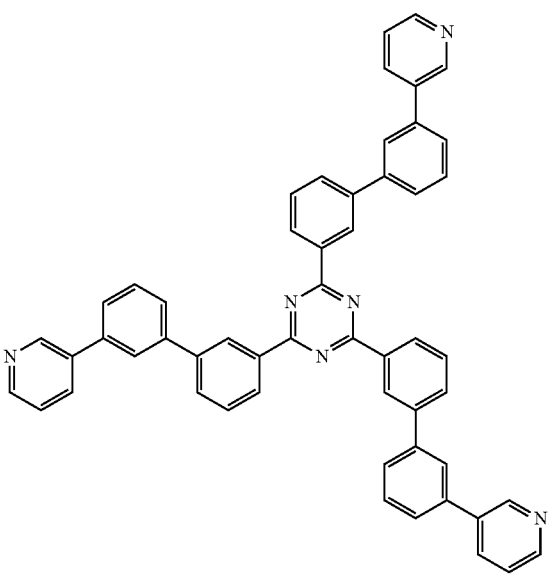

-continued

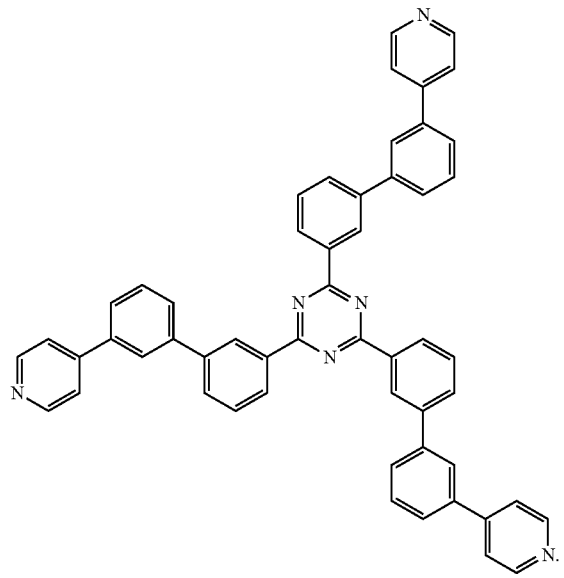

When the host consists of a single compound, the host may be an indenocarbazole compound, an indolocarbazole compound, a benzofurocarbazole compound, or a benzothiophenocarbazole compound.

For example, the host may be an indenocarbazole, an indolocarbazole, a benzofurocarbazole, or a benzothiophenocarbazole, each substituted with at least one substituent independently selected from deuterium, a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a triazinyl group, a diphenylpyridinyl group, a diphenylpyrimidinyl group, and a diphenyltriazinyl group.

The dopant in the emission layer may be a fluorescent dopant.

For example, in the emission layer, a singlet ($S_1$) energy of the fluorescent dopant may be lower than a singlet ($S_1$) energy of the fluorescent host. Accordingly, energy of excitons generated by the fluorescent host may rapidly transfer to the fluorescent dopant by Forster energy transfer, and substantially, emission occurs only in the fluorescent dopant in the emission layer of the organic light-emitting device, thereby embodying a fluorescent dopant-based fluorescent emission spectrum with excellent color purity. In addition, fluorescent emission having relatively short excitons lifespan may occur, and accordingly, an efficiency-conversion phenomenon under high luminance (also called a roll-off phenomenon), which may occur due to an interaction between a plurality of excitons (an interaction between excitons) or an interaction between an excitons and a charge (hole or electron) (an interaction between an excitons and a polaron), is suppressed to produce an organic light-emitting device with high efficiency.

The fluorescent dopant may be a condensed polycyclic compound or a styryl compound.

For example, the fluorescent dopant may include a naphthalene core, a fluorene core, a spiro-bifluorene core, a benzofluorene core, a dibenzofluorene core, a phenanthrene core, an anthracene core, a fluoranthene core, a triphenylene core, a pyrene core, a chrysene core, a naphthacene core, a picene core, a perylene core, a pentaphene core, an indeno-anthracene core, a tetracene core, a bisanthracene core, a core represented by one of Formulae 501-1 to 501-18, or any combination thereof, but is not limited thereto:

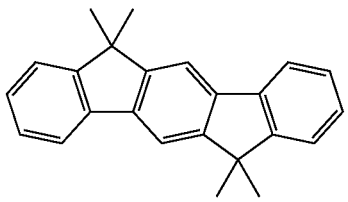

Formula 501-1

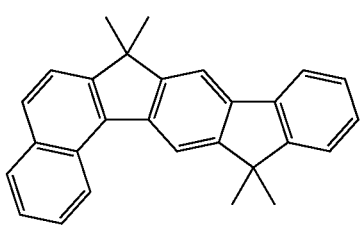

Formula 501-2

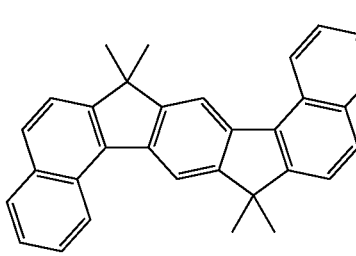

Formula 501-3

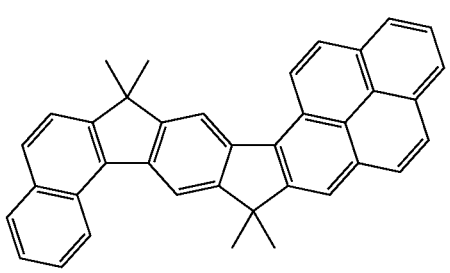

Formula 501-4

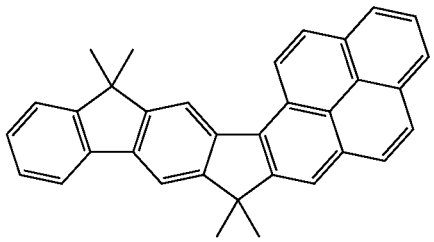

Formula 501-5

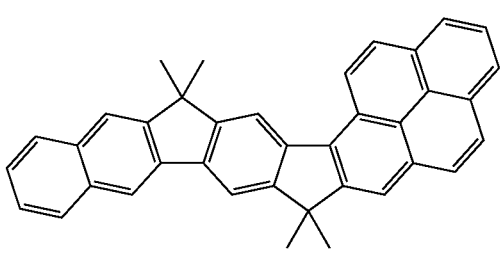

Formula 501-6

-continued
Formula 501-7
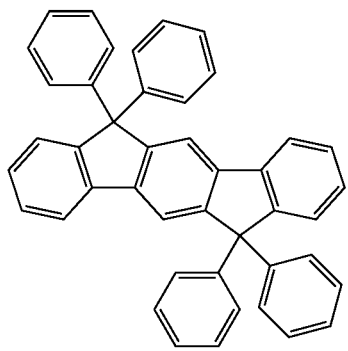
Formula 501-8
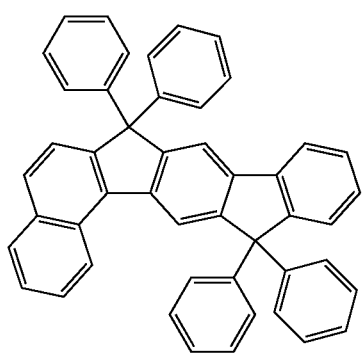
Formula 501-9
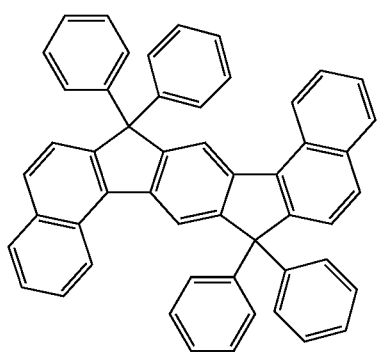
Formula 501-10
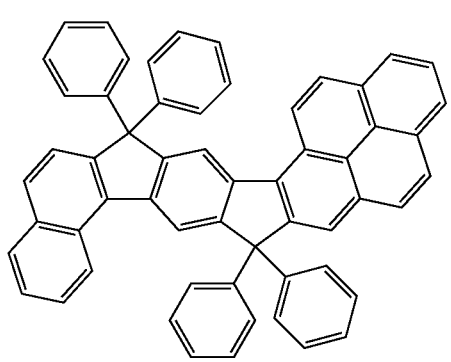
-continued
Formula 501-11
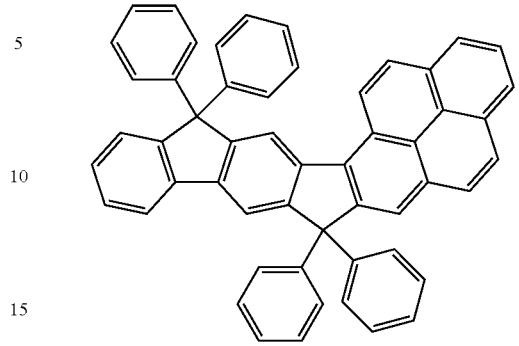
Formula 501-12
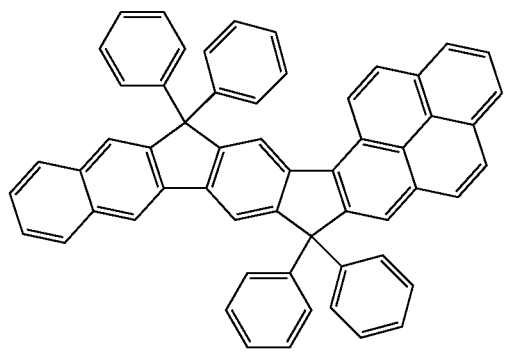
Formula 501-13
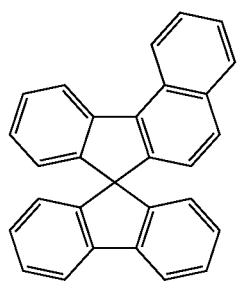
Formula 501-14
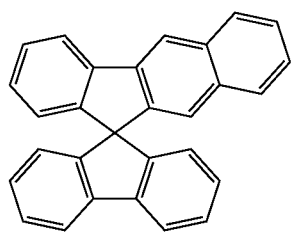
Formula 501-15
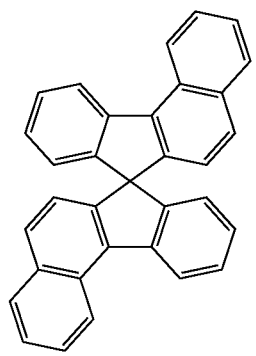

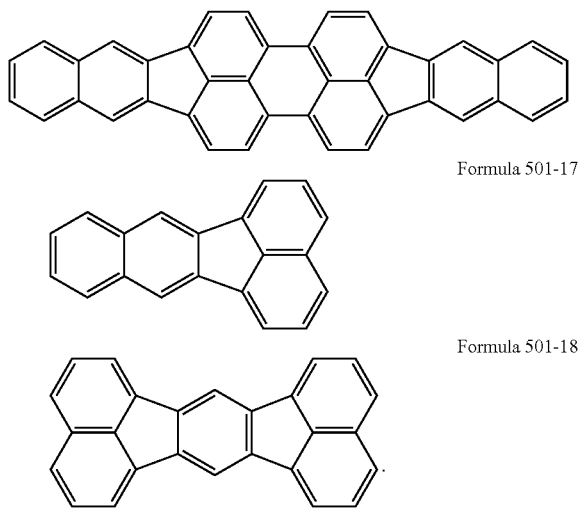

Formula 501-16

Formula 501-17

Formula 501-18

Alternatively, the fluorescent dopant may be a styryl-amine compound or a styryl-carbazole compound, but is not limited thereto.

In some embodiments, the fluorescent dopant may be selected from compounds represented by Formula 501:

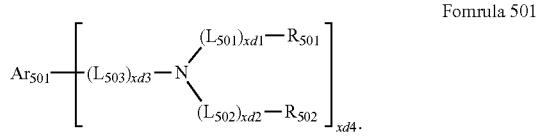

Formula 501

In Formula 501,

Ar$_{501}$ may be selected from a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, and a group represented by one of Formulae 501-1 to 501-18; and a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, and a group represented by one of Formulae 501-1 to 501-18, each substituted with at least one substituent independently selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$) (wherein $Q_{501}$ to $Q_{503}$ may each independently be selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group), $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $R_{501}$ and $R_{502}$ may each independently be selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one substituent independently selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, xd1 to xd3 may each independently be selected from 0, 1, 2, and 3, and xd4 may be selected from 0, 1, 2, 3, 4, 5, and 6.

For example, in Formula 501,

Ar$_{501}$ may be selected from a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, and groups represented by Formulae 501-1 to 501-18; and a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, and groups represented by Formulae 501-1 to 501-18, each substituted with at least one substituent independently selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a dibenzofuranyl group, a dibenzothiophenyl group, a carbazolyl group, a pyridinyl group, a pyrimidinyl group, a triazinyl group, a quinolinyl group, an isoquinolinyl group, and —Si($Q_{501}$)($Q_{502}$)($Q_{503}$) (wherein $Q_{501}$ to $Q_{503}$ may each independently be selected from hydrogen, a $C_1$-$C_{20}$ alkyl group, a $C_1$-$C_{20}$ alkoxy group, a phenyl group, a biphenyl group, a terphenyl group, and a naphthyl group), $L_{501}$ to $L_{503}$ may have the same definition as the description of $L_{11}$ provided herein, xd1 to xd3 may each independently be selected from 0, 1, and 2, and xd4 may be selected from 0, 1, 2, and 3, but embodiments are not limited thereto.

The fluorescent dopant may include, for example, at least one of Compounds FD(1) to FD(14), Compounds FD1 to FD13, or any combination thereof:

Compound FD(1)

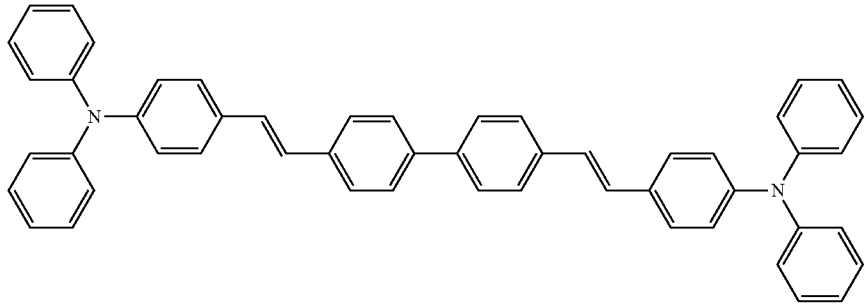

Compound FD(2)

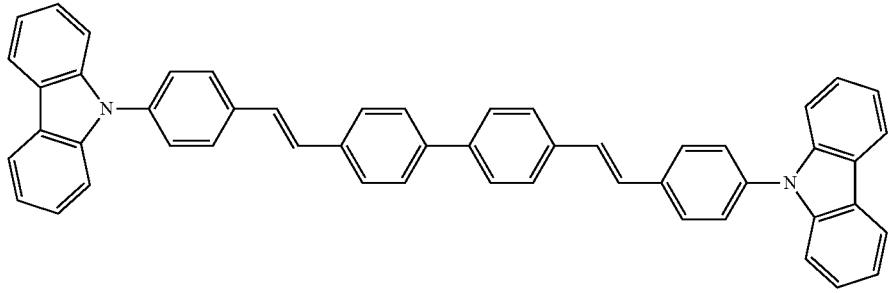

Compound FD(3)     Compound FD(4)

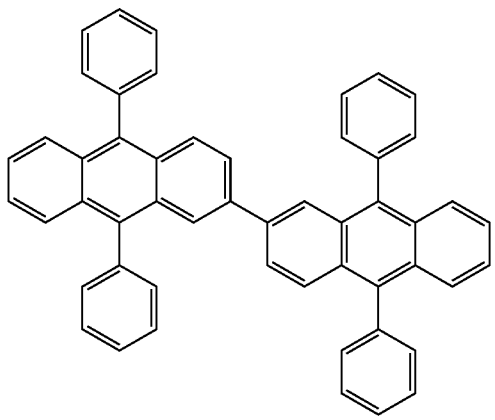

Compound FD(5)
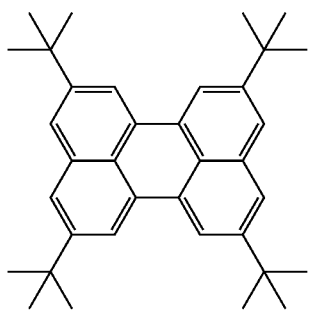
Compound FD(6)
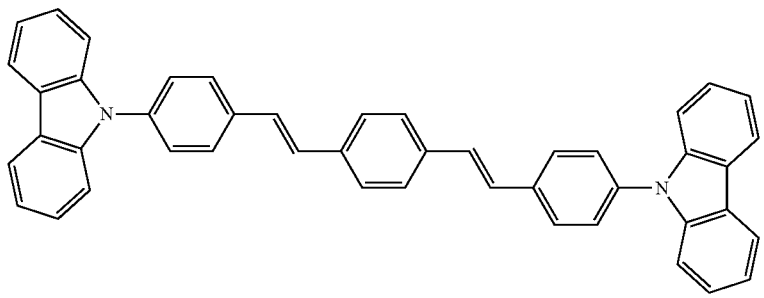
Compound FD(7)
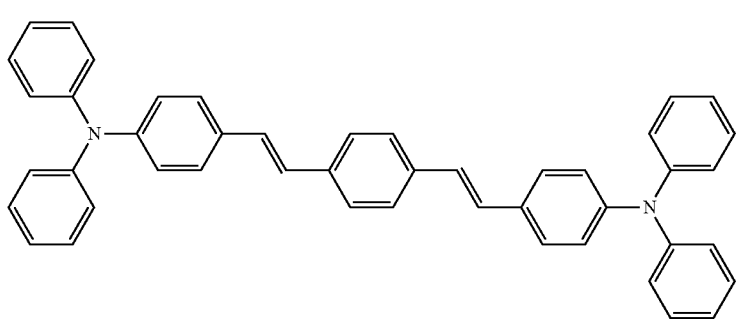
Compound FD(8)
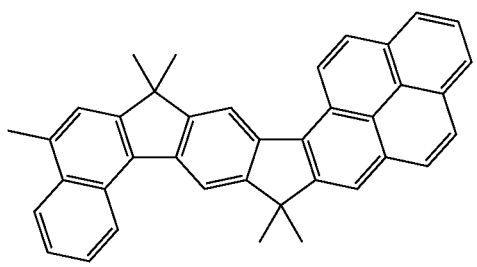
Compound FD(9)
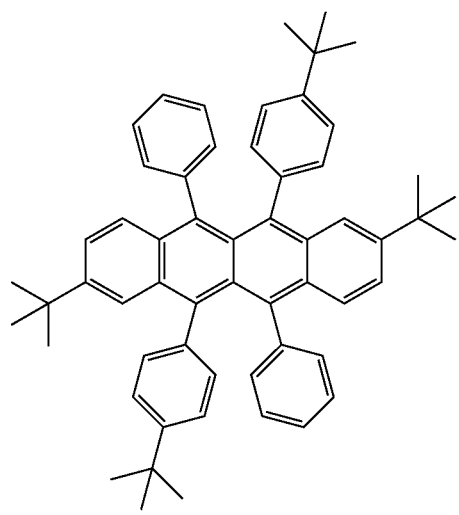

-continued
Compound FD(10)
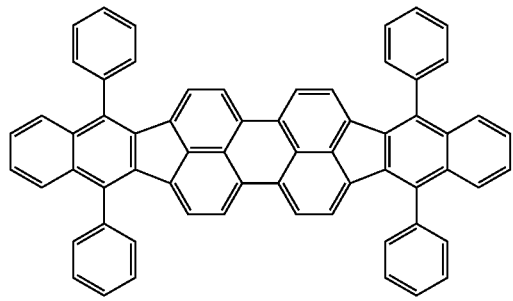
Compound FD(11)
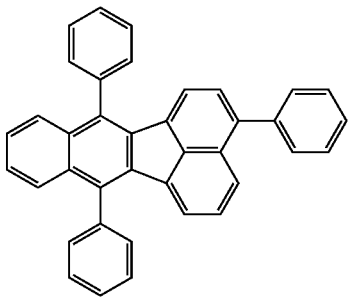
Compound (12)
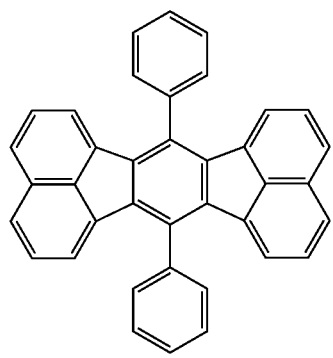
Compound (13)
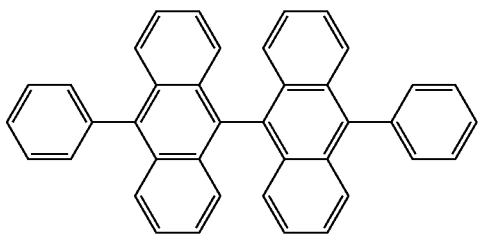
Compound (14)
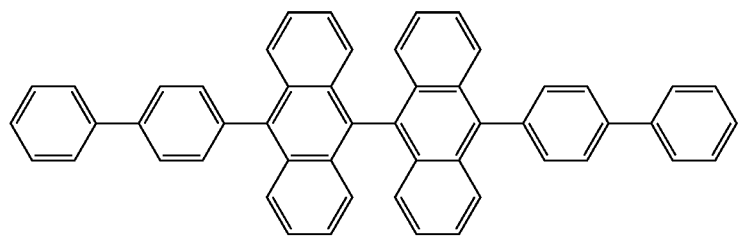
FD1
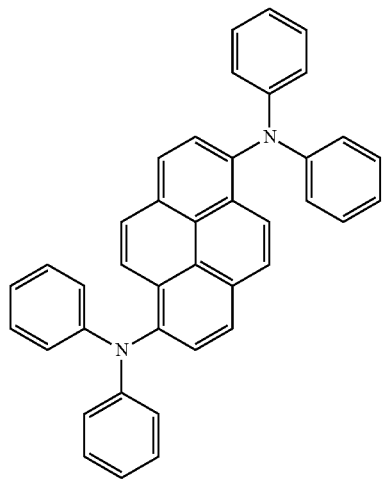
FD2
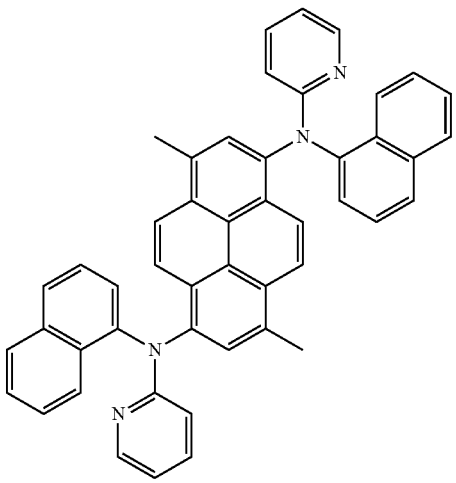

-continued
FD3
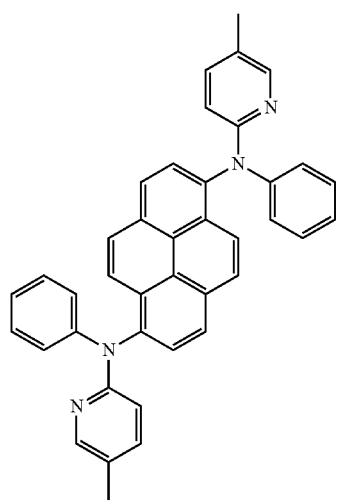
FD4
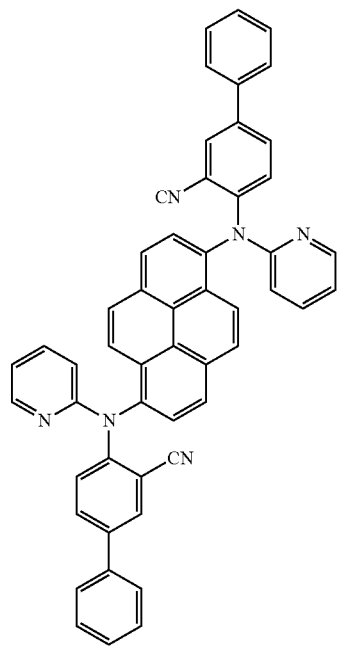
FD5
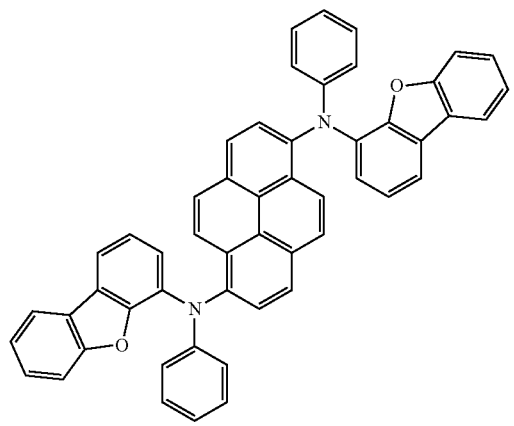
FD6
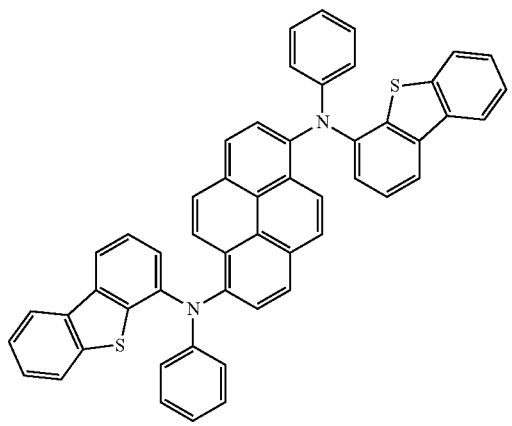
FD7
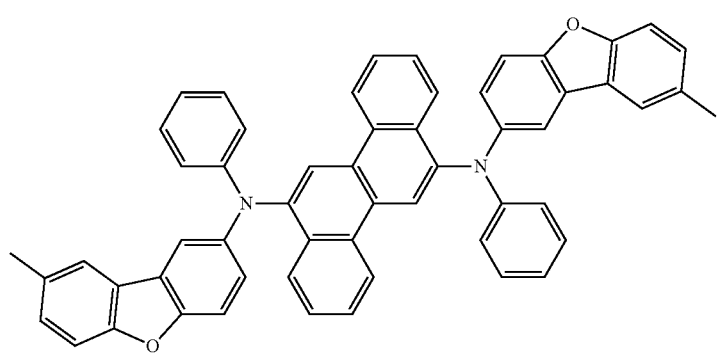

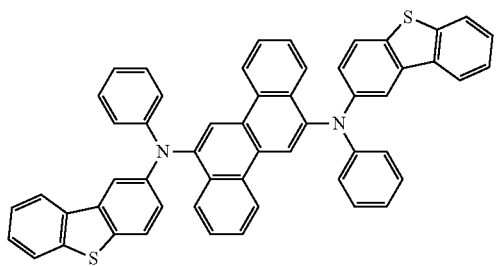

FD8

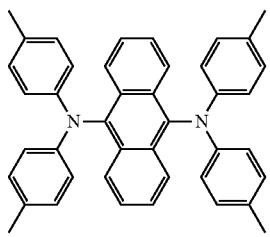

FD9

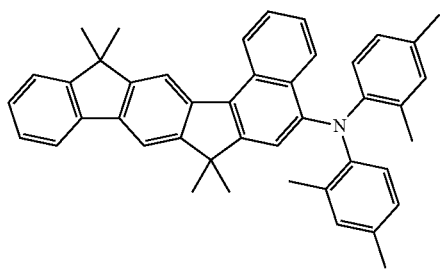

FD10

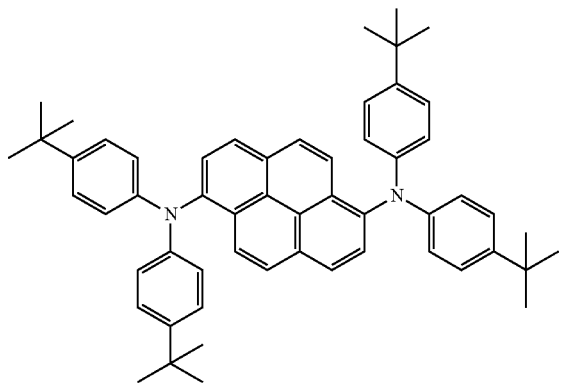

FD11

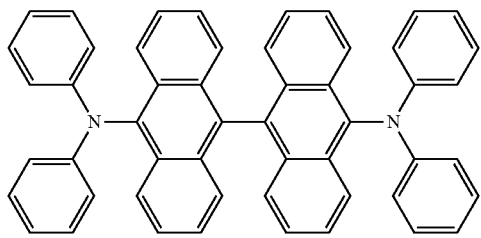

FD12

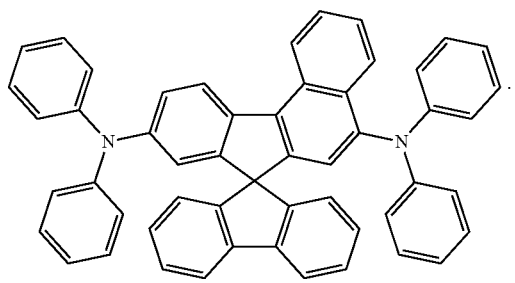

FD13

In some embodiments, the dopant in the emission layer may be a phosphorescent dopant.

The phosphorescent dopant may be selected from dopants that emit light based on a phosphorescent emission mechanism.

The phosphorescent dopant may be selected from a red phosphorescent dopant, a green phosphorescent dopant, and a blue phosphorescent dopant.

In some embodiments, the phosphorescent dopant may be a green phosphorescent dopant or a blue phosphorescent dopant, but is not limited thereto.

For example, the phosphorescent dopant may include an organometallic compound represented by Formula 81:

$$M(L_{81})_{n81}(L_{82})_{n82}$$

Formula 81

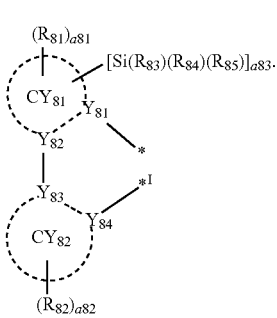

Formula 81A

In Formulae 81 and 81A,

M may be selected from iridium (Ir), platinum (Pt), osmium (Os), titanium (Ti), zirconium (Zr), hafnium (Hf), europium (Eu), terbium (Tb), thulium (Tm), and rhodium (Rh), $L_{81}$ is a ligand represented by Formula 81A, n81 is an integer of 1 to 3, and when n81 is 2 or more, two or more $L_{81}$(s) may be identical to or different from each other, $L_{82}$ is an organic ligand, n82 is an integer of 0 to 4, and when n82 is 2 or more, two or more $L_{82}$(s) may be identical to or different from each other, $Y_{81}$ to $Y_{84}$ may each independently be carbon (C) or nitrogen (N), $Y_{81}$ and $Y_{82}$ may bind to each other via a single bond or a double bond, and $Y_{83}$ and $Y_{84}$ may be linked to each other via a single bond or a double bond, $CY_{81}$ and $CY_{82}$ may each independently be selected from a $C_5$-$C_{30}$ carbocyclic group and a $C_1$-$C_{30}$ heterocarbocyclic group, $CY_{81}$ and $CY_{82}$ may optionally additionally bind to each other via an organic linking group, $R_{81}$ to $R_{85}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q$_{81}$)(Q$_{82}$)(Q$_{83}$), —N(Q$_{84}$)(Q$_{85}$), —B(Q$_{86}$)(Q$_{87}$), and —P(=O)(Q$_{88}$)(Q$_{89}$), a81 to a83 may each independently be an integer of 0 to 5, when a81 is 2 or more, two or more $R_{81}$(s) may be identical to or different from each other, when a82 is 2 or more, two or more $R_{82}$(s) may be identical to or different from each other, when a81 is 2 or more, neighboring $R_{81}$(s) may optionally bind to each other and form a saturated or unsaturated ring, when a82 is 2 or more, neighboring $R_{82}$(s) may optionally bind to each other and form a saturated or unsaturated ring, and *' in Formula 81A each indicate a binding site to M in Formula 81, and at least one of substituents of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocydoalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si(Q$_{91}$)(Q$_{92}$)(Q$_{93}$), wherein $Q_{81}$ to $Q_{89}$ and $Q_{91}$ to $Q_{93}$ may each independently be selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, in Formula 81A, a83 may be 1 or 2, and $R_{83}$ to $R_{85}$ may each independently be selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In some embodiments, in Formula 81A, $Y_{81}$ may be nitrogen, $Y_{82}$ and $Y_{83}$ may be carbon, $Y_{84}$ may be nitrogen or carbon, and $CY_{81}$ and $CY_{82}$ may each independently be selected from a cyclopentadiene, a benzene, a heptalene, an indene, a naphthalene, an azulene, a heptalene, an indacene, an acenaphthylene, a fluorene, a spiro-bifluorene, a benzofluorene, a dibenzofluorene, a phenalene, a phenanthrene, an anthracene, a fluoranthene, a triphenylene, a pyrene, a chrysene, a naphthacene, a picene, a perylene, a pentacene, a hexacene, a pentaphene, a rubicene, a coronene, an ovalene, a pyrrole, an isoindole, an indole, an indazole, a pyrazole, an imidazole, a triazole, an oxazole, an isoxazole, an oxadiazole, a thiazole, an isothiazole, a thiadiazol, a purine, a furan, a thiophene, a pyridine, a pyrimidine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzoimidazole, a benzofuran, a benzothiophene, an isobenzothiazole, a benzoxazole, an isobenzoxazole, a benzocarbazole, a dibenzocarbazole, an imidazopyridine, an imidazopyrimidine, a dibenzofuran, a dibenzothiophene, a dibenzothiophene sulfone, a carbazole, a dibenzosilole, and a 2,3-dihydro-1H-imidazole.

In some embodiments, in Formula 81A, $Y_{81}$ may be nitrogen, $Y_{82}$ to $Y_{84}$ may be carbon, $CY_{81}$ may be selected from five-membered heterocycles each including two nitrogen atoms as ring-forming atoms, and $CY_{82}$ may be selected from a benzene, a naphthalene, a fluorene, a dibenzofuran, and a dibenzothiophene, but embodiments are not limited thereto.

In some embodiments, in Formula 81A, $Y_{81}$ may be nitrogen, $Y_{82}$ to $Y_{84}$ may be carbon, $CY_{81}$ may be an imidazole or a 2,3-dihydro-1H-imidazole, and $CY_{82}$ may be selected from a benzene, a naphthalene, a fluorene, a dibenzofuran, and a dibenzothiophene, but embodiments are not limited thereto.

In some embodiments, in Formula 81A, $Y_{81}$ may be nitrogen, $Y_{82}$ to $Y_{84}$ may be carbon, $CY_{81}$ may be selected from a pyrrole, a pyrazole, an imidazole, a triazole, an oxazole, an isoxazole, an oxadiazole, a thiazole, an isothiazole, a thiadiazol, a pyridine, a pyrimidine, a quinoline, an isoquinoline, a benzoquinoline, a phthalazine, a naphthyridine, a quinoxaline, a quinazoline, a cinnoline, a benzoimidazole, an isobenzothiazole, a benzoxazole, and an isobenzoxazole, and $CY_{82}$ may be selected from a cyclopentadiene, a benzene, a naphthalene, a fluorene, a benzofluorene, a dibenzofluorene, a phenanthrene, an anthracene, a triphenylene, a pyrene, a chrysene, a perylene, a benzofuran, a benzothiophene, a benzocarbazole, a dibenzocarbazole, a dibenzofuran, a dibenzothiophene, a dibenzothiophene sulfone, a carbazole, and a dibenzosilole.

In some embodiments, $R_{81}$ and $R_{82}$ in Formula 81A may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B($Q_{86}$)($Q_{87}$) and —P(=O)($Q_{88}$)($Q_{89}$), wherein $Q_{86}$ to $Q_{89}$ may each independently be selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In some embodiments, $R_{81}$ and $R_{82}$ in Formula 81A may each independently be selected from hydrogen, deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group; and —$B(Q_{86})(Q_{87})$ and —$P(=O)(Q_{88})(Q_{89})$, wherein $Q_{86}$ to $Q_{89}$ may each independently be selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In some embodiments, $R_{81}$ and $R_{82}$ in Formula 81A may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a group represented by one of Formulae 9-1 to 9-19, and a group represented by one of Formulae 10-1 to 10-30, but embodiments are not limited thereto:

-continued
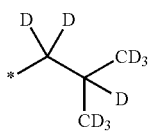
Formula 9-17
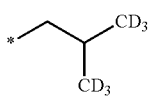
Formula 9-18
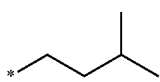
Formula 9-19
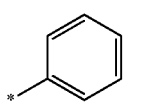
Formula 10-1
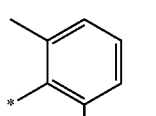
Formula 10-2
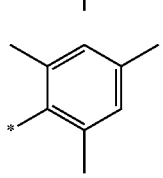
Formula 10-3
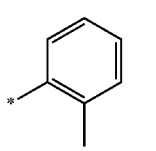
Formula 10-4
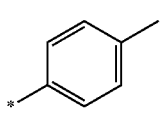
Formula 10-5
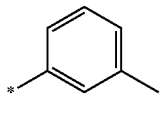
Formula 10-6
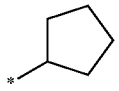
Formula 10-7
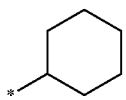
Formula 10-8
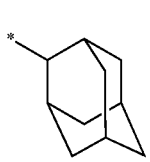
Formula 10-9
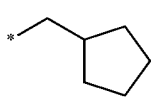
Formula 10-10
-continued
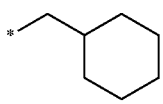
Formula 10-11
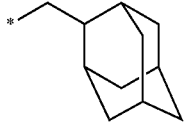
Formula 10-12
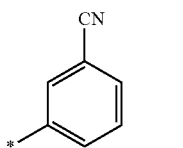
Formula 10-13
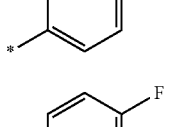
Formula 10-14
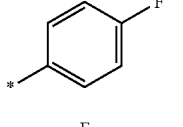
Formula 10-15
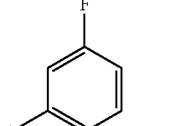
Formula 10-16
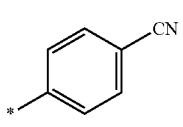
Formula 10-17
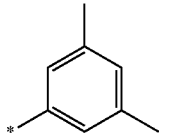
Formula 10-18
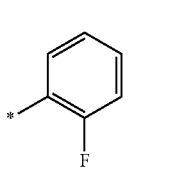
Formula 10-19
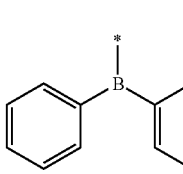
Formula 10-20
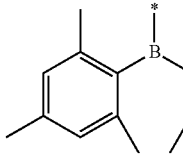
Formula 10-21

-continued

Formula 10-22
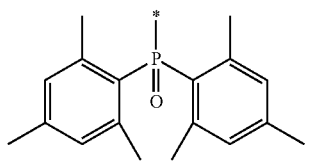

Formula 10-23
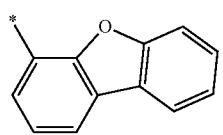

Formula 10-24
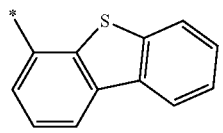

Formula 10-25
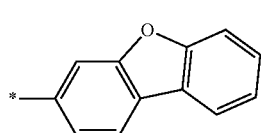

Formula 10-26
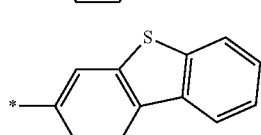

Formula 10-27
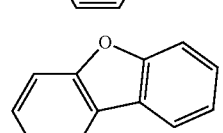

Formula 10-28
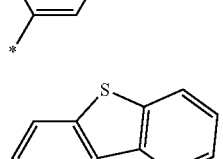

Formula 10-29
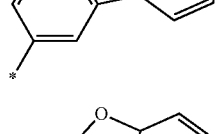

Formula 10-30
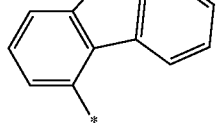
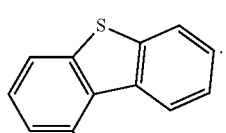

The "*" in Formulae 9-1 to 9-17 and 10-1 to 10-30 indicates a binding site to a neighboring atom.

In some embodiments, at least one selected from $R_{81}$ in the number of a81 and $R_{82}$ in the number of a82 in Formula 81A may be a cyano group.

In some embodiments, at least one of $R_{82}$ in the number of a82 in Formula 81A may be a cyano group.

In some embodiments, at least one selected from $R_{81}$ in the number of a81 and $R_{82}$ in the number of a82 in Formula 81A may be deuterium. In some embodiments, $L_{82}$ in Formula 81 may be selected from ligands represented by Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114):

Formula 3-1(1)
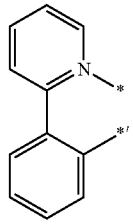

Formula 3-1(2)
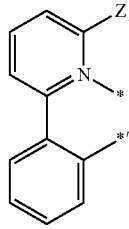

Formula 3-1(3)
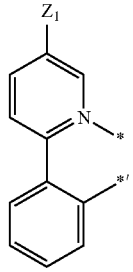

Formula 3-1(4)
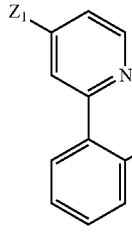

Formula 3-1(5)
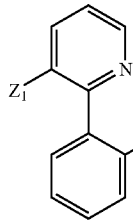

Formula 3-1(6)
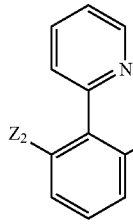

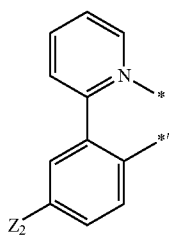
Formula 3-1(7)
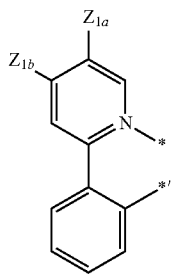
Formula 3-1(13)
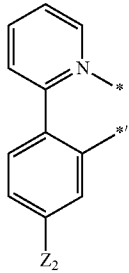
Formula 3-1(8)
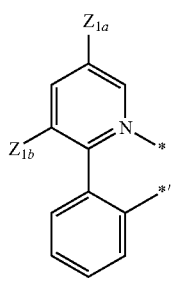
Formula 3-1(14)
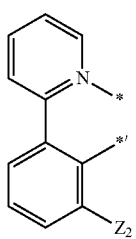
Formula 3-1(9)
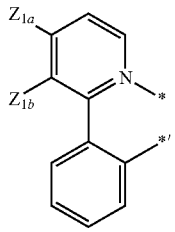
Formula 3-1(15)
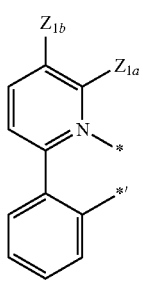
Formula 3-1(10)
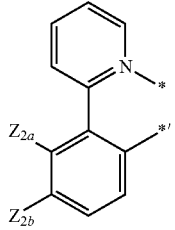
Formula 3-1(16)
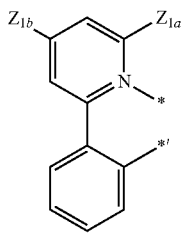
Formula 3-1(11)
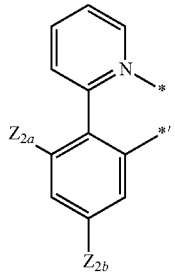
Formula 3-1(17)
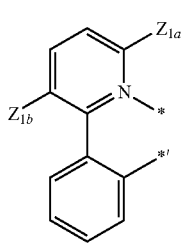
Formula 3-1(12)
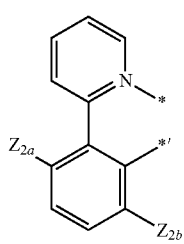
Formula 3-1(18)

Formula 3-1(19)
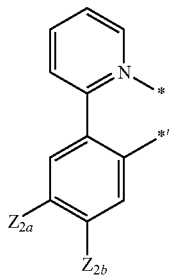
Formula 3-1(20)
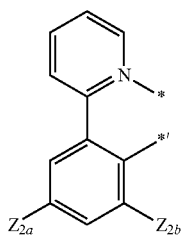
Formula 3-1(21)
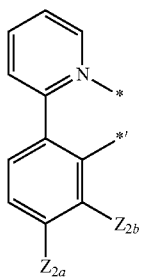
Formula 3-1(22)
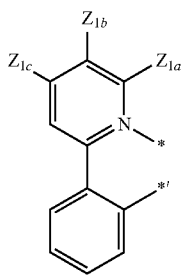
Formula 3-1(23)
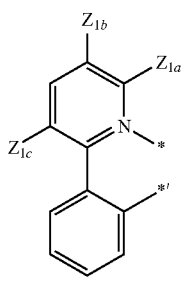
Formula 3-1(24)
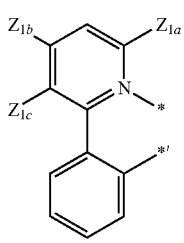
Formula 3-1(25)
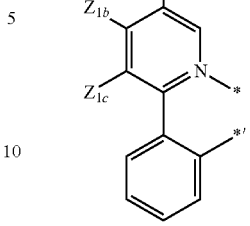
Formula 3-1(26)
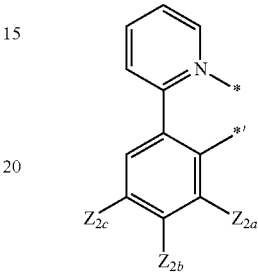
Formula 3-1(27)
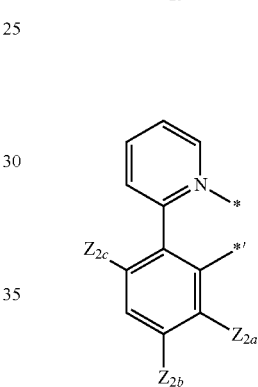
Formula 3-1(28)
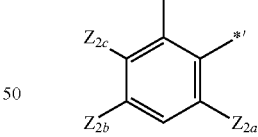
Formula 3-1(29)
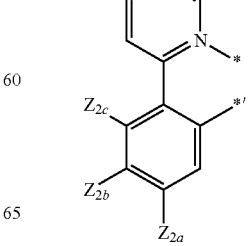

-continued
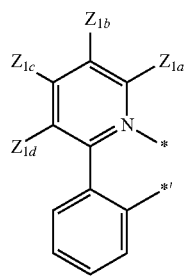
Formula 3-1(30)
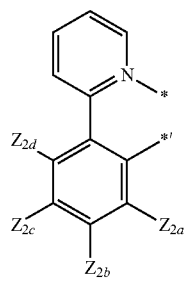
Formula 3-1(31)
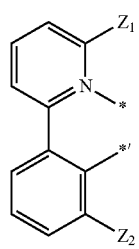
Formula 3-1(32)
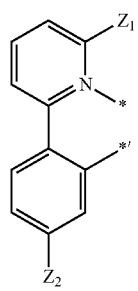
Formula 3-1(33)
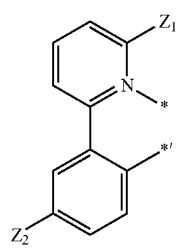
Formula 3-1(34)
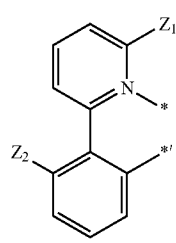
Formula 3-1(35)
-continued
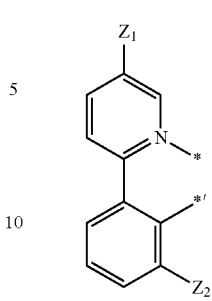
Formula 3-1(36)
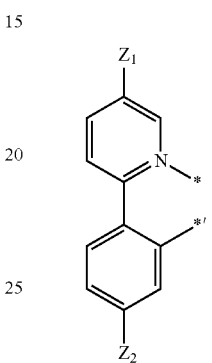
Formula 3-1(37)
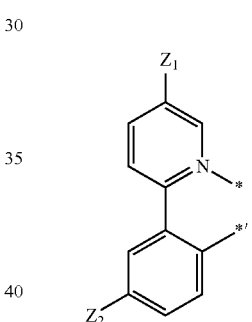
Formula 3-1(38)
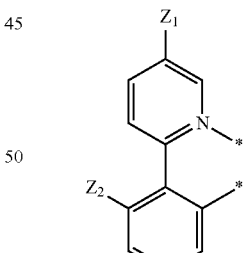
Formula 3-1(39)
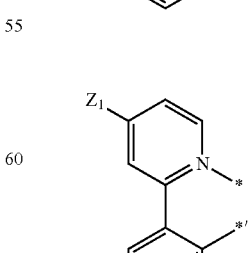
Formula 3-1(40)

| | |
|---|---|
| Formula 3-1(41) | Formula 3-1(46) |
| Formula 3-1(42) | Formula 3-1(47) |
| Formula 3-1(43) | Formula 3-1(48) |
| Formula 3-1(44) | Formula 3-1(49) |
| Formula 3-1(45) | Formula 3-1(50) |

-continued
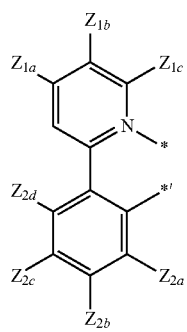
Formula 3-1(51)
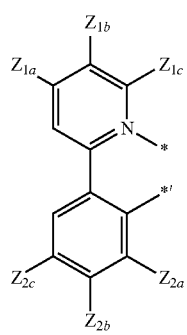
Formula 3-1(52)
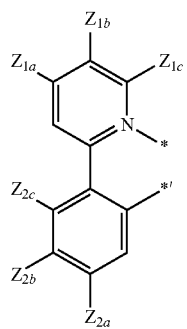
Formula 3-1(53)
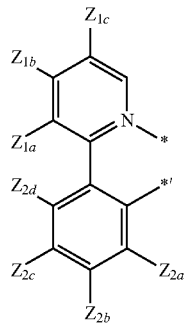
Formula 3-1(54)
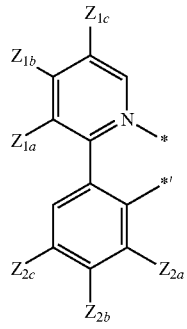
Formula 3-1(55)
-continued
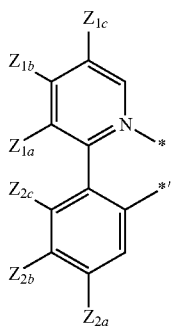
Formula 3-1(56)
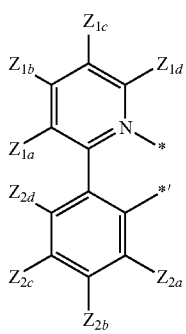
Formula 3-1(57)
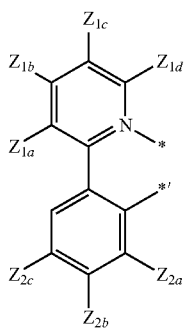
Formula 3-1(58)
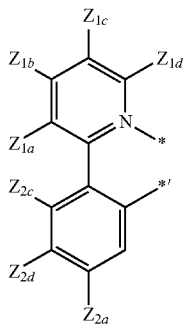
Formula 3-1(59)
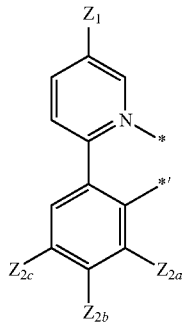
Formula 3-1(60)

-continued
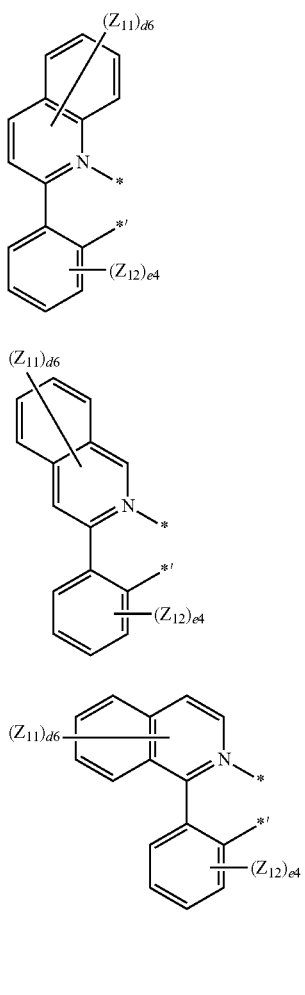
Formula 3-1(61)
Formula 3-1(62)
Formula 3-1(63)
Formula 3-1(64)
Formula 3-1(65)
-continued
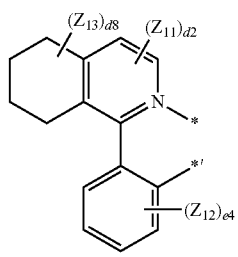
Formula 3-1(66)
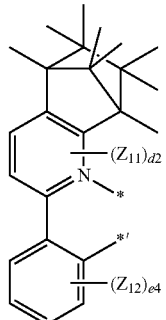
Formula 3-1(67)
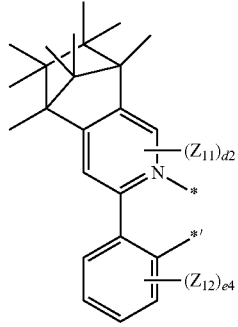
Formula 3-1(68)
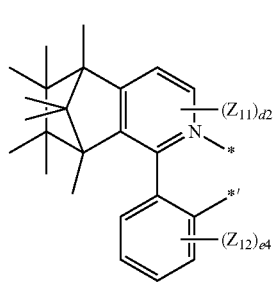
Formula 3-1(69)
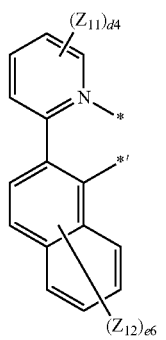
Formula 3-1(71)

Formula 3-1(72) 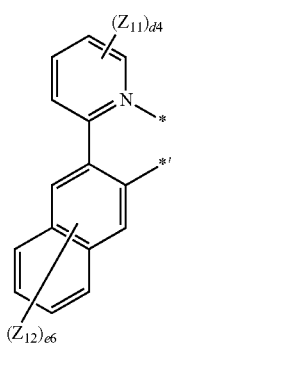
Formula 3-1(73) 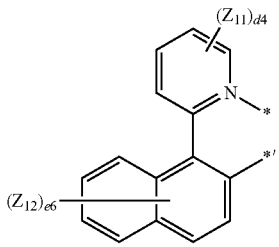
Formula 3-1(74) 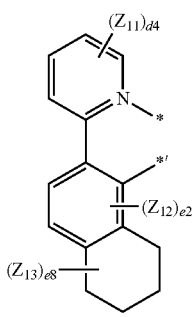
Formula 3-1(75) 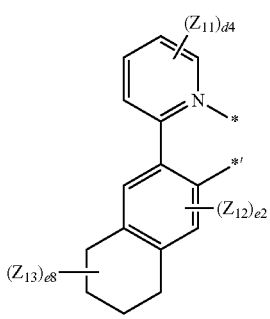
Formula 3-1(76) 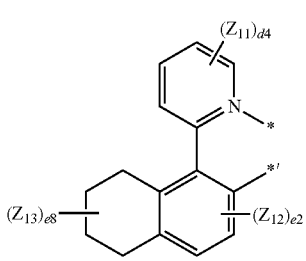
Formula 3-1(77) 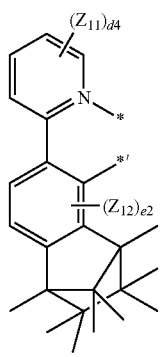
Formula 3-1(78) 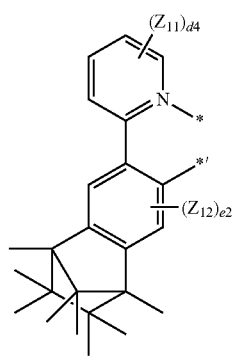
Formula 3-1(79) 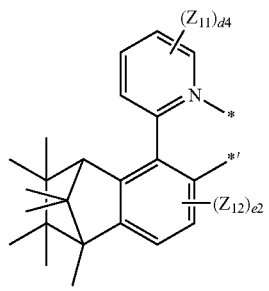
Formula 3-1(81) 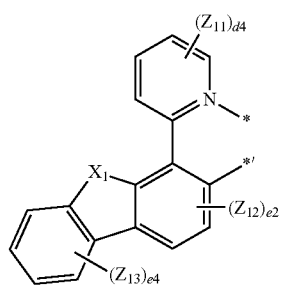
Formula 3-1(82) 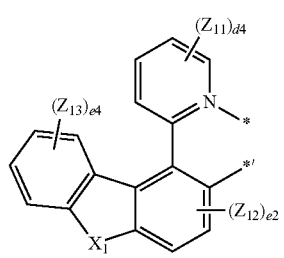

-continued
Formula 3-1(83)
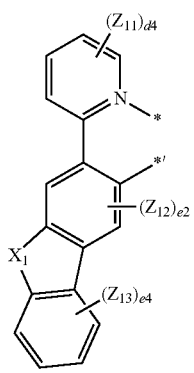
Formula 3-1(84)
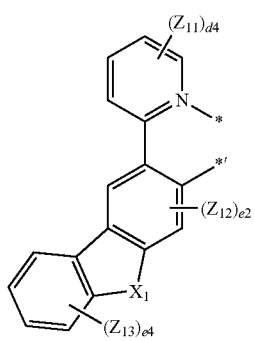
Formula 3-1(85)
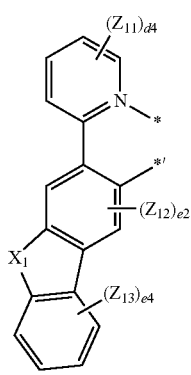
Formula 3-1(86)
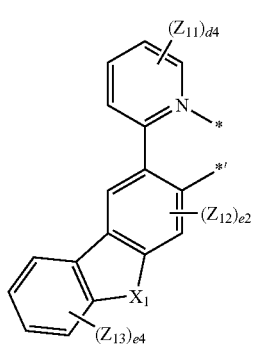
-continued
Formula 3-1(87)
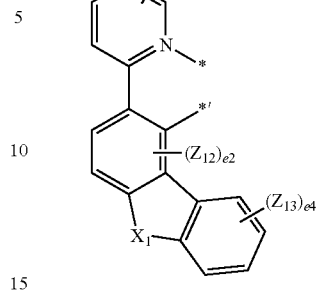
Formula 3-1(88)
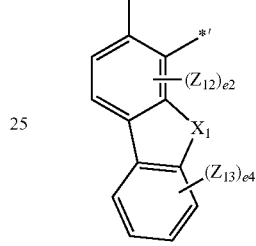
Formula 3-1(91)
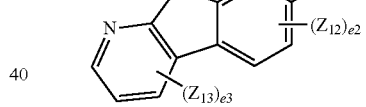
Formula 3-1(92)
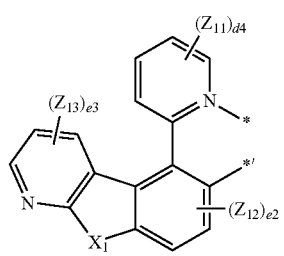
Formula 3-1(93)
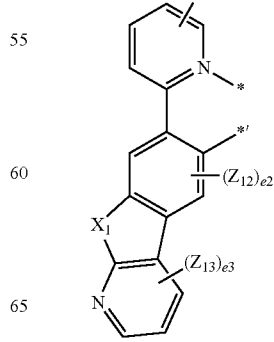

-continued
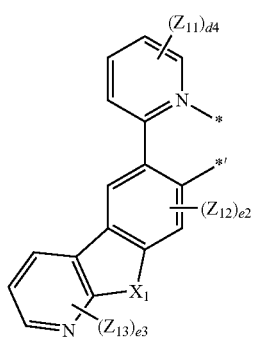
Formula 3-1(94)
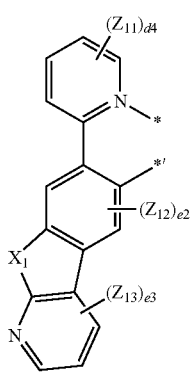
Formula 3-1(95)
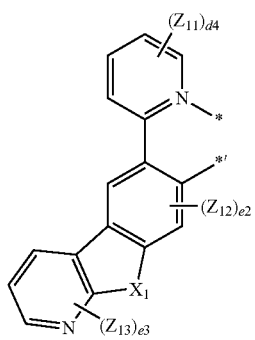
Formula 3-1(96)
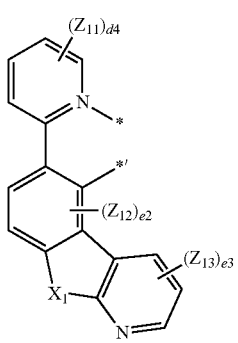
Formula 3-1(97)
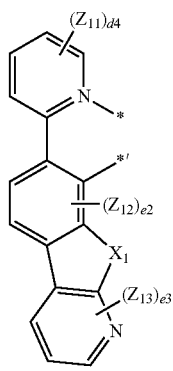
Formula 3-1(98)
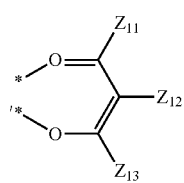
Formula 3-1(101)
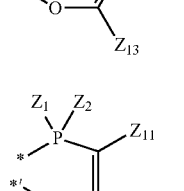
Formula 3-1(102)
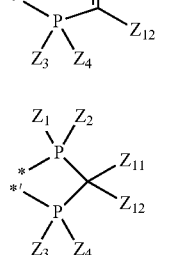
Formula 3-1(103)
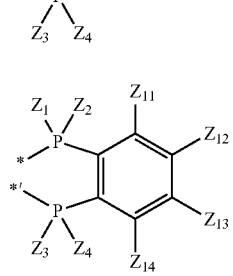
Formula 3-1(104)
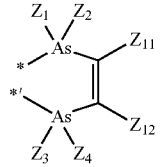
Formula 3-1(105)
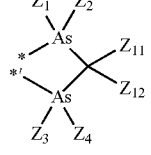
Formula 3-1(106)

-continued

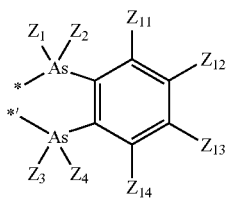
Formula 3-1(107)

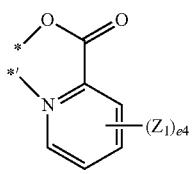
Formula 3-1(108)

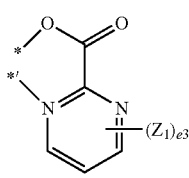
Formula 3-1(109)

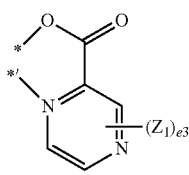
Formula 3-1(110)

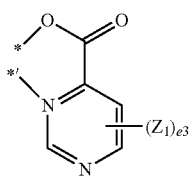
Formula 3-1(111)

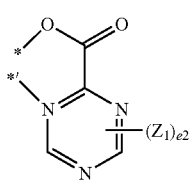
Formula 3-1(112)

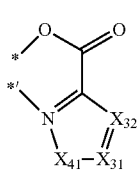
Formula 3-1(113)

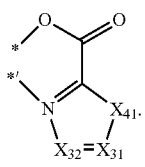
Formula 3-1(114)

In Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114), $X_1$ may be O, S, $C(Z_{21})(Z_{22})$, or $N(Z_{23})$, $X_{31}$ may be N or $C(Z_{1a})$, and $X_{32}$ may be N or $C(Z_{1b})$, $X_{41}$ may be O, S, $N(Z_{1a})$, or $C(Z_{1a})(Z_{1b})$, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, and $Z_{21}$ to $Z_{23}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B($Q_{86}$)($Q_{87}$) and —P(=O)($Q_{88}$)($Q_{89}$), wherein $Q_{86}$ to $Q_{89}$ may each independently be selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, d2 and e2 may each independently be 0 or 2, e3 may be an integer of 0 to 3, d4 and e4 may each independently be an integer of 0 to 4, d6 and e6 may each independently be an integer of 0 to 6, d8 and e8 may each independently be an integer of 0 to 8, and

* and *' each indicate a binding site to M in Formula 1.

For example, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, and $Z_{21}$ to $Z_{23}$ may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by one of Formulae 9-1 to 9-19, and a group represented by one of Formulae 10-1 to 10-30, but are not limited thereto.

In some embodiments, in Formula 81, M may be Ir, and the sum of n81 and n82 may be 3; or M may be Pt, and the sum of n81 and n82 may be 2.

In some embodiments, the organometallic compound represented by Formula 81 may be neutral, not a salt consisting of a pair of a cation and an anion.

In some embodiments, the phosphorescent dopant may include at least one of Compounds PD1 to PD78 and FIr$_6$, but is not limited thereto.

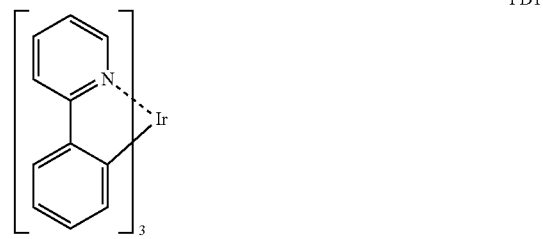

PD1

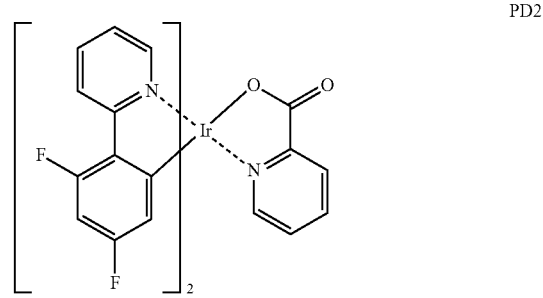

PD2

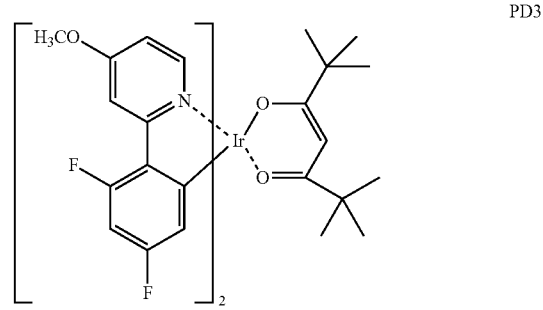

PD3

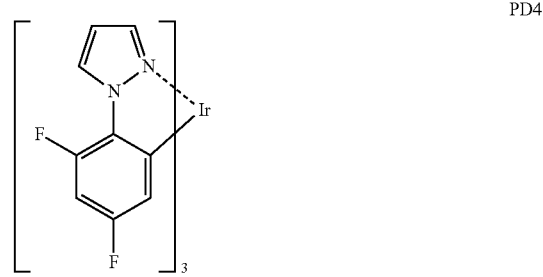

PD4

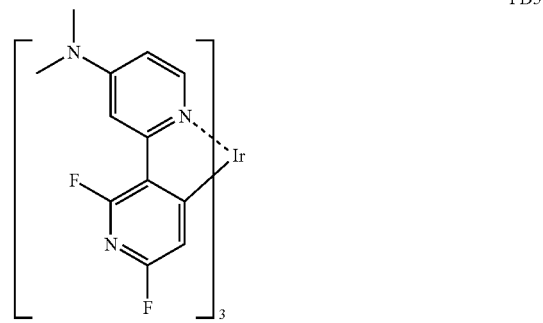

PD5

PD6
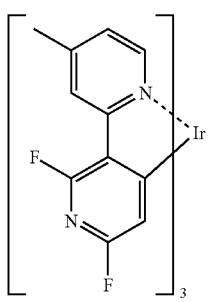
PD7
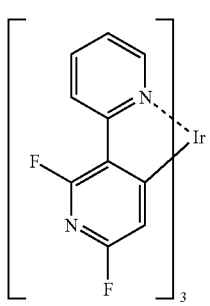
PD8
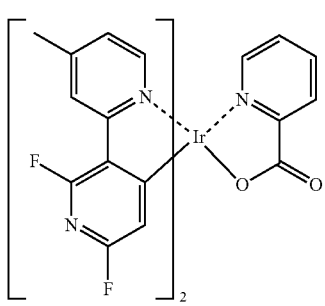
PD9
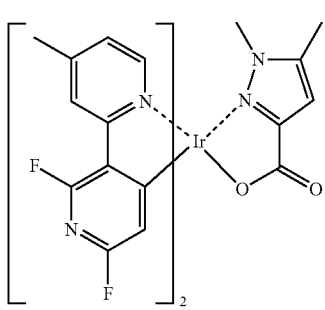
PD10
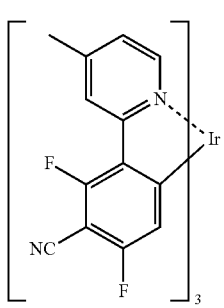
PD11
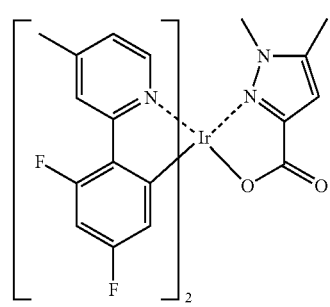
PD12
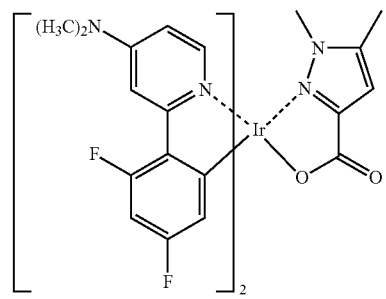
PD13
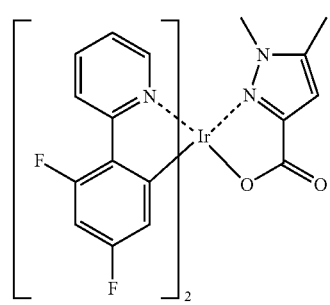
PD14
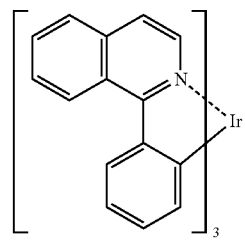
PD15
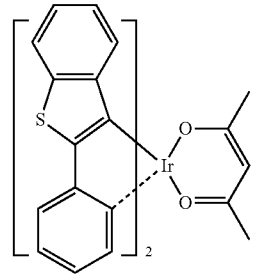

-continued
PD16
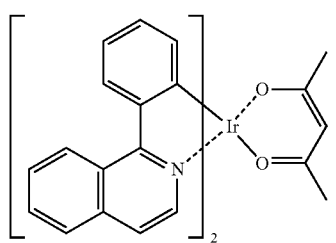
PD17
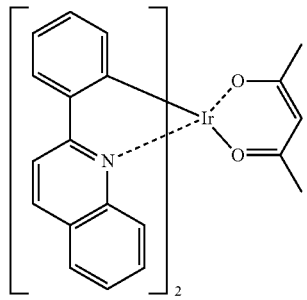
PD18
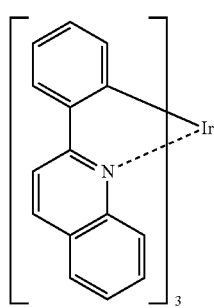
PD19
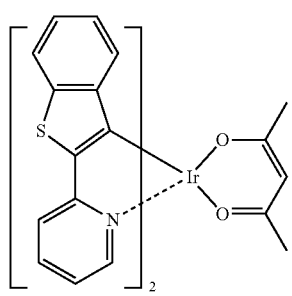
PD20
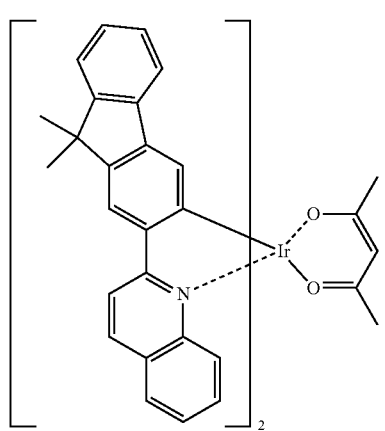
-continued
PD21
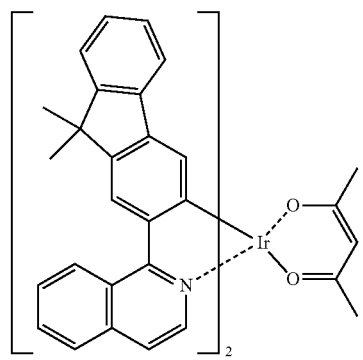
PD22
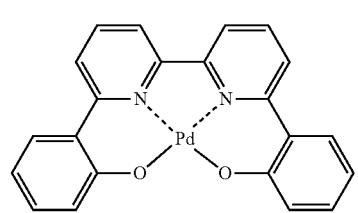
PD23
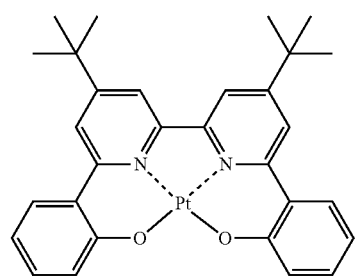
PD24
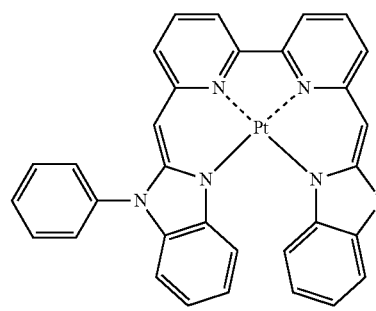
PD25
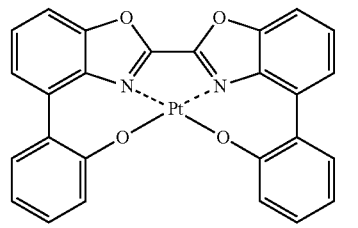
PD26

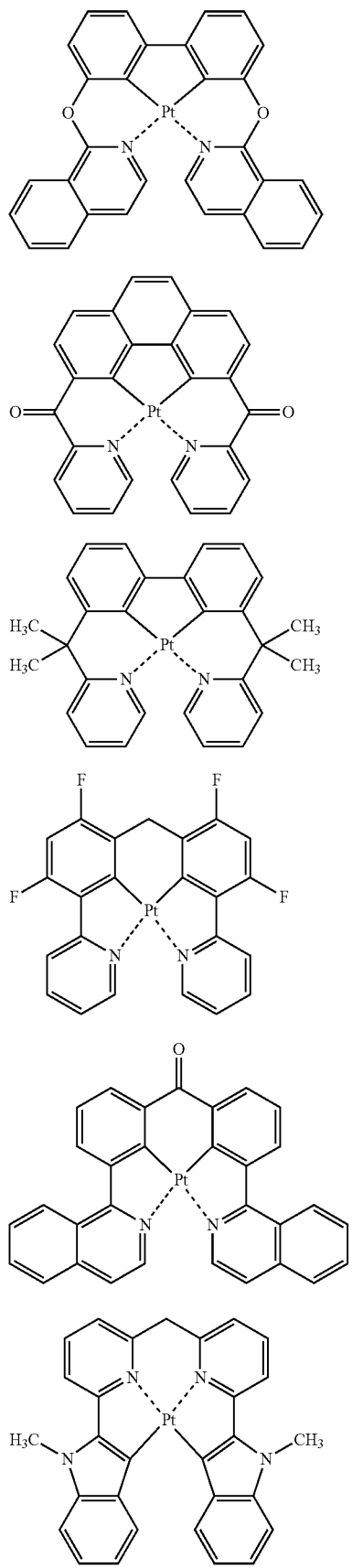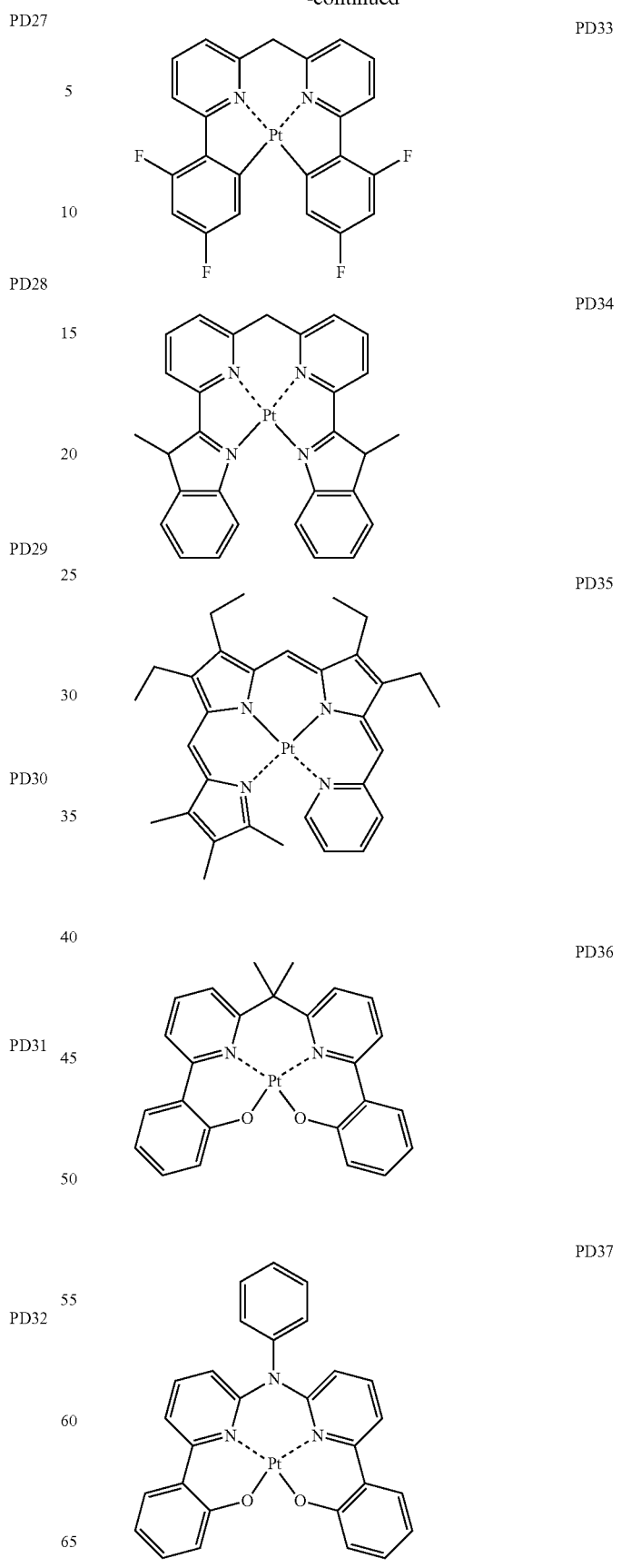

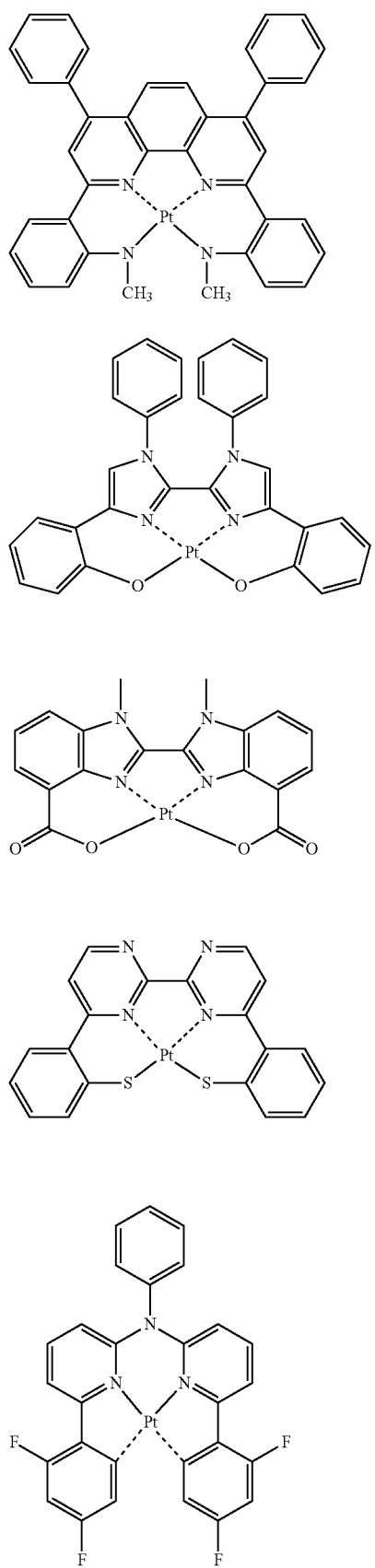
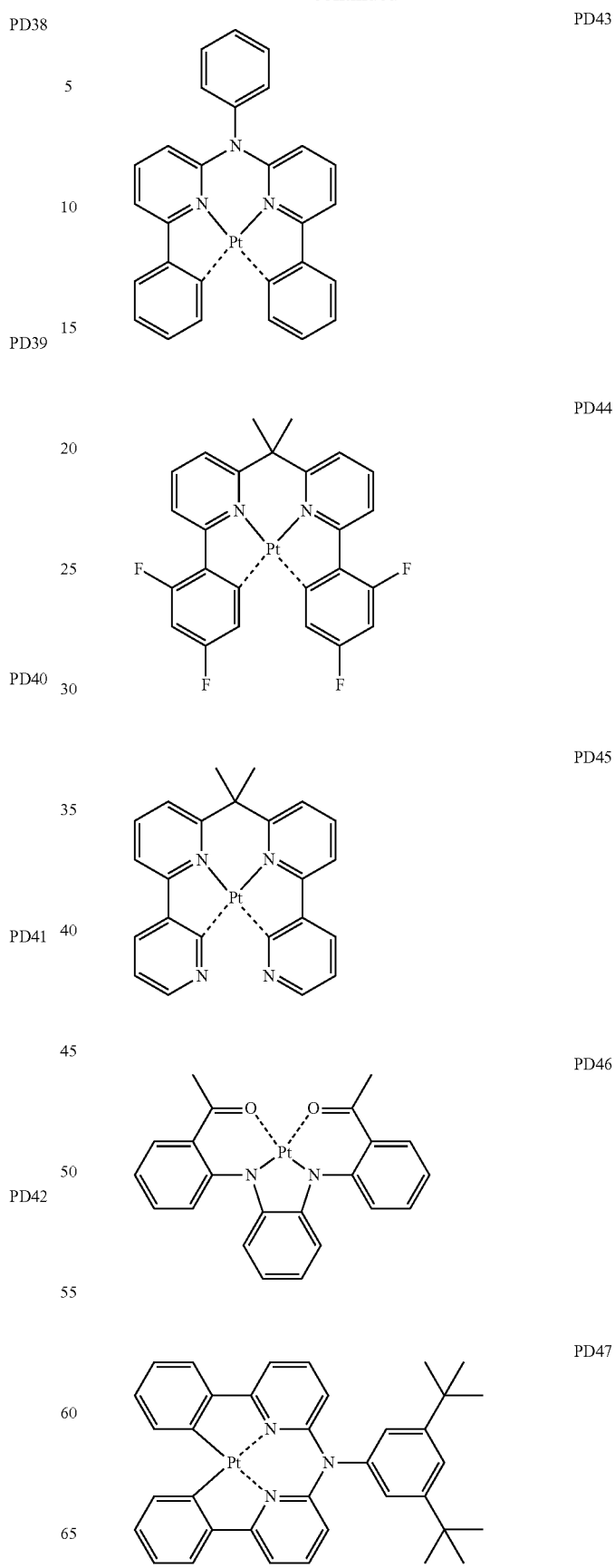

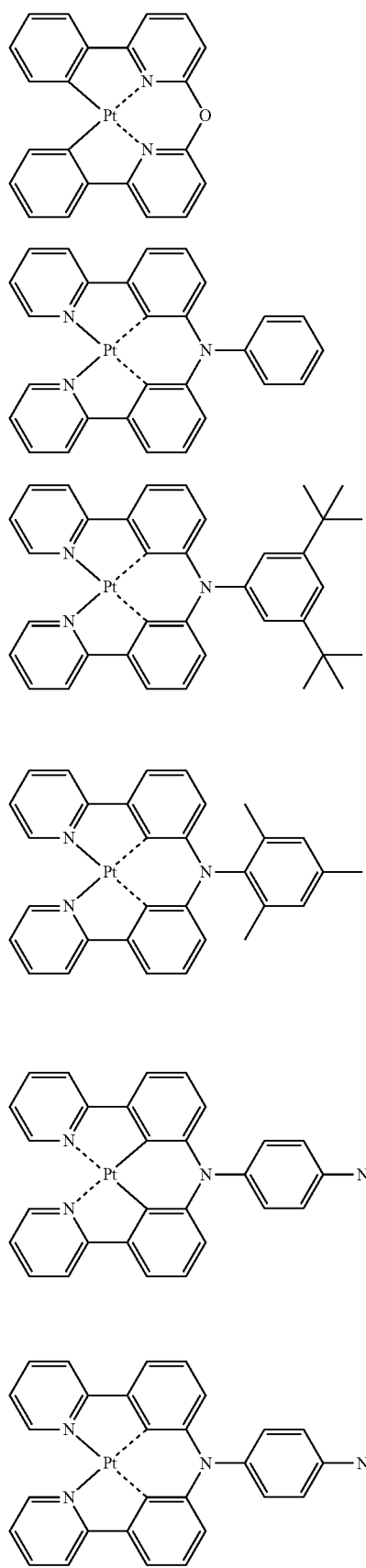
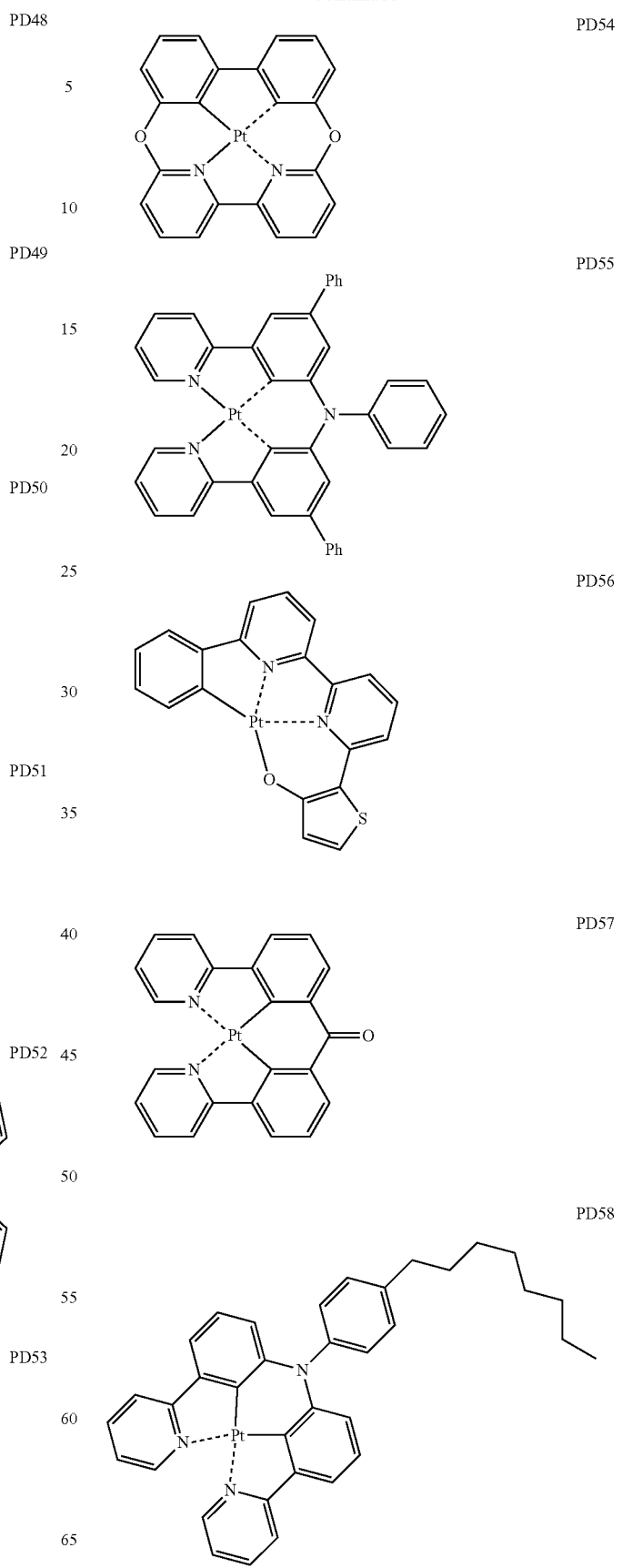

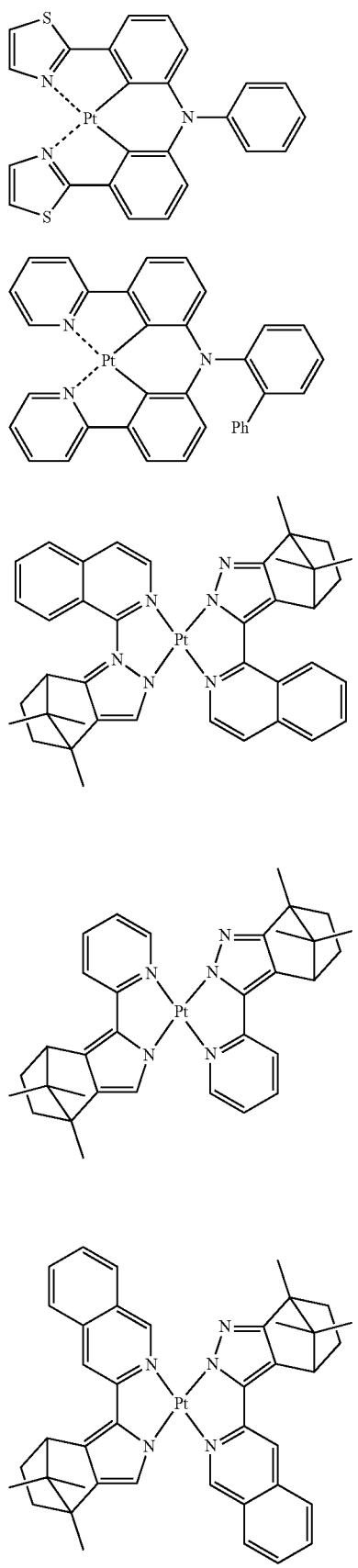
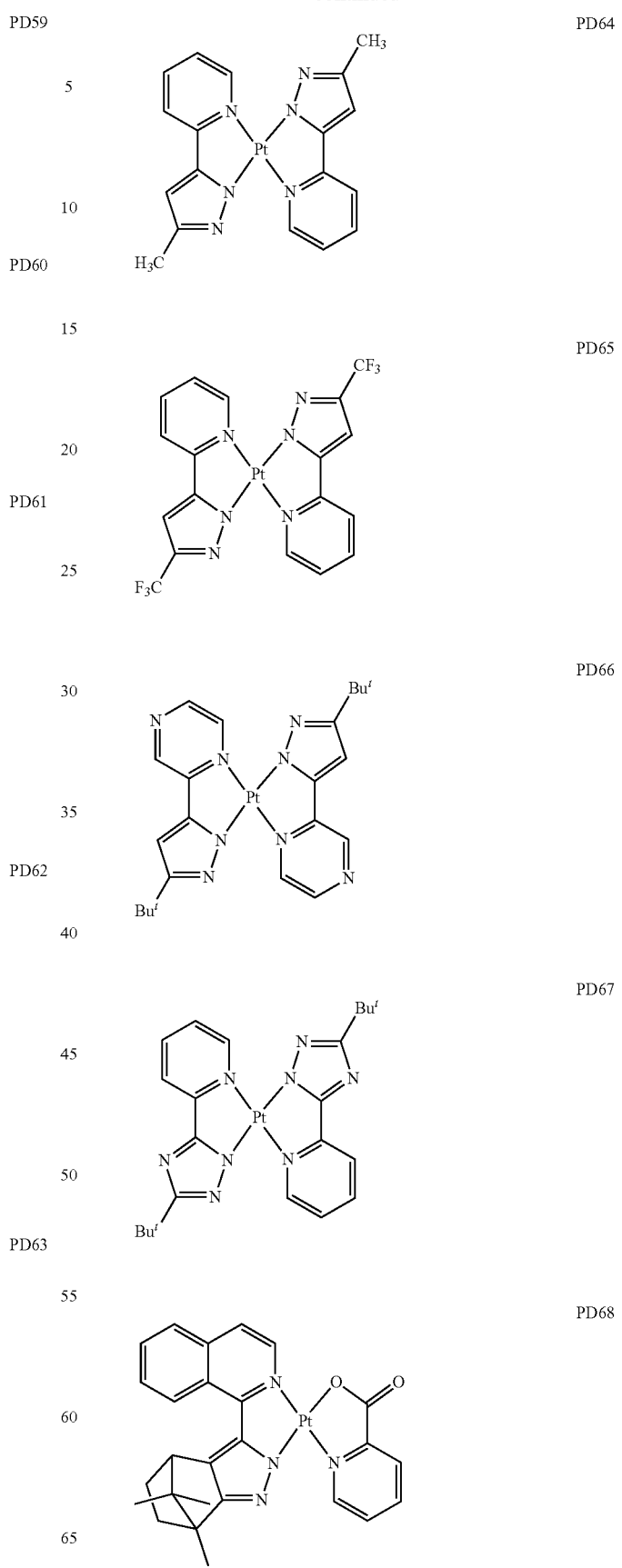

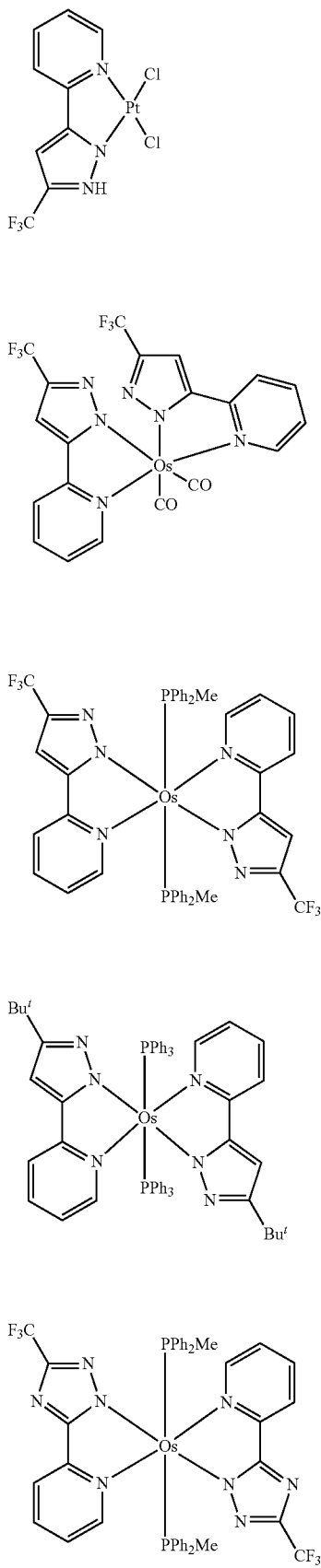

An amount of the dopant in the emission layer may be, in general, in a range of about 0.01 to about 20 parts by weight based on 100 parts by weight of the host, but is not limited thereto. When the amount of the dopant is within this range, extinction-free luminance may be embodied.

FIG. 1 is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or transparent plastic substrate, preferably each with excellent mechanical strength, thermal stability, transparency, surface smoothness, ease of handling, and water-resistance.

The first electrode 11 may be formed by depositing or sputtering a material for forming the first electrode 11 on the substrate. The first electrode 11 may be an anode. The material for the first electrode 11 may be selected from materials with a high work function to facilitate hole injection. The first electrode 11 may be a reflective electrode or a transmissive electrode. The material for the first electrode may be, for example, indium tin oxide (ITO), indium zinc oxide (IZO), tin oxide ($SnO_2$), and zinc oxide (ZnO). In some embodiments, magnesium (Mg), aluminum (Al), aluminum-lithium (Al—Li), calcium (Ca), magnesium-indium (Mg—In), or magnesium-silver (Mg—Ag) may be used as the material for the first electrode.

The first electrode 11 may have a single-layer structure or a multi-layer structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In some embodiments, the hole transport region may have a structure of hole injection layer/hole transport layer or hole injection layer/hole transport layer/electron blocking layer, which are sequentially stacked in this stated order from the first electrode 11.

A hole injection layer hole injection layer may be formed on the first electrode 11 by using one or more methods selected from vacuum deposition, spin coating, casting, or Langmuir-Blodgett (LB).

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2000 rpm to about 5000 rpm, and a temperature at which a heat treatment is performed to remove a solvent after coating may be from about 80° C. to about 200° C. However, the coating conditions are not limited thereto.

Conditions for a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (PANI/CSA), (polyaniline)/poly(4-styrenesulfonate) (Pani/PSS), a compound represented by Formula 201 below, and a compound represented by Formula 202 below:

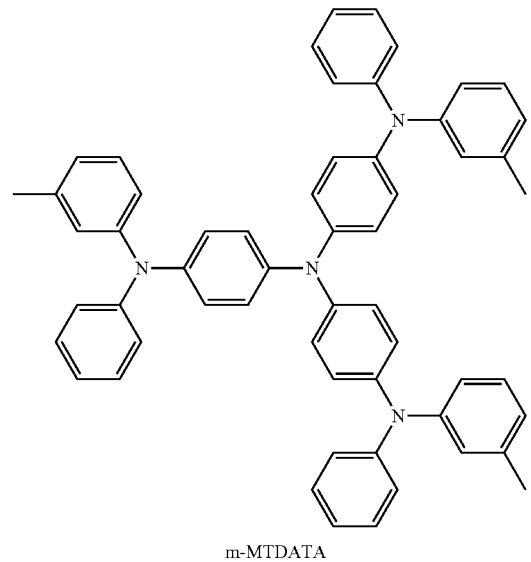

m-MTDATA

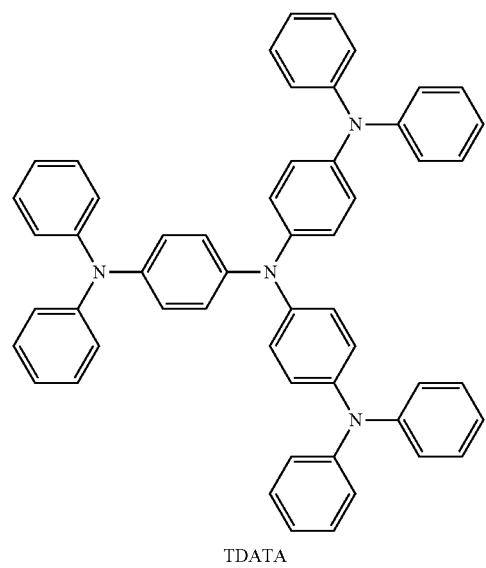
TDATA
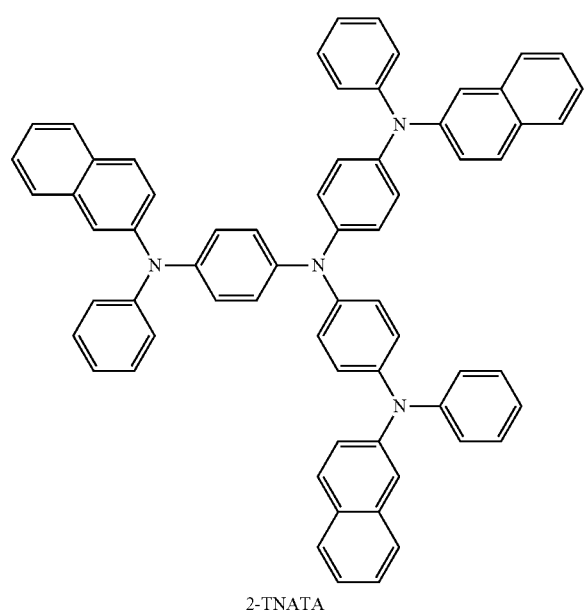
2-TNATA
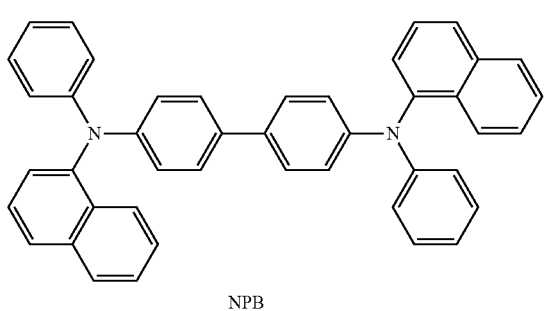
NPB
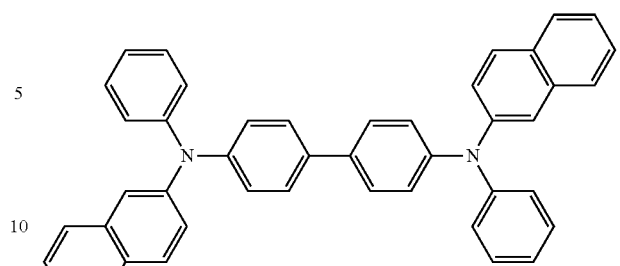
β-NPB
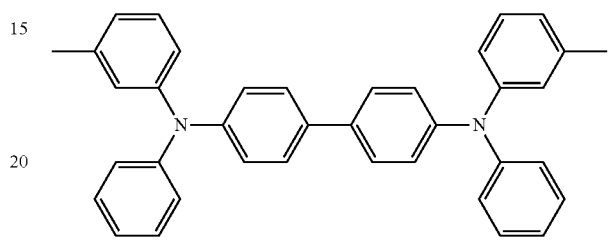
TPD
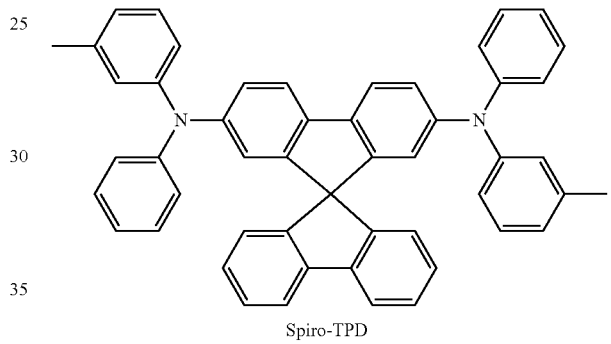
Spiro-TPD
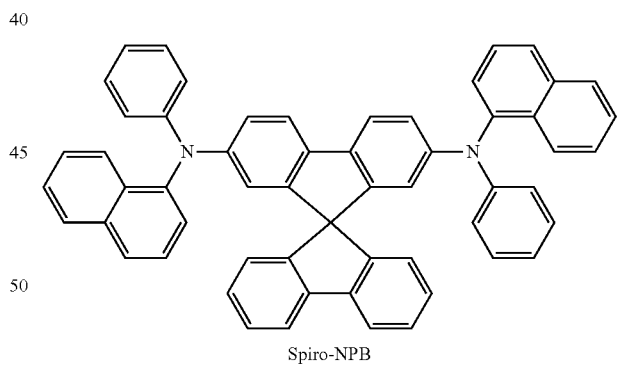
Spiro-NPB
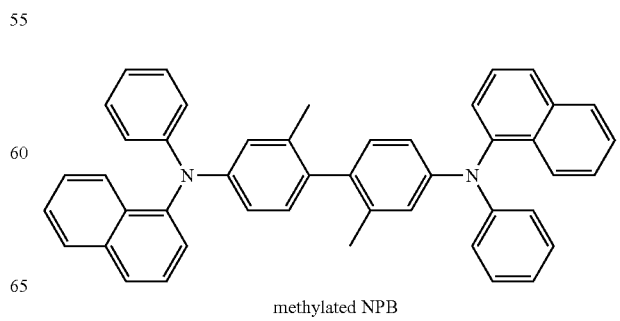
methylated NPB

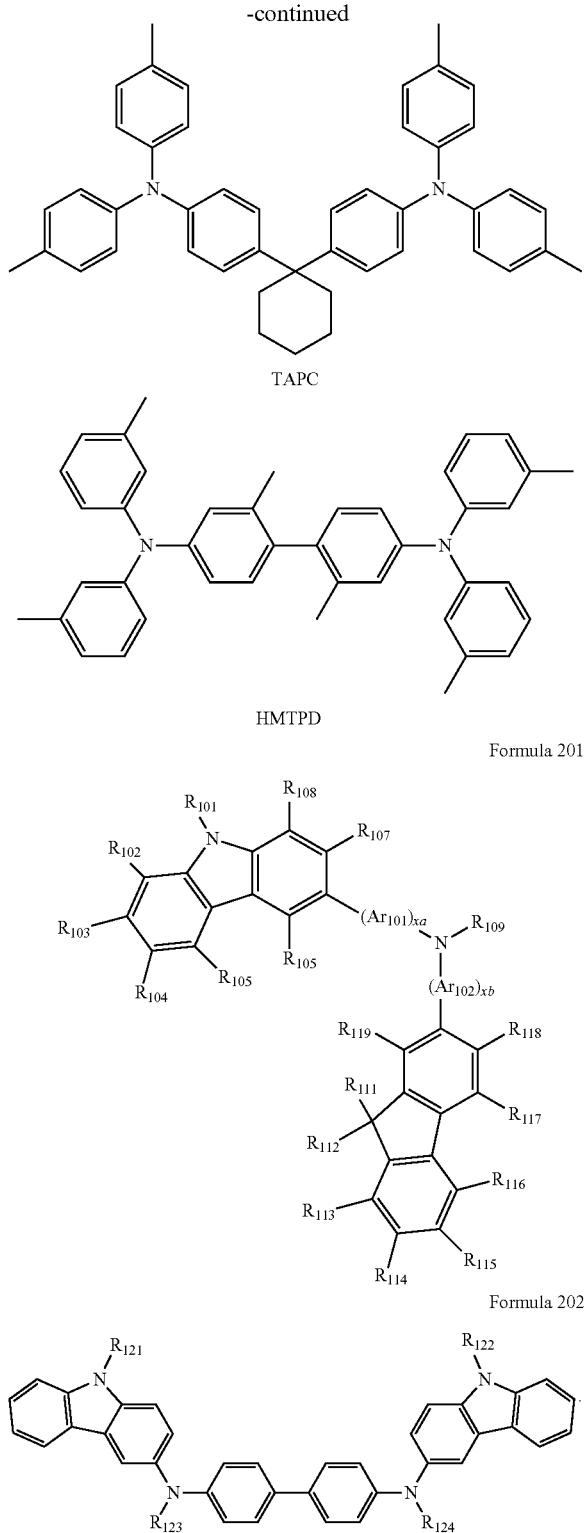

TAPC

HMTPD

Formula 201

Formula 202

In Formula 201, $Ar_{101}$ and $Ar_{102}$ may each independently be selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one substituent selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, and a monovalent non-aromatic fused heteropolycyclic group.

In Formula 201, xa and xb may each independently be an integer of 0 to 5, or 0, 1, or 2. For example, xa may be 1, and xb may be 0, but embodiments are not limited thereto.

$R_{101}$ to $R_{108}$, $R_{111}$ to $R_{119}$, and $R_{121}$ to $R_{124}$ in Formulae 201 and 202 may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, etc.), and a $C_1$-$C_{10}$ alkoxy group (for example, a methoxy group, an ethoxy group, a propoxy group, a butoxy group, a pentoxy group, etc.);

a $C_1$-$C_{10}$ alkyl group and a $C_1$-$C_{10}$ alkoxy group, each substituted with one or more selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with one or more selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

$R_{109}$ in Formula 201 may be selected from a phenyl group, a naphthyl group, an anthracenyl group, and a pyridinyl group; and a phenyl group, a naphthyl group, an anthracenyl group, and a pyridinyl group, each substituted with one or more selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In some embodiments, the compound represented by Formula 201 may be represented by Formula 201A, but is not limited thereto:

Formula 201A

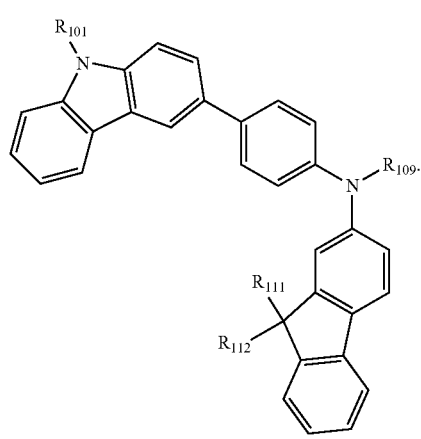

$R_{101}$, $R_{111}$, $R_{112}$, and $R_{109}$ in Formula 201A may be understood by referring to the descriptions thereof provided above.

For example, the compound represented by Formula 201 and the compound represented by Formula 202 may each include Compounds HT1 to HT20, but are not limited thereto:

HT1

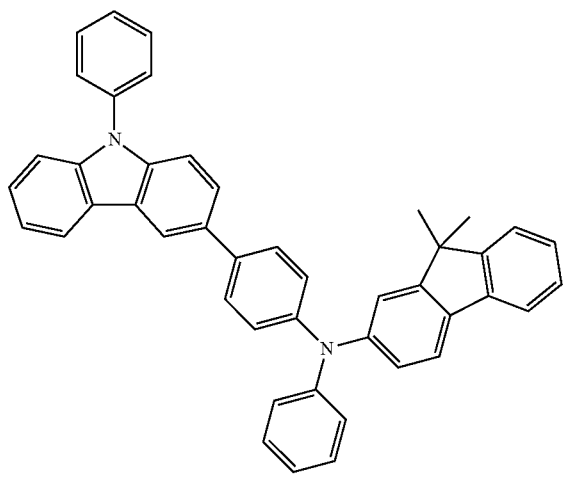

HT2

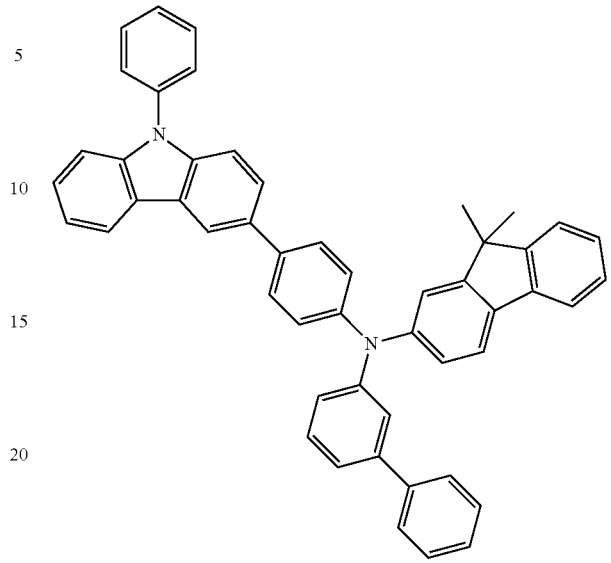

HT3

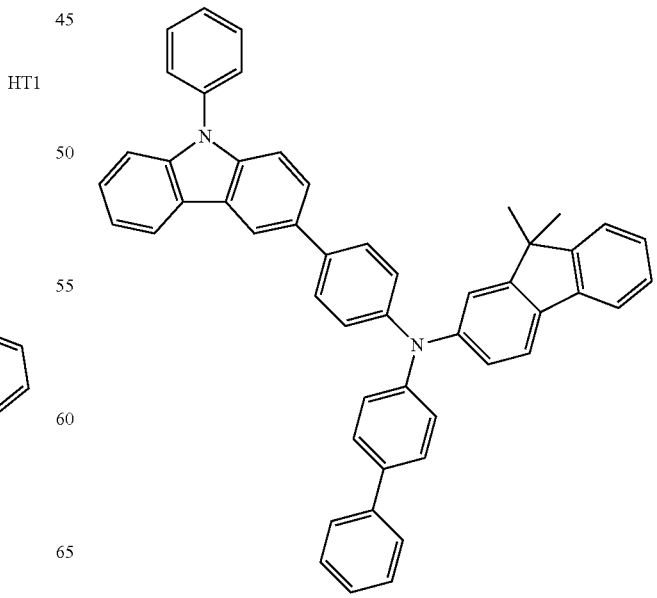

HT4
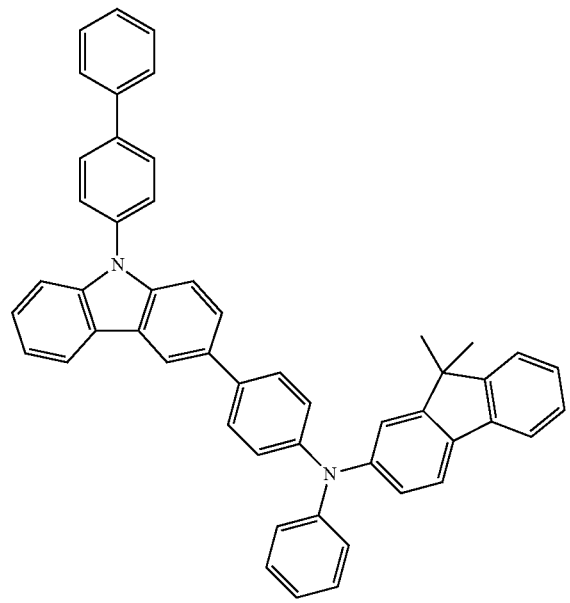
HT5
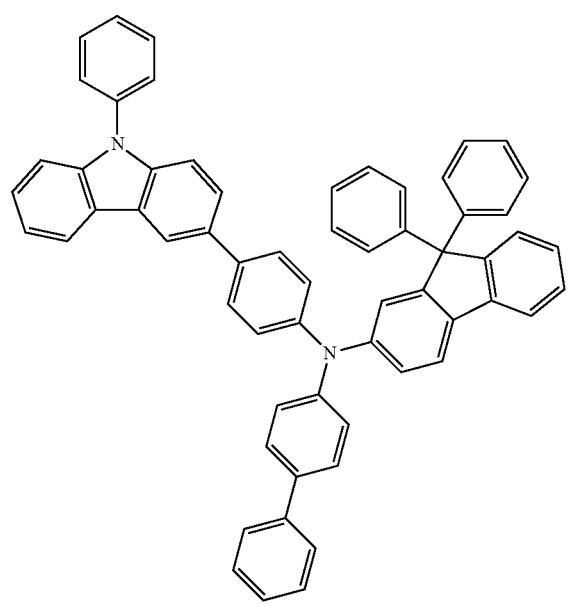
HT6
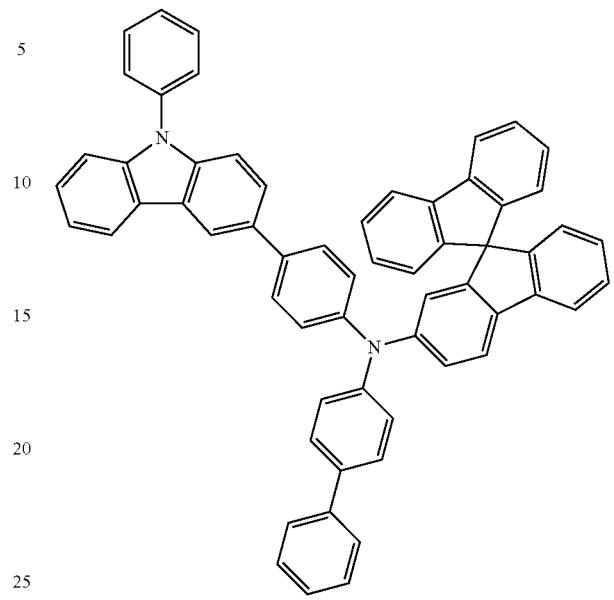
HT7
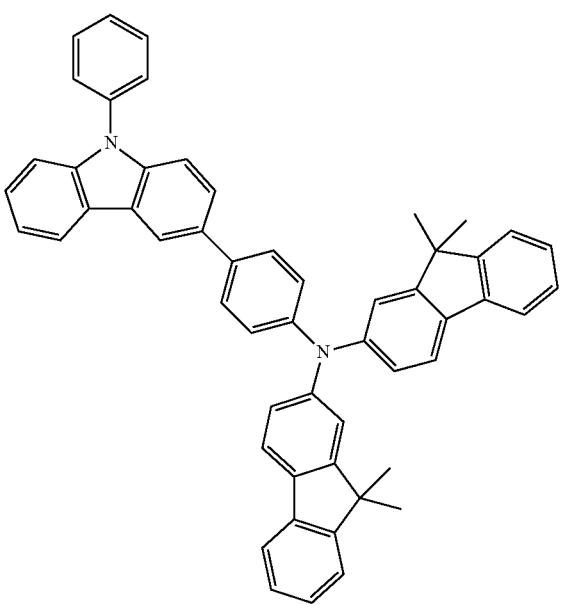

HT8
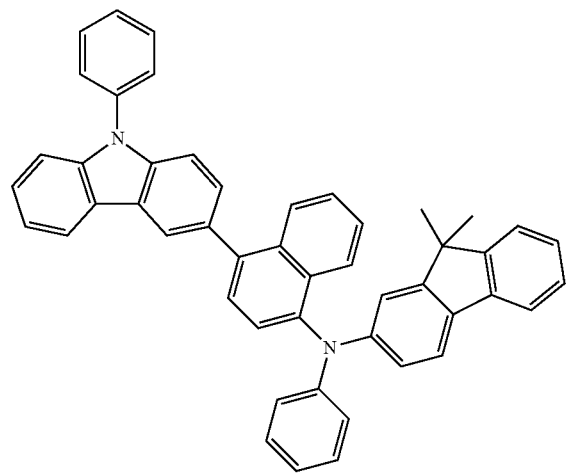
HT9
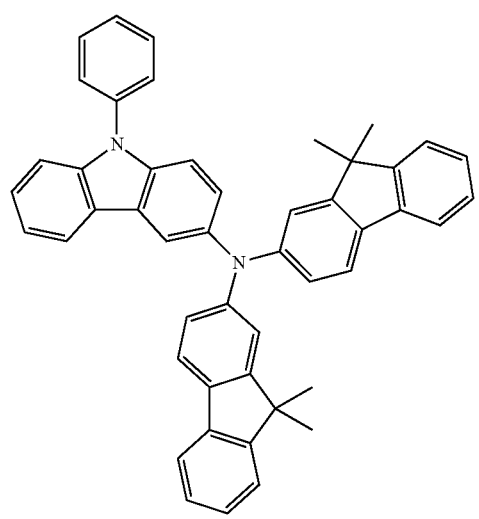
HT10
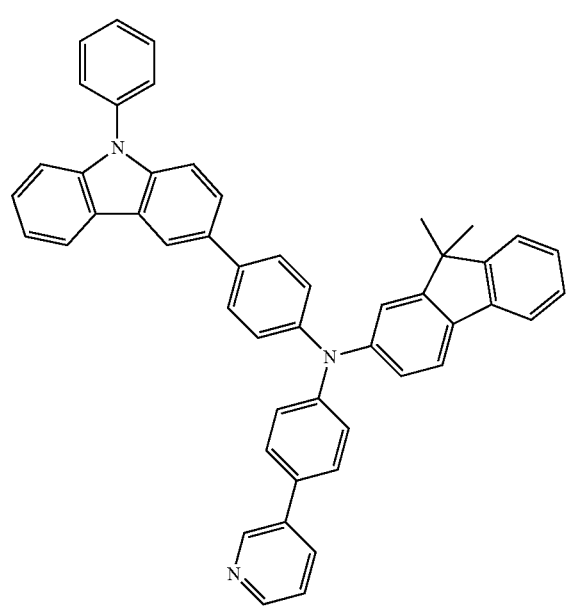
HT11
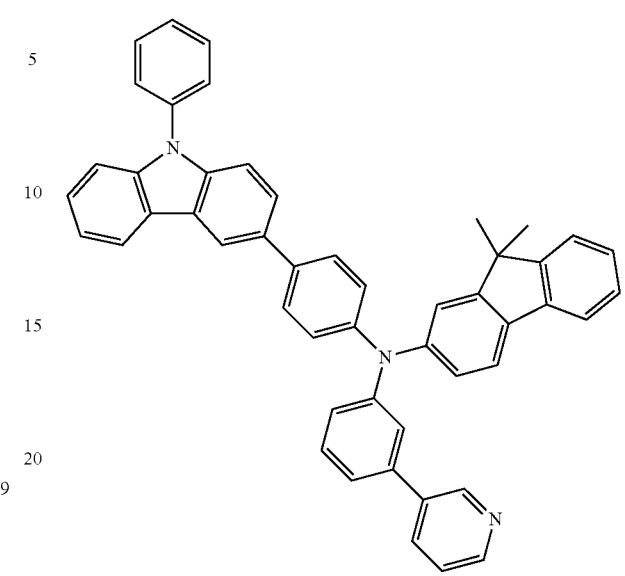
HT12
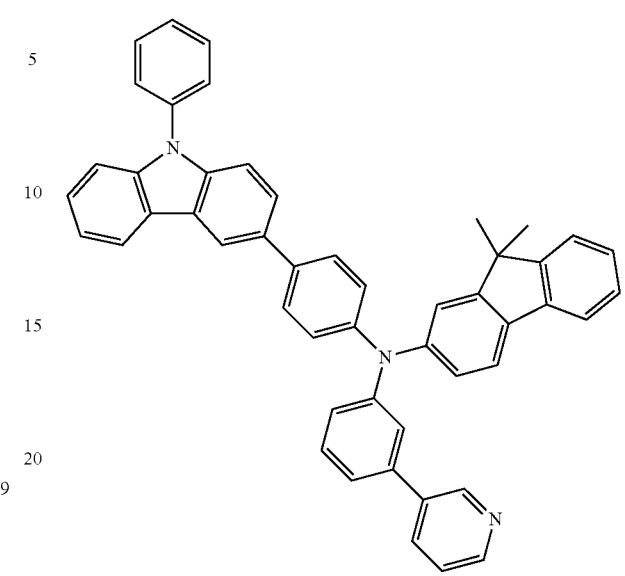
HT13
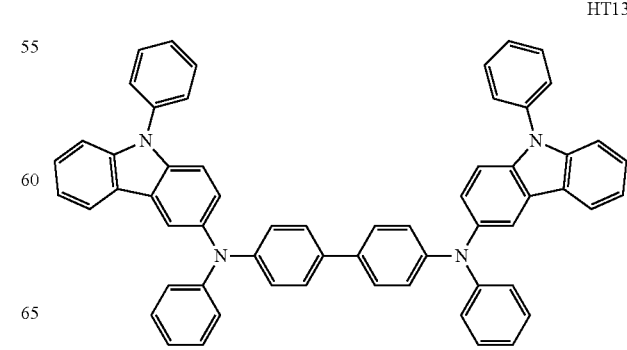

HT14

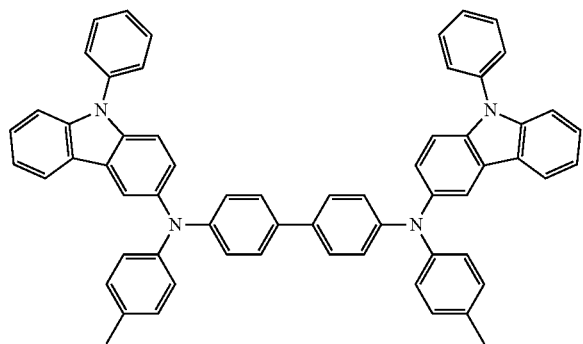

HT15

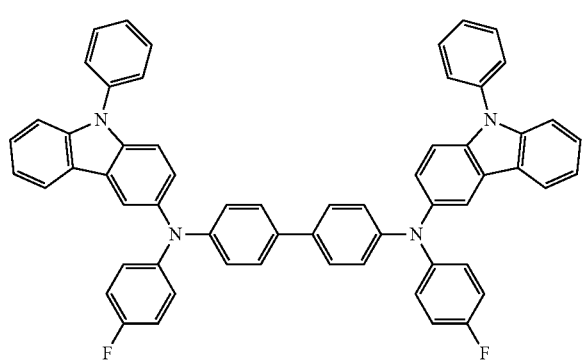

HT16

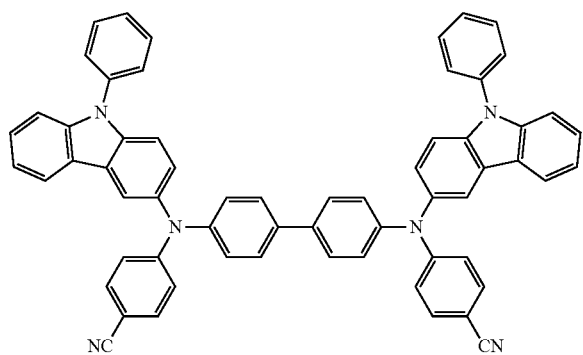

HT17

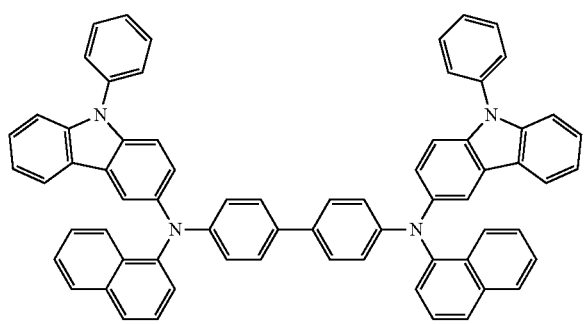

HT18

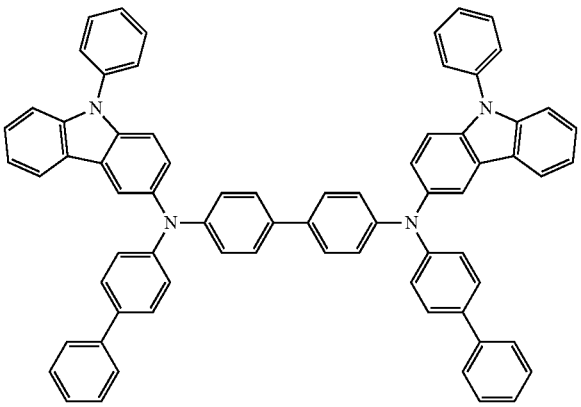

HT19

HT20

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or unhomogeneously dispersed in the hole transport region.

The charge-generation material may be, for example, a p-dopant. The p-dopant may be one selected from a quinone derivative, a metal oxide, and a cyano group-containing compound, but embodiments are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or HP-1, but are not limited thereto.

Compound HT-D1

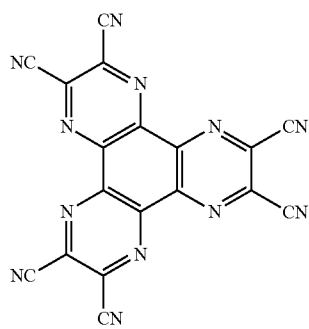

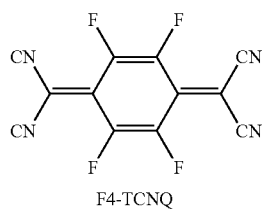

F4-TCNQ

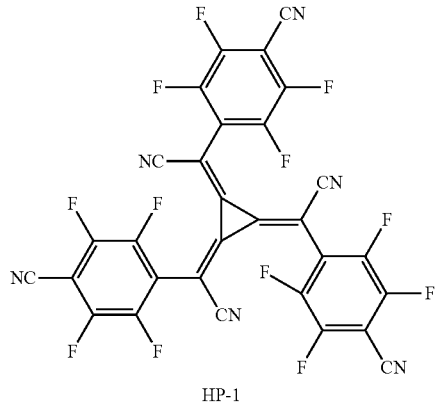

HP-1

The hole transport region may include a buffer layer.

Also, the buffer layer may compensate for an optical resonance distance according to a wavelength of light emitted from the emission layer, and thus, efficiency of a formed organic light-emitting device may be improved.

The electron transport region may further include an electron blocking layer. The electron blocking layer may include, for example, mCP, but a material therefor is not limited thereto.

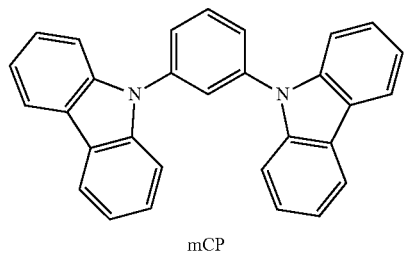 [SMILES: c1cc(-n2c3ccccc3c3ccccc32)cc(-n2c3ccccc3c3ccccc32)c1]

mCP

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied to form the hole injection layer although the deposition or coating conditions may vary according to the material that is used to form the emission layer.

When the organic light-emitting device is a full color organic light-emitting device, the emission layer may be patterned into a red emission layer, a green emission layer, and a blue emission layer. In some embodiments, due to a stack structure including a red emission layer, a green emission layer, and/or a blue emission layer, the emission layer may emit white light.

The emission layer includes a host and a dopant as described above.

A thickness of the emission layer may be in a range of about 100 Å to about 1000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a structure of hole blocking layer/electron transport layer/electron injection layer or a structure of electron transport layer/electron injection layer, but the structure of the electron transport region is not limited thereto. The electron transport layer may have a single-layered structure or a multi-layer structure including two or more different materials.

Conditions for forming the hole blocking layer, the electron transport layer, and the electron injection layer which constitute the electron transport region may be understood by referring to the conditions for forming the hole injection layer.

When the electron transport layer includes a hole blocking layer, the hole blocking layer may include, for example, at least one of BCP and Bphen, but may also include other materials.

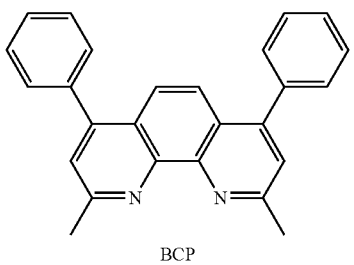

BCP

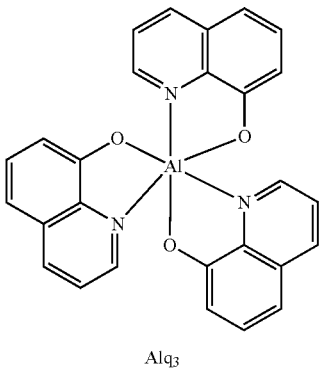

Bphen

A thickness of the hole blocking layer may be in a range of about 20 Å to about 1000 Å, for example, about 30 Å to about 300 Å. When the thickness of the hole blocking layer is within these ranges, the hole blocking layer may have improved hole blocking ability without a substantial increase in driving voltage.

The electron transport layer may further include at least one compound selected from BCP, Bphen, Alq$_3$, Balq, TAZ, and NTAZ.

Alq$_3$

BAlq

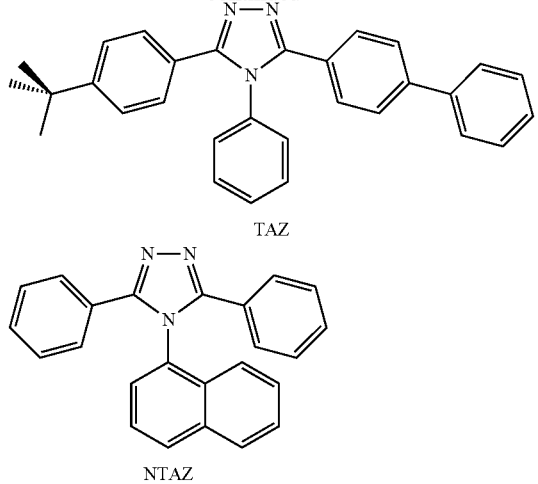

TAZ

NTAZ

In some embodiments, the electron transport layer may include at least one compound selected from Compounds ET1, ET2, and ET3, but embodiments are not limited thereto:

ET1

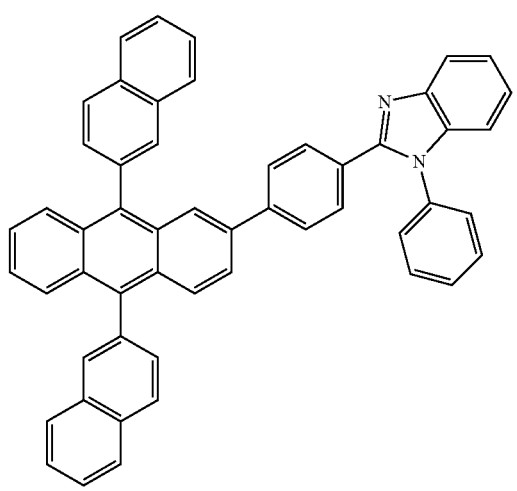

ET2

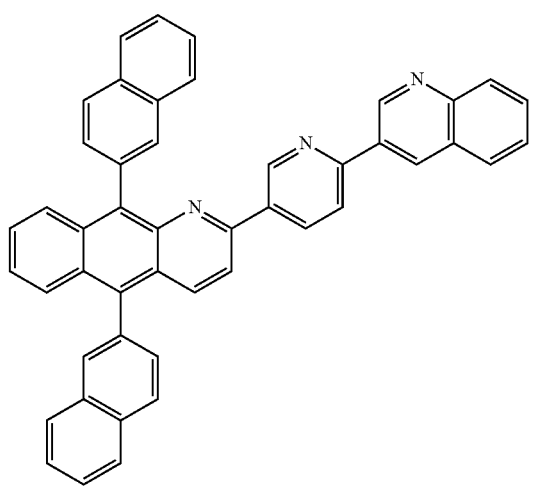

ET3

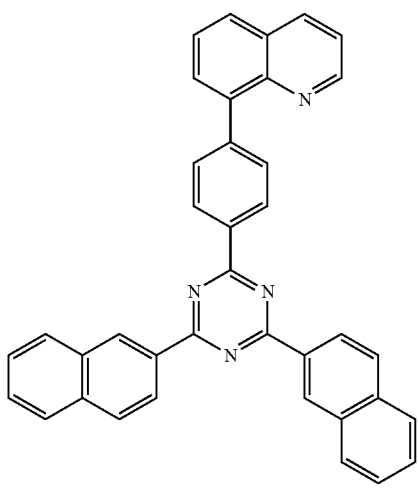

A thickness of the electron transport layer may be in a range of about 100 Å to about 1000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

ET-D1

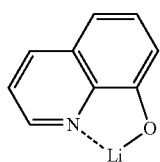

ET-D2

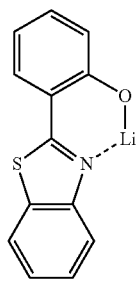

The electron transport layer may include an electron injection layer (EIL) that promotes flow of electrons from the second electrode 19 thereinto.

The electron injection layer may include at least one selected from, LiF, NaCl, CsF, $Li_2O$, BaO, and LiQ.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as a material for forming the second electrode 19. In some embodiments, to manufacture a top emission type light-emitting device, a transmissive electrode formed using ITO or IZO may be used as the second electrode 19.

Hereinbefore, the organic light-emitting device has been described with reference to FIG. 1, but is not limited thereto.

The organic light-emitting apparatus may further include, in addition to the organic light-emitting device, a magnetic field-applying member that may apply a magnetic field to the organic light-emitting device.

The magnetic field-applying member may apply a magnetic field to the organic light-emitting device, for example, an emission layer constituting the organic light-emitting device.

The emission layer of the organic light-emitting device includes a host and a dopant as described above, and the magnetic field provided by the magnetic field-applying member may maximize spin-mixing or spin-flipping occurring between a singlet exciton and a triplet exciton generated in the emission layer, thereby increasing reverse intersystem crossing (RISC) from a triplet excited state to a singlet excited state. The emission layer includes i) a host of which the absolute value of a difference between the singlet ($S_1$) energy and the triplet ($T_1$) energy is 0.3 eV or less, and ii) a dopant that enables effective energy transition from the host. Accordingly, a decrease in luminance efficiency may not occur after the application of a magnetic field (see FIGS. 2 and 3).

Without wishing to be bound to theory, assuming that a relative value of its luminescent efficiency (at 0.5 $mA/cm^2$) of a comparative organic light-emitting device R manufactured in the conditions as shown in Table 1 before the applying of a magnetic field (that is, B=0) is set to "1", when a magnetic field is applied (B=no more than 6000 Gauss) to the comparative organic light-emitting device R, a relative value of its luminescent efficiency (at 0.5 $mA/cm^2$) may be "greater than 0.99 and less than 1." This result may be due to high $\Delta_{ST}$ (the absolute value of the difference between singlet energy and triplet energy) of Compound B (host) used in the emission layer of the comparative organic light-emitting device R. When $\Delta_{ST}$ is high, even when a magnetic field is applied, Compound B may not substantially undergo the improvement in RISC efficiency.

TABLE 1

| | |
|---|---|
| Second electrode | Al is deposited on an electron injection layer below to form a second electrode having a thickness of 1000 Å. |
| Electron injection layer | LiF is deposited on an electron transport layer below to form an electron injection layer having a thickness of 5 Å. |

TABLE 1-continued

Electron transport layer

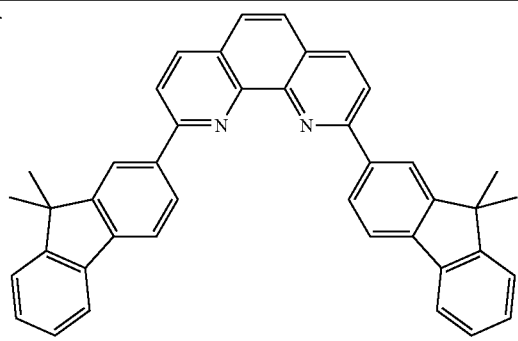

The compound illustrated above is deposited on an emission layer below to form an electron transport layer having a thickness of 200 Å.

Emission layer    Compound A

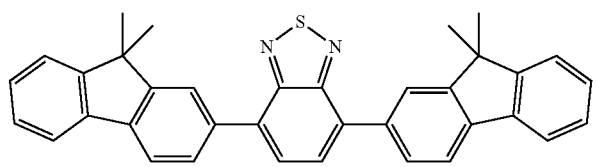 [SMILES: CC1(C)c2ccccc2-c2ccc(-c3ccc(-c4ccc5c(c4)C(C)(C)c4ccccc4-5)c4nsnc34)cc21]

Compound B

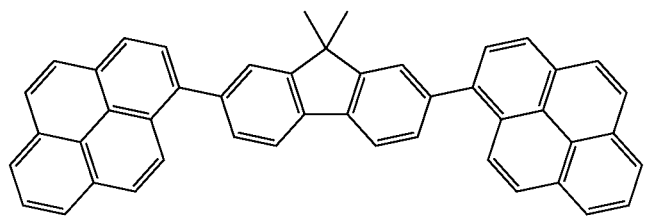 [SMILES: CC1(C)c2cc(-c3ccc4ccc5cccc6ccc3c4c56)ccc2-c2ccc(-c3ccc4ccc5cccc6ccc3c4c56)cc21]

Compound A (dopant) and Compound B (host) are co-deposited on a hole transport layer below at deposition rates of 0.1 Å/sec and 1 Å/sec, respectively, to form an emission layer having a thickness of 1600 Å.

Hole transport layer

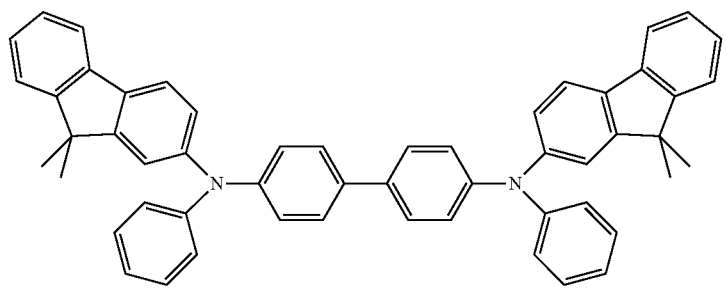 [SMILES: CC1(C)c2ccccc2-c2ccc(N(c3ccccc3)c3ccc(-c4ccc(N(c5ccccc5)c5ccc6c(c5)C(C)(C)c5ccccc5-6)cc4)cc3)cc21]

A mixture of the compound illustrated above and chloroform is spin-coated on a first electrode below at a rate of 500 rpm for 10 seconds and then, at a coating rate of 1000 rpm for 40 seconds, to form a hole transport layer.

First electrode    ITO film (120 nm)
Substrate          glass substrate

However, an organic light-emitting device according to an embodiment includes i) a host having 0.3 eV or less of an absolute value of a difference between the singlet ($S_1$) energy and the triplet ($T_1$) energy and ii) a dopant that enables effective energy transition from the host, and when a magnetic field is applied to the organic light-emitting device, the efficiency of RISC from a triplet excited state to a singlet excited state in the emission layer is high and thus, singlet harvesting may efficiently occur.

Singlet energy and triplet energy (evaluated by using DFT method employing Gaussian program that is structurally optimized at a level of B3LYP/6-31G(d,p)), and $\Delta_{ST}$ of Compound A, Compound B, exciplex formed from MeO and 3TPYMB, and DBP are shown in Table 2 below.

TABLE 2
| | Singlet ($S_1$) energy (eV) | Triplet ($T_1$) energy (eV) | $\Delta_{ST}$ ($|S_1-T_1|$) (eV) |
|---|---|---|---|
| Compound A | 2.526 | 1.741 | 0.786 |
| 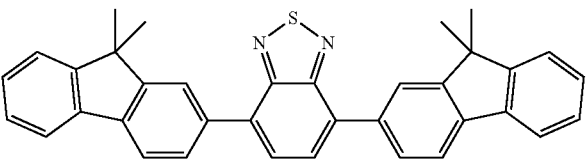 [SMILES: CC1(C)c2ccccc2-c2ccc(-c3ccc(-c4ccc5c(c4)C(C)(C)c4ccccc4-5)c4nsnc34)cc21] | | | |
| Compound B | 3.123 | 2.028 | 1.095 |
| 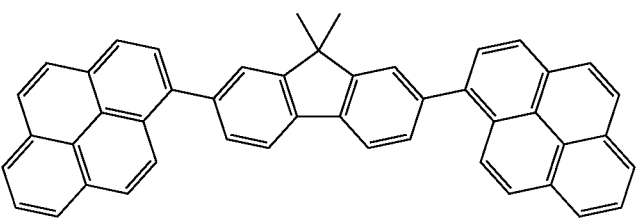 [SMILES: CC1(C)c2cc(-c3ccc4ccc5cccc6ccc3c4c56)ccc2-c2ccc(-c3ccc4ccc5cccc6ccc3c4c56)cc21] | | | |
| Exciplex formed from MeO-TPD and 3TPYMB | 2.330 | 2.330 | ~0.0 |
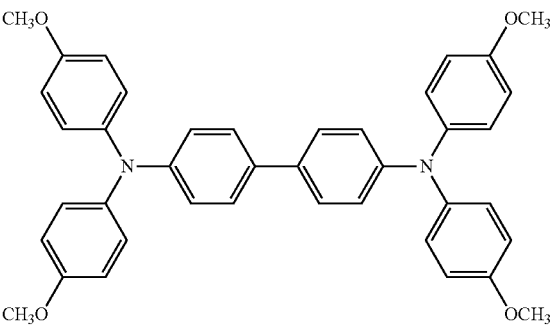
MeO-TPD
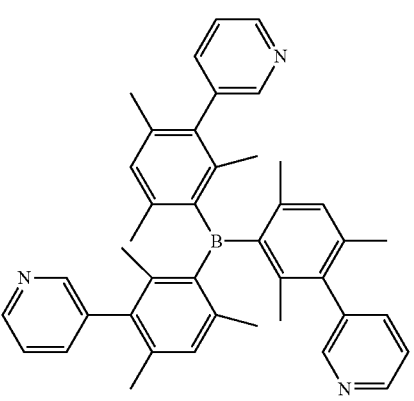
3TPYMB TABLE 2-continued

| | Singlet ($S_1$) energy (eV) | Triplet ($T_1$) energy (eV) | $\Delta_{ST}$ ($|S_1-T_1|$) (eV) |
|---|---|---|---|
| DBP (Compound FD(10)) | 2.161 | 1.223 | 0.938 |

The magnetic field-applying member may be an external magnetic field-applying member which may apply a magnetic field from the outside of the organic light-emitting device. For example, the magnetic field-applying member may be an attachable magnet or the like, which may be attached to the organic light-emitting device. However, the magnetic field-applying member is not limited thereto. The magnetic field-applying member may further include an apparatus for controlling intensity of magnetic field.

In some embodiments, the magnetic field-applying member may apply a magnetic field in a range of −2,000 Gauss to 2,000 Gauss to the organic light-emitting device, but is not limited thereto.

A $C_1$-$C_{60}$ alkyl group used herein refers to a linear or branched aliphatic hydrocarbon monovalent group having 1 to 60 carbon atoms, and detailed examples thereof are a methyl group, an ethyl group, a propyl group, an isobutyl group, a sec-butyl group, a tert-butyl group, a pentyl group, an iso-amyl group, and a hexyl group. A $C_1$-$C_{60}$ alkylene group used herein refers to a divalent group having the same structure as the $C_1$-$C_{60}$ alkyl group.

A $C_1$-$C_{60}$ alkoxy group used herein refers to a monovalent group represented by —$OA_{101}$ (wherein $A_{101}$ is the $C_1$-$C_{60}$ alkyl group), and detailed examples thereof are a methoxy group, an ethoxy group, and an isopropyloxy group.

A $C_2$-$C_{60}$ alkenyl group used herein has a structure including at least one carbon double bond in the middle or at the terminal of the $C_2$-$C_{60}$ alkyl group, and detailed examples thereof are an ethenyl group, a propenyl group, and a butenyl group. A $C_2$-$C_{60}$ alkenylene group used herein refers to a divalent group having the same structure as the $C_2$-$C_{60}$ alkenyl group.

A $C_2$-$C_{60}$ alkynyl group used herein has a structure including at least one carbon triple bond in the middle or at the terminal of the $C_2$-$C_{60}$ alkyl group, and detailed examples thereof are an ethynyl group and a propynyl group. A $C_2$-$C_{60}$ alkynylene group used herein refers to a divalent group having the same structure as the $C_2$-$C_{60}$ alkynyl group.

A $C_5$-$C_{60}$ carbocyclic group used herein refers to a monovalent, divalent, or higher valency group containing only carbon atoms in the ring(s) thereof, which may be saturated, unsaturated, or aromatic, having 5 to 60 carbon atoms. Detailed examples of the $C_6$-$C_{60}$ carbocyclic group are a cyclopentyl group, a cyclohexenyl group, a decalin group, a phenyl group, a naphthyl group, an anthracenyl group, a phenanthrenyl group, a pyrenyl group, and a chrysenyl group. When the $C_6$-$C_{60}$ carbocyclic group includes two or more rings, the rings may be condensed to each other or linked via a bond.

A $C_1$-$C_{60}$ heterocarbocyclic group used herein refers to a monovalent, divalent or higher valency group having one or more rings, at least one carbon atom and at least one heteroatom selected from N, O, P, Si, and S as a ring-forming atom in the ring(s) thereof, which may be saturated, unsaturated, or aromatic, having 5 to 60 carbon atoms. Detailed examples of the $C_6$-$C_{60}$ carbocyclic group are a cyclopentyl group, a decalin group, a phenyl group, a naphthyl group, a pyridinyl group, a pyrimidinyl group, a pyrazinyl group, a pyridazinyl group, a triazinyl group, a quinolinyl group, and an isoquinolinyl group. When the $C_6$-$C_{60}$ heterocarbocyclic group includes two or more rings, the rings may be condensed to each other.

A $C_3$-$C_{10}$ cycloalkyl group used herein refers to a monovalent saturated hydrocarbon monocyclic group having 3 to 10 carbon atoms, and detailed examples thereof are a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as the $C_3$-$C_{10}$ cycloalkyl group.

A $C_2$-$C_{10}$ heterocycloalkyl group used herein refers to a monovalent monocyclic group having at least one heteroatom selected from N, O, P, Si, and S as a ring-forming atom and 2 to 10 carbon atoms, and detailed examples thereof are a tetrahydrofuranyl group and a tetrahydrothiophenyl group. A $C_2$-$C_{10}$ heterocycloalkylene group used herein refers to a divalent group having the same structure as the $C_2$-$C_{10}$ heterocycloalkyl group.

A $C_3$-$C_{10}$ cycloalkenyl group used herein refers to a monovalent monocyclic group that has 3 to 10 carbon atoms and at least one double bond in the ring thereof and does not have aromaticity, and detailed examples thereof are a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_2$-$C_{10}$ heterocycloalkenyl group used herein refers to a monovalent monocyclic group that has at least one heteroatom selected from N, O, P, Si, and S as a ring-forming atom, 2 to 10 carbon atoms, and at least one double bond in its ring. Detailed examples of the $C_1$-$C_{10}$ heterocycloalkenyl group are a 2,3-hydrofuranyl group and a 2,3-hydrothiophenyl group. A $C_2$-$C_{10}$ heterocycloalkenylene group used herein refers to a divalent group having the same structure as the $C_2$-$C_{10}$ heterocycloalkenyl group.

A $C_6$-$C_{60}$ aryl group used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group used herein refers to a monovalent group having a carbocyclic aromatic system that includes at least one heteroatom selected from N, O, P, Si, and S as a ring-forming atom and has 1 to 60 carbon atoms. A $C_1$-$C_{60}$ heteroarylene group used herein refers to a divalent group having a carbocyclic aromatic system that includes at least one heteroatom selected from N, O, P, Si, and S as a ring-forming atom and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group each include two or more rings, the rings may be fused to each other.

A $C_6$-$C_{60}$ aryloxy group used herein refers to —$OA_{102}$ (wherein $A_{102}$ is the $C_6$-$C_{60}$ aryl group), and a $C_6$-$C_{60}$ arylthio group used herein refers to —$SA_{103}$ (wherein $A_{103}$ is the $C_6$-$C_{60}$ aryl group).

A monovalent non-aromatic condensed polycyclic group used herein refers to a monovalent group that has two or more rings condensed to each other, includes only carbon atoms as a ring forming atom (for example, having 8 to 60 carbon atoms), and has non-aromaticity in the entire molecular structure. A detailed example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group used herein refers to a monovalent group that has two or more rings condensed to each other, includes a heteroatom selected from N, O, P, Si, and S, other than carbon atoms (for example, having 2 to 60 carbon atoms), as a ring forming atom, and has non-aromaticity in the entire molecular structure. An example of the monovalent non-aromatic fused heteropolycyclic group is a carbazolyl group. A divalent non-aromatic fused heteropolycyclic group used herein refers to a divalent group having the same structure as the monovalent non-aromatic fused heteropolycyclic group.

As used herein, at least one of substituents of the substituted $C_3$-$C_{10}$ cycloalkylene group, substituted $C_2$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic fused polycyclic group, substituted divalent non-aromatic fused heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, and —$B(Q_{26})(Q_{27})$; and —$N(Q_{31})(Q_{32})$, —$Si(Q_{33})(Q_{34})(Q_{35})$, or —$B(Q_{36})(Q_{37})$, wherein $Q_1$ to $Q_7$, $Q_{11}$ to $Q_{17}$, $Q_{21}$ to $Q_{27}$, and $Q_{31}$ to $Q_{37}$ are each independently hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

The term "room temperature" used herein refers to a temperature of about 25° C.

Although a compound according to an embodiment and an organic light-emitting device according to an embodiment will be described hereinafter with reference to Synthesis Examples and Examples, the present disclosure is not limited to Synthesis Examples and Examples below. The wording "B was used instead of A" used in describing Synthesis Examples below means that a molar equivalent of A is identical to a molar equivalent of B.

EXAMPLES

Evaluation Example 1: Magneto-Photoluminescence (MPL) and Photoluminescence (PL) Spectrum Evaluation A quartz substrate was prepared by washing with chloroform and pure water, and then, the materials that are listed in Table 3 were vacuum (co)-deposited under a vacuum degree of about $10^{-7}$ torr to prepare Film 1 and Film A each having a thickness of about 150 nanometers (nm).

TABLE 3

| Film | Compounds used in the preparation of the film (each ratio described herein indicates the weight ratio) |
|---|---|
| Film 1 | MeO-TPB, 3TPYMB, and DBP |
| | MeO-TPB:3TPYMB = 1:4 |
| | DBP:MeO-TPB + 3TPYMB = 1:99 |
| Film A | MeO-TPB and 3TPYMB |
| | MeO-TPB:3TPYMB = 1:4 |

Thereafter, for measuring magneto-photoluminescence and photoluminescence (at a low temperature (LT, 10° K) and room temperature (RT, 290° K)), Film 1 and Film A prepared as described above were placed in a cryostat at 10° K, which is a magnetic field applying device. The cryostat is placed between two poles of a magnetic field up to 2000 Gauss perpendicular to Films 1 and A. In applying magnetic field, an electromagnet was used and a constant power laser beam of no more than 200 mW (excitation wavelength=350 nm) was used, pumping PL emission of Films 1 and A, which was measured by a spectrometer.

Figure 2:
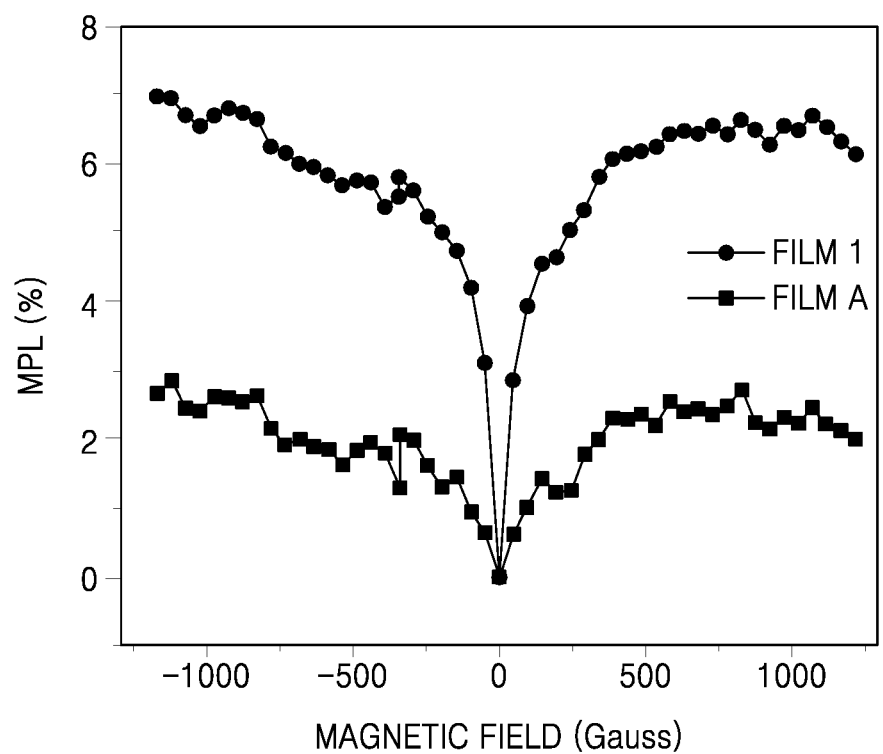
FIG. 2 is a graph of magneto-photoluminescence (MPL) (%) with respect to magnetic field (Gauss), which is measured in Evaluation Example 1.
Figure 3:
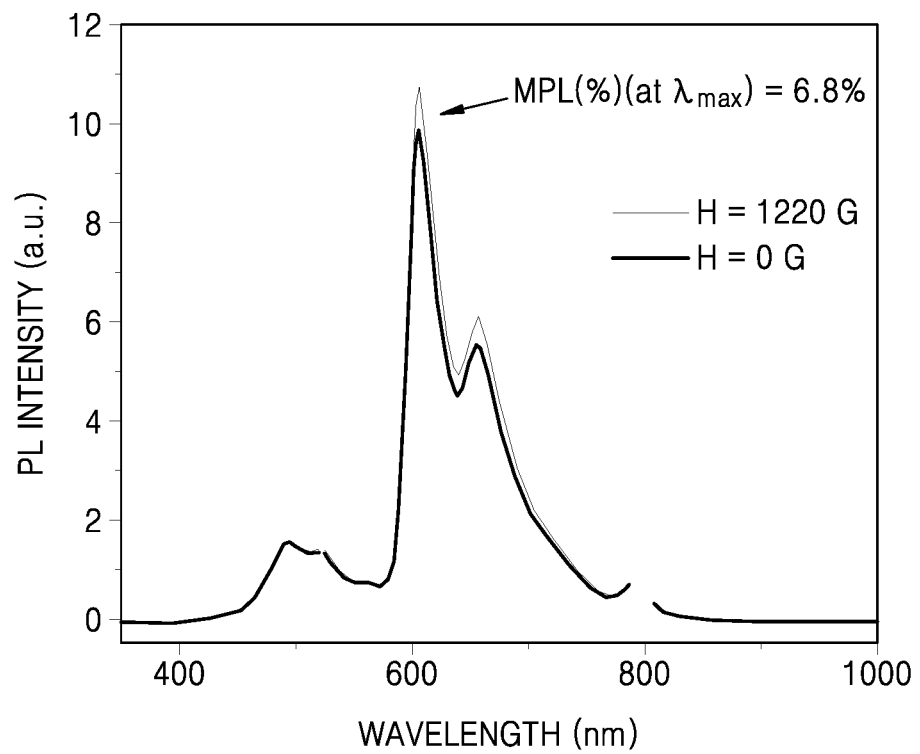
FIG. 3 is a graph of photoluminescence intensity (a.u.) with respect to wavelength (nm) in Film 1, which is measured in Evaluation Example 1.

A graph of MPL (percent, %) versus magnetic field (Gauss) (at room temperature) of Film 1 and Film A is shown in FIG. 2. A graph of PL intensity (arbitrary units, a.u.) versus wavelength (nm) before applying magnetic field to Film 1 (i.e., B=0) and a graph of PL intensity (a.u.) versus wavelength (nm) when applying magnetic field to Film 1 (i.e., B=1220 Gauss) are shown in FIG. 3. MPL (%) (at $\lambda_{max}$) of Film 1 is also shown in FIG. 3. MPL (LT) (at 1500 Gauss) and MPL (RT) (at 1500 Gauss) of Film 1 and A are summarized in Table 4.

MPL (%) at a corresponding magnetic field in FIG. 2, FIG. 3 and Table 4 was calculated using Equation 10.

$$\text{MPL (\%)}=\{[PL(B)-PL(B=0)]/PL(B=0)\}\times 100 \quad \text{Equation 10}$$

In Equation 10, PL (B=0) indicates a steady-state PL intensity (a.u.) before applying magnetic field, and PL (B) indicates a steady-state PL intensity (a.u.) when applying magnetic field.

TABLE 4

| Film | Host | Dopant | MPL (LT) at 1500 Gauss | MPL (RT) at 1500 Gauss |
|---|---|---|---|---|
| Film 1 | MeO-TPB:3TPYMB | DBP (1 wt %) | 2.0% | 6.5% |
| Film A | MeO-TPB:3TPYMB | — | <0.1% | 2.7% |

Referring to FIG. 2 and Table 4, it was found that the MPL of Film 1 including DBP as a dopant was high compared to that of Film A not including DBP. In addition, Referring to FIG. 3, the light at a maximum emission wavelength of Film 1 had a MPL of about 6.8% when applying a magnetic field of 1220 Gauss.

Example 1

As an anode, a glass substrate having ITO electrode thereon was cut to a size of 50 millimeters (mm)×50 mm×0.5 mm. Then the glass substrate was sonicated in acetone, isopropyl alcohol, and pure water for about 15 minutes in each solvent, and cleaned by exposure to ultraviolet rays with ozone for 30 minutes.

On the ITO anode, a composition (Batron AI 4083, available from Bayer) including PEDOT:PSS was spin-coated, and then subject to baking at a temperature of about 100° C. for about 0.5 hour, thereby forming a hole transport layer having a thickness of about 400 Å (Angstroms).

On the hole transport layer, MeO-TPB and 3TPYMB (at a weight ratio of MeO-TPB to 3TPYMB of 1:4) as a host and DBP (at a weight ratio of the dopant to the host of 1:99) as a dopant were co-deposited, thereby forming an emission layer having a thickness of about 1,600 Å.

On the emission layer, a Ca layer having a thickness of about 200 Å and an Al layer having a thickness of about 1,000 Å were sequentially formed to form a second electrode (cathode), thereby completing the manufacture of an organic light-emitting device.

Comparative Example 1

An organic light-emitting device was manufactured in the same manner as in Example 1, except that DBP, which is a dopant, was not used in forming an emission layer.

Evaluation Example 2:
Magneto-Electroluminescence (MEL) Evaluation

The magneto-electroluminescence evaluation was performed on the organic light-emitting device manufactured in Example 1 in the same manner as in Evaluation Example 1. The evaluation result is shown in Table 5. MEL (%) in Table 5 was calculated using Equation 11.

$$\text{MEL (\%)}=\{[EL(B)-EL(B=0)]/EL(B=0)\}\times 100 \quad \text{Equation 11}$$

In Equation 11, EL (B=0) indicates an EL intensity (a.u.) before applying magnetic field, and EL (B) indicates an EL intensity (a.u.) when applying magnetic field.

TABLE 5

| | Host | Dopant | MEL (LT) at 1,500 Gauss | MEL (RT) at 1,500 Gauss |
|---|---|---|---|---|
| Example 1 | MeO-TPB:3TPYMB | DBP (1 wt %) | 6.5% | 11.0% |

Referring to Table 5, it is seen that the organic light-emitting device of Example 1 has excellent MEL characteristics.

Evaluation Example 3: Device Characteristics Evaluation

Luminance, current efficiency, and power of the organic light-emitting device manufactured in Example 1 before and after applying magnetic field thereto were measured using the magnetic field applying device in Evaluation Example 1 and Keithley 236 apparatus. The evaluation results are shown in Table 6.

TABLE 6

| Driving voltage (V) | Luminance (B = 0) (cd/m$^2$) | Luminance (B = 1500 Gauss) (cd/m$^2$) | Current efficiency (B = 0) (cd/A) | Current efficiency (B = 1500 Gauss) (cd/A) | Power (B = 0) (lm/W) | Power (B = 1500 Gauss) (lm/W) |
|---|---|---|---|---|---|---|
| 12 | 4 | 4.4 | 0.298 | 0.308 | 0.312 | 0.324 |
| 19 | 21 | 28.5 | 0.375 | 0.402 | 0.247 | 0.266 |
| 24 | 68 | 100 | 0.402 | 0.820 | 0.158 | 0.267 |

Referring to Table 6, it was found that the organic light-emitting device of Example 1 had improved magnetic field applying luminance, current efficiency, and power at 1500 Gauss.

According to one or more embodiments of the present disclosure, an organic light-emitting apparatus including an organic light-emitting device which includes an emission layer including a predetermined host and a predetermined dopant and a magnetic field-applying member which applies a magnetic field to the organic light-emitting device may have high efficiency and high luminance.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims

What is claimed is:

1. An organic light-emitting apparatus comprising: an organic light-emitting device; and a magnetic field-applying member that applies a magnetic field to the organic light-emitting device, wherein the organic light-emitting device comprises:

a first electrode;
a second electrode facing the first electrode; and
an organic layer between the first electrode and the second electrode, the organic layer comprising an emission layer,
wherein the emission layer comprises a host and a dopant, the host comprises a combination of a hole transport compound and an electron transport compound, the hole transport compound and the electron transport compound form an exciplex, the hole transport compound is a compound represented by one of Formulae 1 to 5, and the electron transport compound is a compound represented by one of Formulae 11 to 15, provided that the hole transport compound is not a Compound 3,

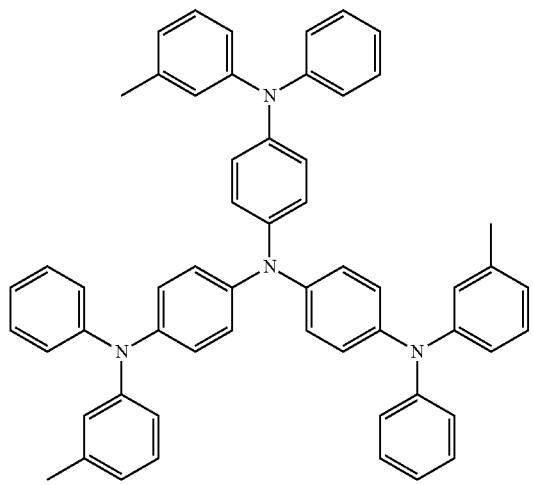

an absolute value of a difference between a singlet ($S_1$) energy of the exciplex and a triplet ($T_1$) energy of the exciplex is 0.3 eV or less, and
wherein the dopant is a fluorescent dopant, and a singlet (S1) energy of the fluorescent dopant is less than a singlet (S1) energy of the host:

Formula 1

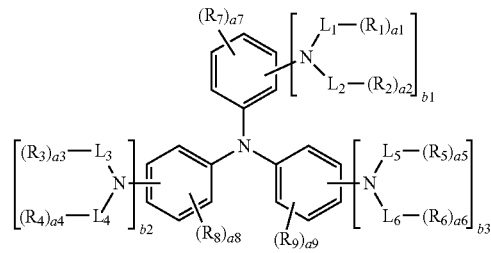

-continued

Formula 2

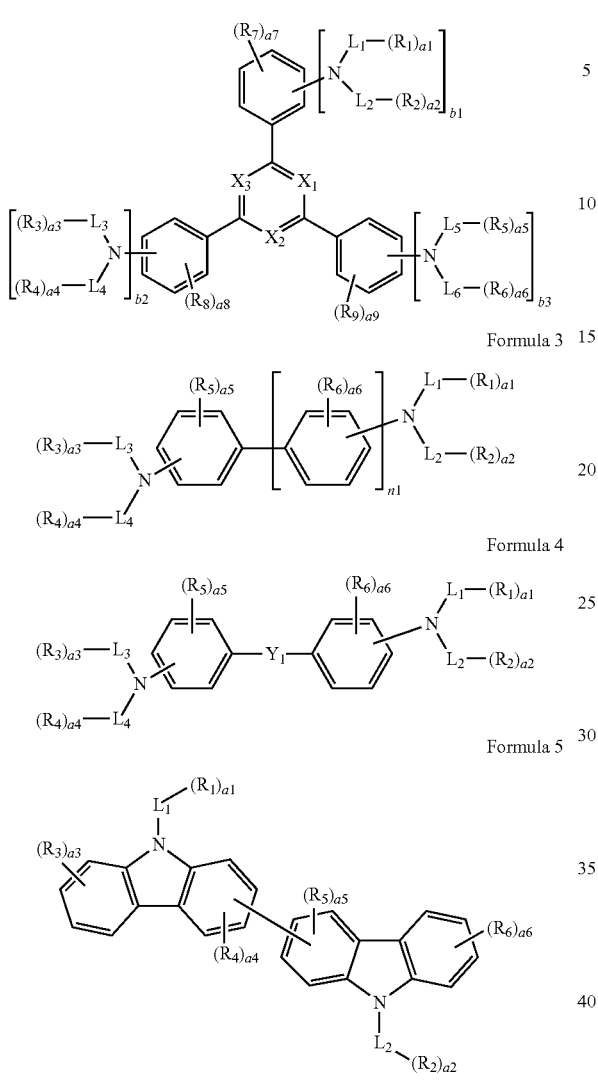

Formula 3

Formula 4

Formula 5

Formula 11

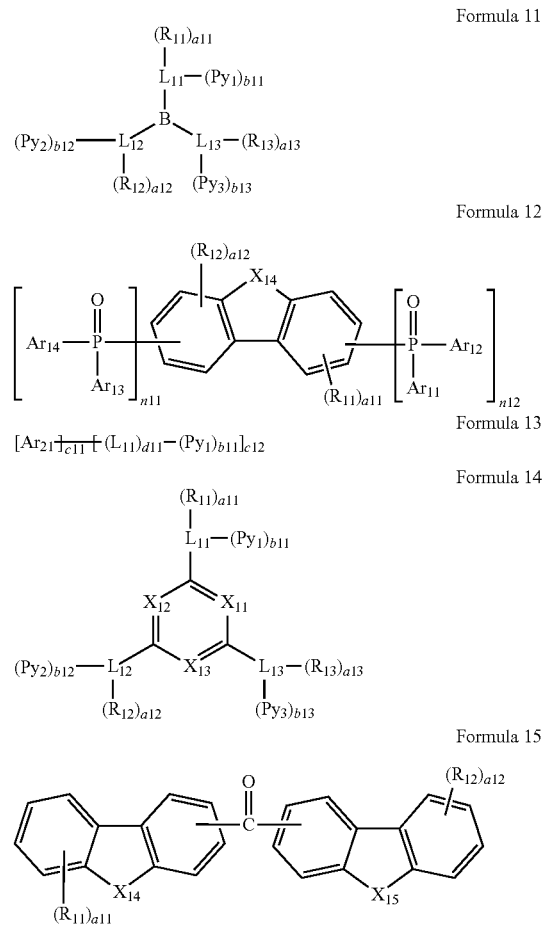

Formula 12

Formula 13

$[Ar_{21}]_{c11}$—$(L_{11})_{d11}$—$(Py_1)_{b11}]_{c12}$

Formula 14

Formula 15 wherein, in Formulae 1 to 5,
$L_1$ to $L_6$ and $Y_1$ are each independently a substituted or unsubstituted $C_5$-$C_{60}$ carbocyclic group,
$X_1$ is N or $C(R_{21})$, $X_2$ is N or $C(R_{22})$, $X_3$ is N or $C(R_{23})$, and at least one of $X_1$ to $X_3$ is N,
$R_1$ to $R_9$ and $R_{21}$ to $R_{23}$ are each independently selected from hydrogen, deuterium, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and —$N(Q_1)(Q_2)$,
wherein $Q_1$ and $Q_2$ are each independently selected from hydrogen, deuterium, a substituted or unsubstituted $C_1$-$C_{60}$ alkyl group, a substituted or unsubstituted $C_1$-$C_{60}$ alkoxy group, and a substituted or unsubstituted $C_6$-$C_{60}$ aryl group,
$R_1$ and $R_2$ optionally bind to each other and form a saturated or unsaturated ring, $R_3$ and $R_4$ optionally bind to each other and form a saturated or unsaturated ring, and $R_5$ and $R_6$ optionally bind to each other and form a saturated or unsaturated ring,
a1 to a9 are each independently an integer of 0 to 5,
b1 to b3 are each independently 1 or 2, and
n1 is 0 or 1, and wherein, in Formulae 11 to 15,
$L_{11}$ to $L_{13}$ and $Ar_{21}$ are each independently a substituted or unsubstituted $C_5$-$C_{60}$ carbocyclic group or a $C_1$-$C_{60}$ heterocyclic group,
c11 is an integer of 1 to 3, and when c11 is 2 or more, two or more $Ar_{21}(s)$ are fused to each other or bind to each other via a single bond,
d11 is 0, 1, or 2,
$X_{11}$ is N or $C(R_{31})$, $X_{12}$ is N or $C(R_{32})$, $X_{13}$ is N or $C(R_{33})$, and at least one of $X_{11}$ to $X_{13}$ is N,
$X_{14}$ is S, $S(=O)_2$, or $C(R_{34})(R_{35})$,
$X_{15}$ is S, $S(=O)_2$, or $C(R_{36})(R_{37})$,
$R_{11}$ to $R_{13}$ and $R_{31}$ to $R_{33}$ are each independently selected from hydrogen, deuterium, a substituted or unsubstituted $C_1$-$C_{60}$ alkyl group, a substituted or unsubstituted $C_1$-$C_{60}$ alkoxy group, and a substituted or unsubstituted $C_6$-$C_{60}$ aryl group,
$R_{34}$ to $R_{37}$ are each independently selected from a substituted or unsubstituted $C_1$-$C_{60}$ alkyl group and a substituted or unsubstituted $C_6$-$C_{60}$ aryl group, $R_{34}$ and $R_{35}$ optionally bind each other and form a saturated or unsaturated ring, and $R_{36}$ and $R_{37}$ optionally bind each other and form a saturated or unsaturated ring,
a11 to a13 are each independently an integer of 0 to 5,
$Py_1$ to $Py_3$ are each independently selected from
a pyridinyl group, a pyrimidinyl group, a pyrazinyl group, a pyridazinyl group, a triazinyl group, a benzoimidazolyl group, a quinolinyl group, an isoquinolinyl group, a quinazolinyl group, a quinoxalinyl group, an imidazopyridinyl group, and an imidazopyrimidinyl group; and a pyridinyl group, a pyrimidinyl group, a pyrazinyl group, a pyridazinyl group, a triazinyl group, a benzoimidazolyl group, a quinolinyl group, an isoquinolinyl group, a quinazolinyl group, a quinoxalinyl group, an imidazopyridinyl group, and an imidazopyrimidinyl group, each substituted with at least one substituent independently selected from deuterium, a $C_1$-$C_{10}$ alkyl group, a $C_1$-$C_{10}$ alkoxy group, a phenyl group, a biphenyl group, and a terphenyl group, b11 is 1, 2, or 3, b12 and b13 are each independently 0, 1, 2, or 3, $Ar_{11}$ to $Ar_{14}$ are each independently selected from a substituted or unsubstituted $C_6$-$C_{60}$ aryl group, n11 and n12 are each independently 0, 1, 2, or 3, and the sum of n11 and n12 is 1 or greater, and c12 is an integer of 1 to 6.

2. The organic light-emitting apparatus of claim 1, wherein the host is a material that is capable of emitting delayed fluorescence.

3. The organic light-emitting apparatus of claim 1, wherein $L_1$ to $L_6$ and $Y_1$ are each independently selected from a cyclopentane group, a cyclohexane group, a cyclohexene group, a benzene group, a naphthalene group, an anthracene group, and a fluorene group; and a cyclopentane group, a cyclohexane group, a cyclohexene group, a benzene group, a naphthalene group, an anthracene group, and a fluorene group, each substituted with at least one substituent independently selected from deuterium, a $C_1$-$C_{10}$ alkyl group, a $C_1$-$C_{10}$ alkoxy group, and a phenyl group.

4. The organic light-emitting apparatus of claim 1, wherein $R_1$ to $R_9$ and $R_{21}$ to $R_{23}$ are each independently selected from hydrogen, deuterium, a $C_1$-$C_{10}$ alkyl group, a $C_1$-$C_{10}$ alkoxy group, a phenyl group, and —$N(Q_1)(Q_2)$, wherein $Q_1$ and $Q_2$ are each independently selected from hydrogen, deuterium, a $C_1$-$C_{10}$ alkyl group, a $C_1$-$C_{10}$ alkoxy group, and a phenyl group, and a1 to a9 are each independently 0, 1, or 2.

5. The organic light-emitting apparatus of claim 1, wherein the hole transport compound is at least one of TCTA, CBP, NPB, MeO-TPD, or any Compounds 1, 2, and 4 to 32:

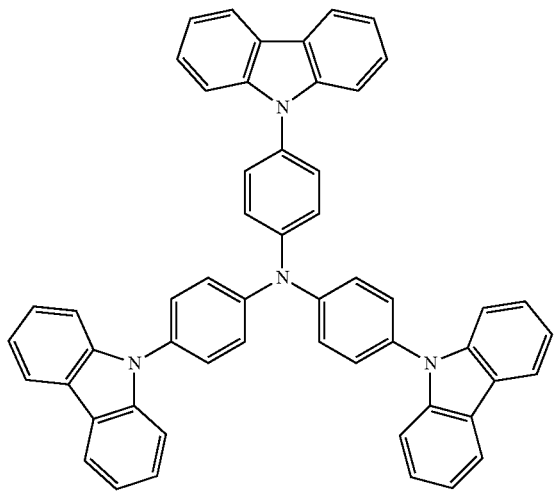

TCTA

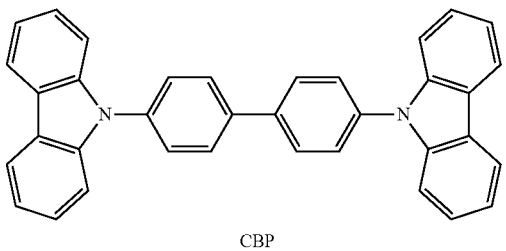

CBP

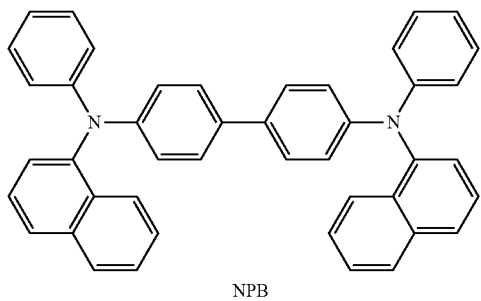

NPB

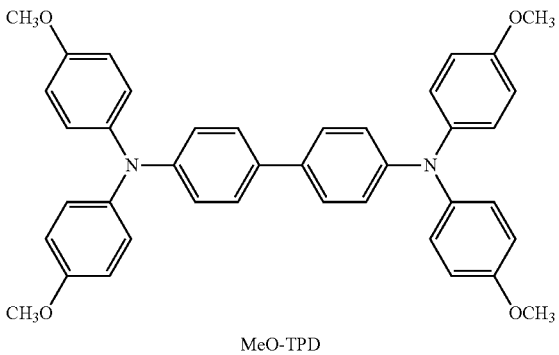

MeO-TPD

-continued
1
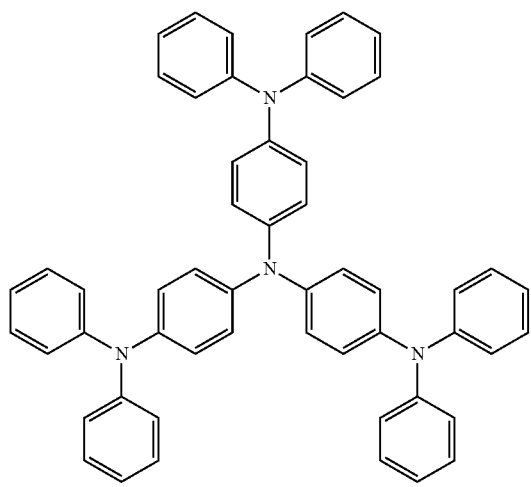
2
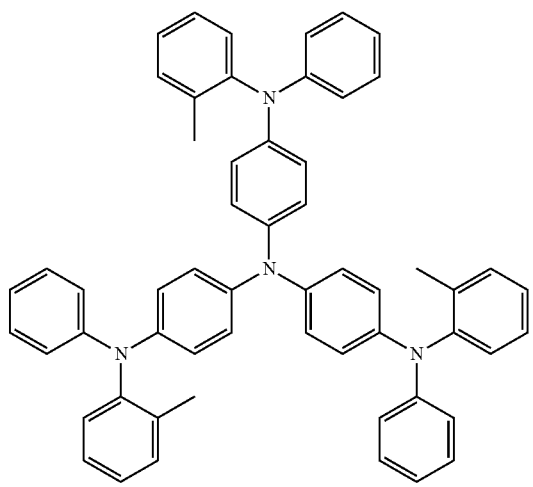
4
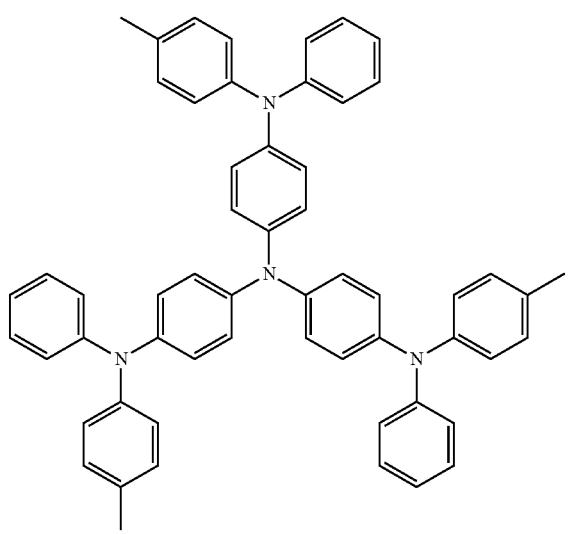
5
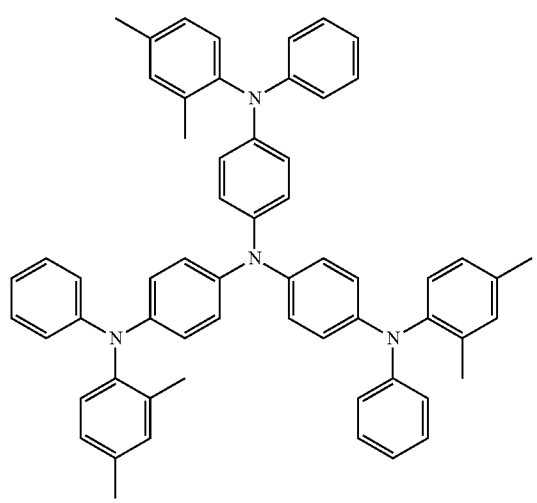
6
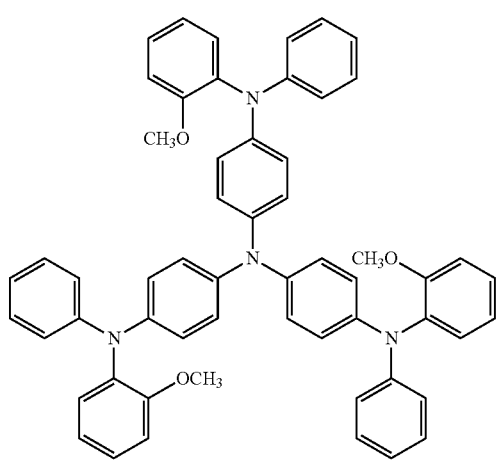

-continued
7
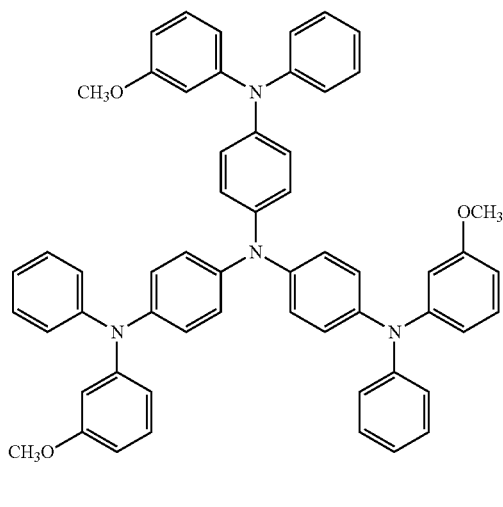
8
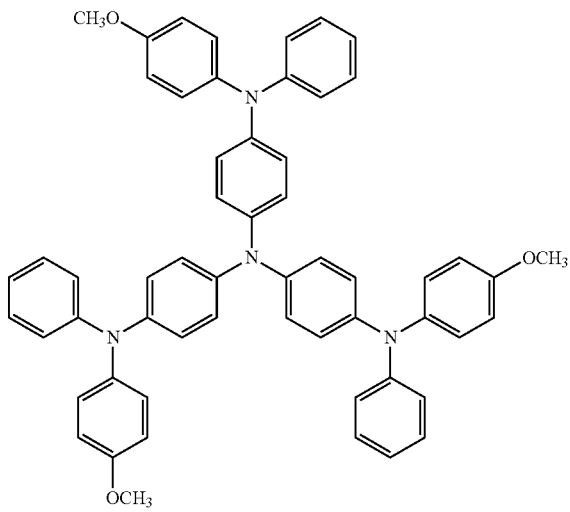
9
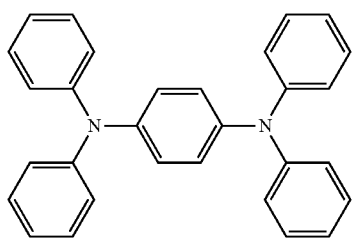
10
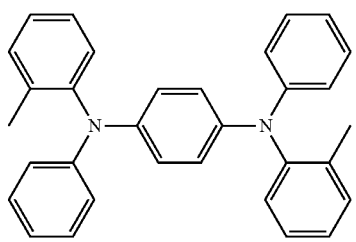
11
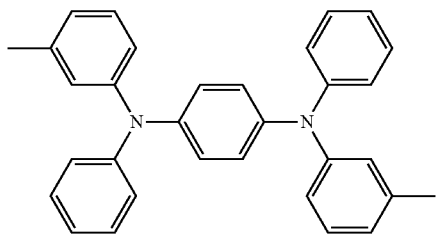
12
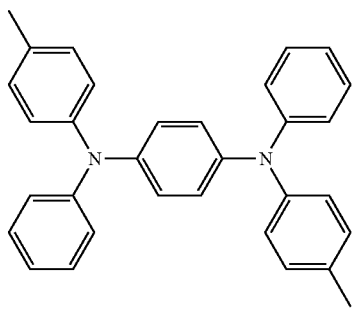
13
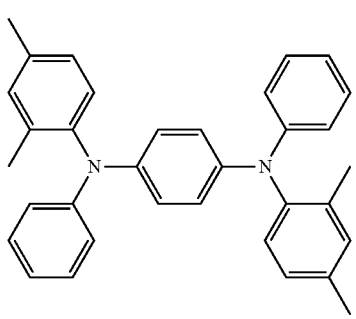
14
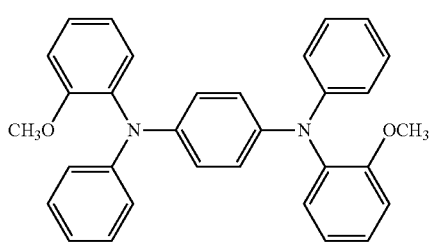

-continued
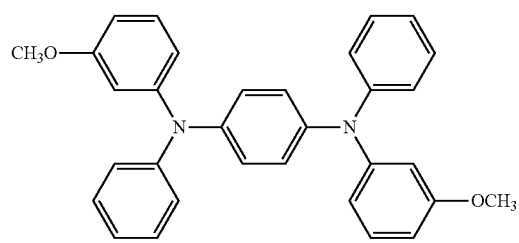
15
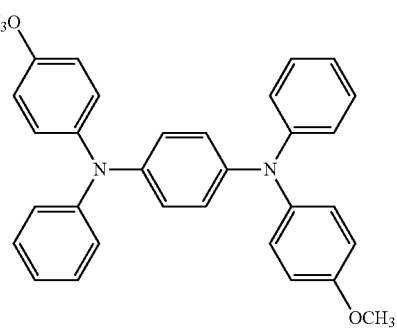
16
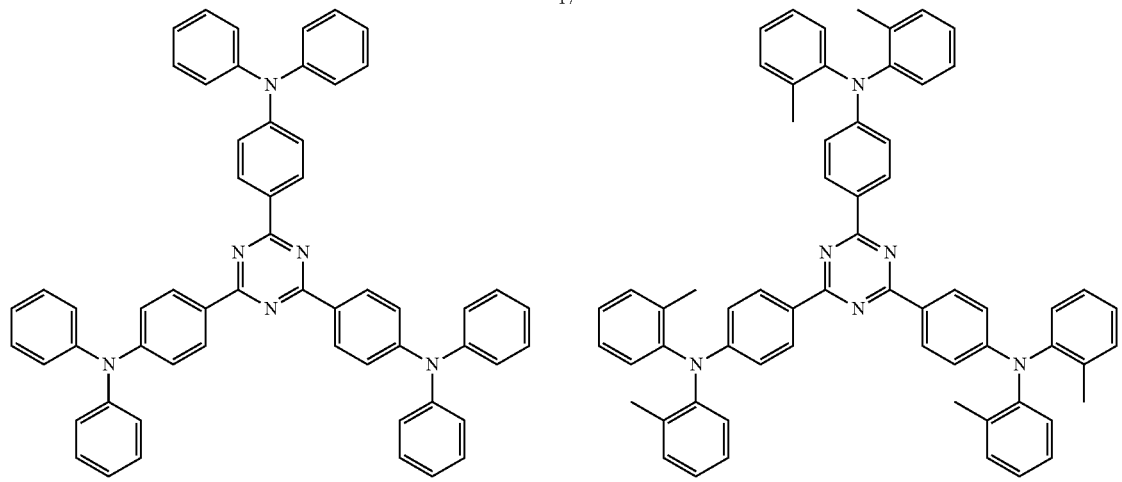
17  18
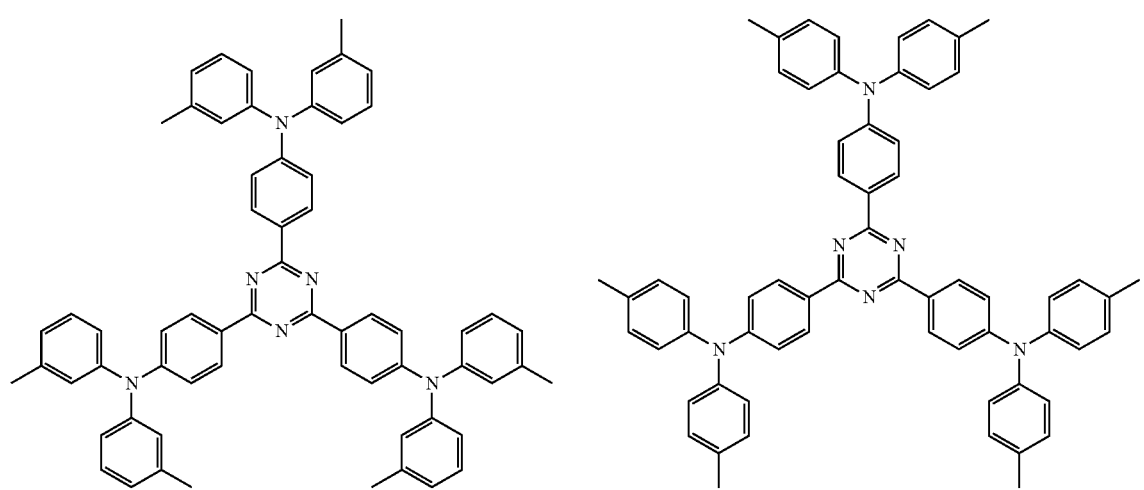
19  20

-continued
21
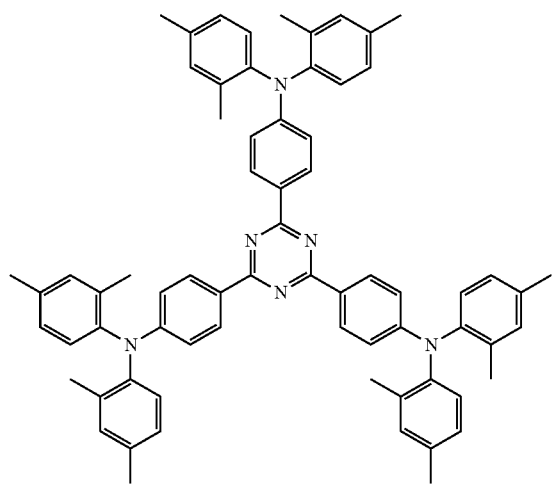
22
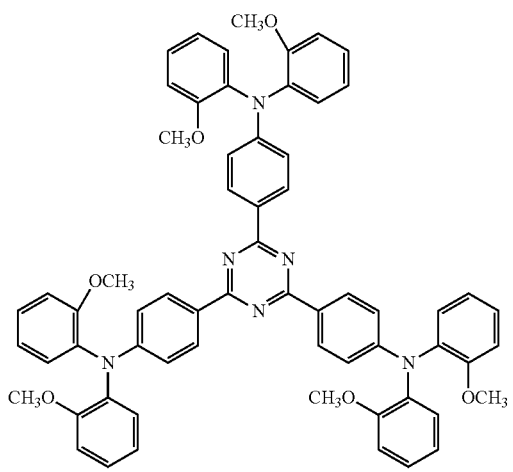
23
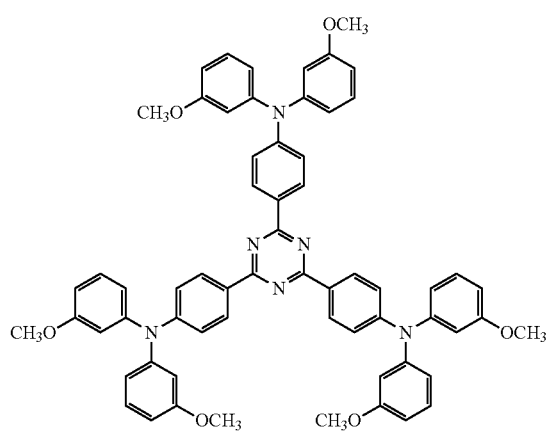
24
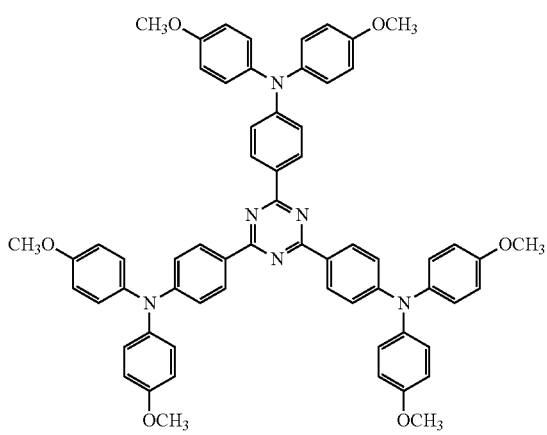
25
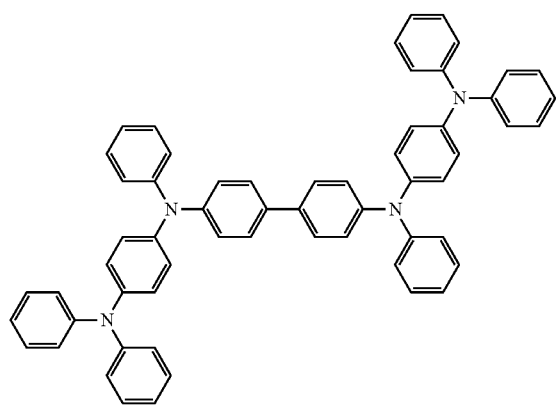
26
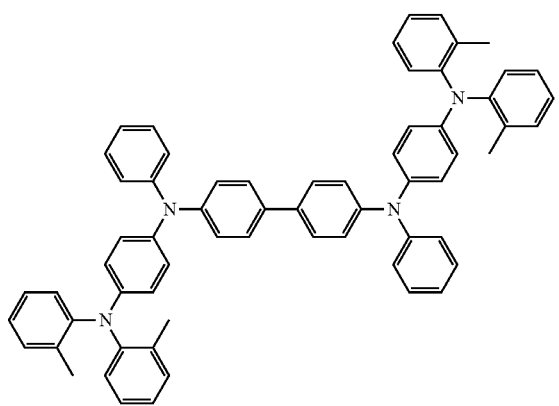

-continued
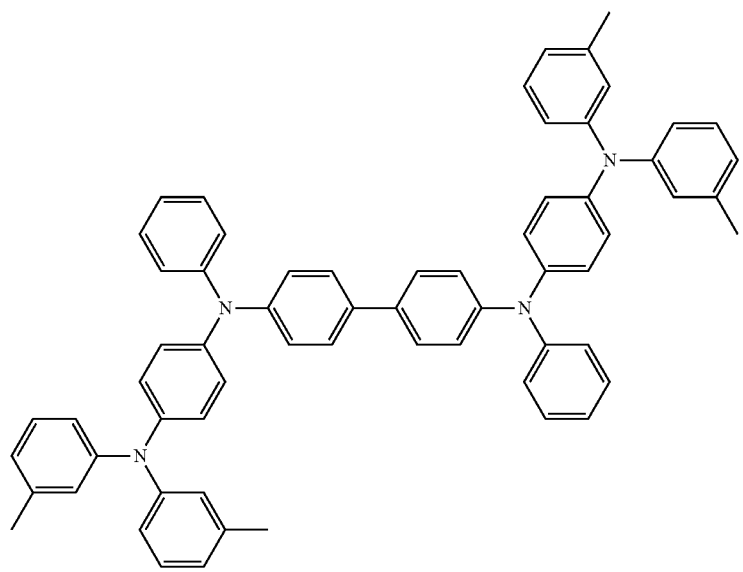
27
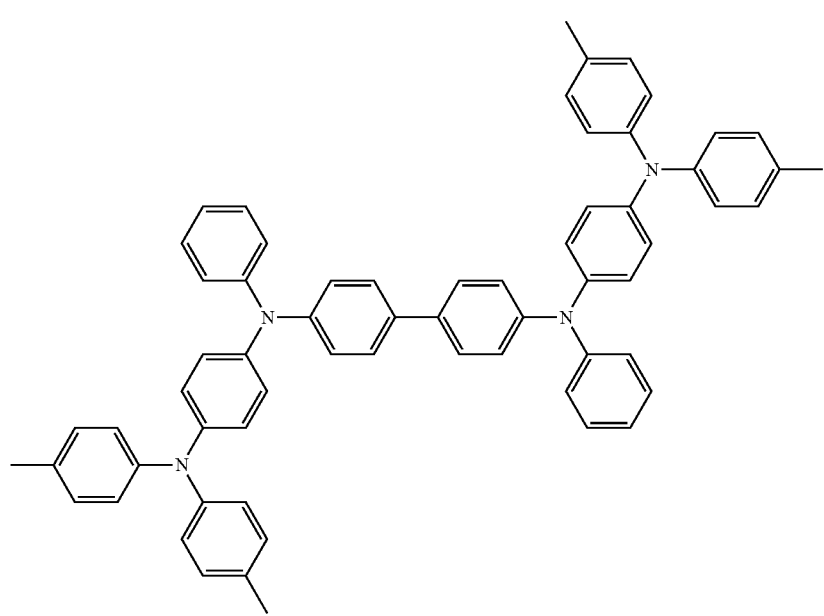
28

-continued
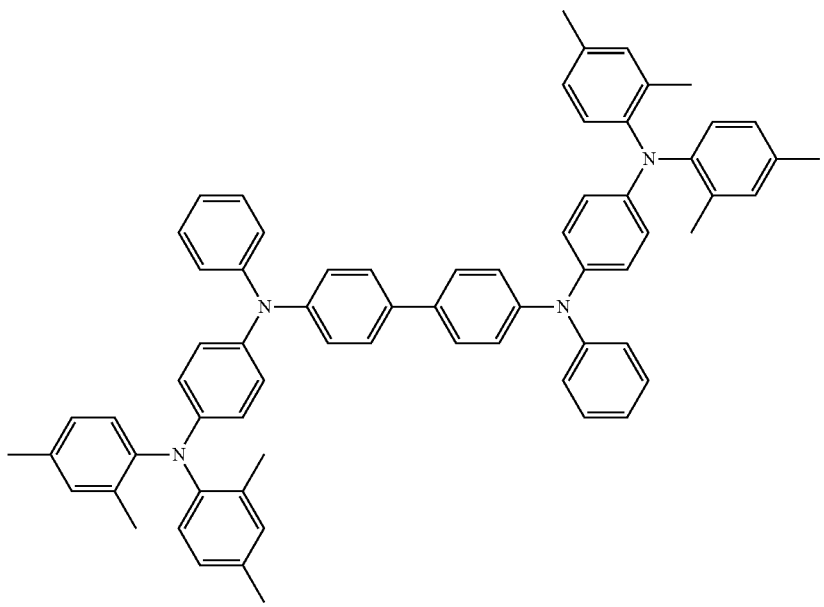
29
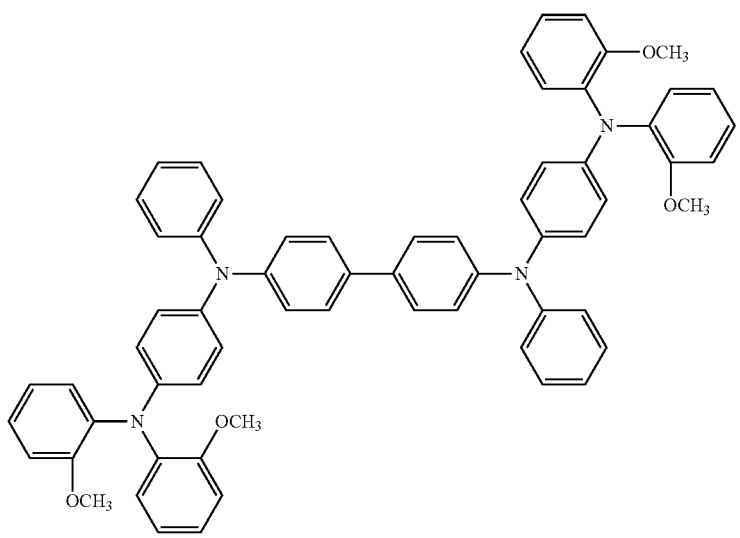
30

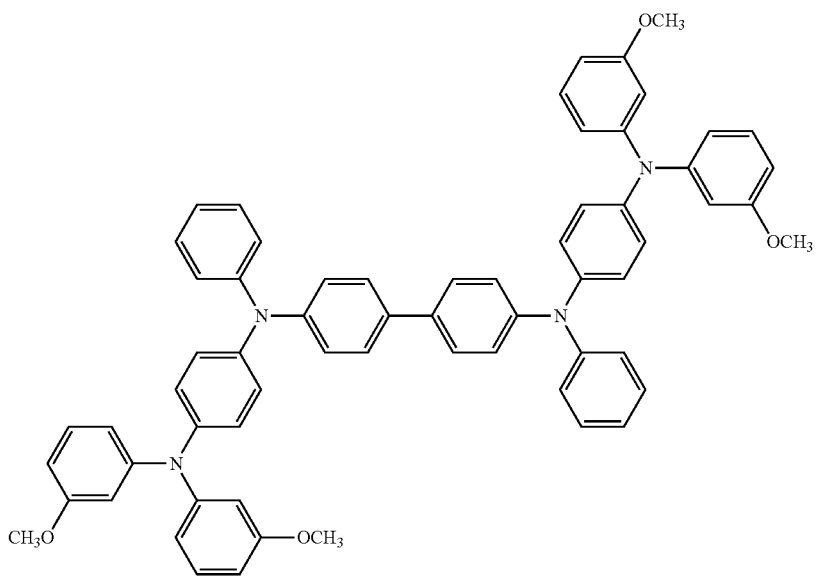

31

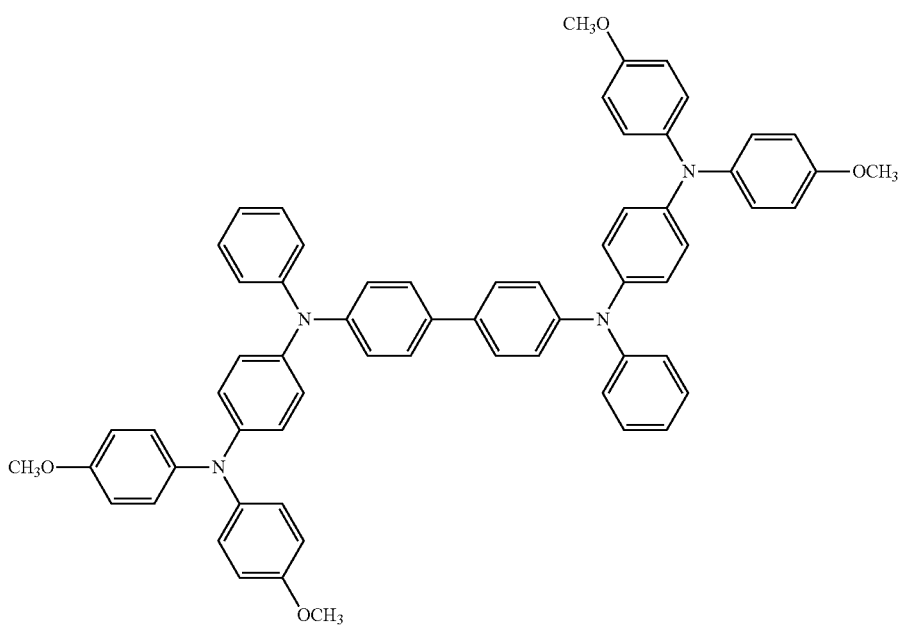

32

6. The organic light-emitting apparatus of claim 1, wherein $L_{11}$ to $L_{13}$ and $Ar_{11}$ are each independently selected from
a cyclopentane group, a cyclopentadiene group, a benzene group, a naphthalene group, an anthracene group, an indene group, a fluorene group, a phenanthrene group, a pyridine group, a pyrimidine group, a pyrazine group, a pyridazine group, a triazine group, a benzoimidazole group, a quinoline group, an isoquinoline group, a quinazoline group, a quinoxaline group, an imidazopyridine group, and an imidazopyrimidine group; and
a cyclopentane group, a cyclopentadiene group, a benzene group, a naphthalene group, an anthracene group, an indene group, a fluorene group, a phenanthrene group, a pyridine group, a pyrimidine group, a pyrazine group, a pyridazine group, a triazine group, a benzoimidazole group, a quinoline group, an isoquinoline group, a quinazoline group, a quinoxaline group, an imidazopyridine group, and an imidazopyrimidine group, each substituted with at least one substituent independently selected from deuterium, a $C_1$-$C_{10}$ alkyl group, a $C_1$-$C_{10}$ alkoxy group, and a phenyl group.

7. The organic light-emitting apparatus of claim 1, wherein
$R_{11}$ to $R_{13}$ and $R_{31}$ to $R_{33}$ are each independently selected from hydrogen, deuterium, a $C_1$-$C_{10}$ alkyl group, and a $C_1$-$C_{10}$ alkoxy group,
$R_{34}$ to $R_{37}$ are each independently selected from
a phenyl group and a naphthyl group; and
a phenyl group and a naphthyl group, each substituted with at least one substituent independently selected from deuterium, a $C_1$-$C_{10}$ alkyl group, and a $C_1$-$C_{10}$ alkoxy group, $R_{34}$ and $R_{35}$ bind to each other via a single bond, and $R_{36}$ and $R_{37}$ bind to each other via a single bond.

8. The organic light-emitting apparatus of claim 1, wherein $Ar_{11}$ to Arm are each independently selected from
 a phenyl group, a naphthyl group, an anthracenyl group, and a fluorenyl group; and
 a phenyl group, a naphthyl group, an anthracenyl group, and a fluorenyl group, each substituted with at least one substituent independently selected from deuterium, a $C_1$-$C_{10}$ alkyl group, and a $C_1$-$C_{10}$ alkoxy group.

9. The organic light-emitting apparatus of claim 1, wherein the electron transport compound is B3PYMPM, TPBi, 3TPYMB, BmPyPB, BSFM, or any one of Compounds 101 to 120:

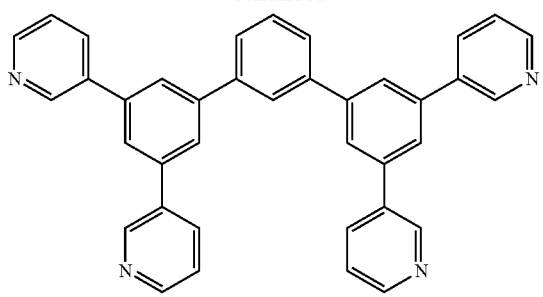

BmPyPB

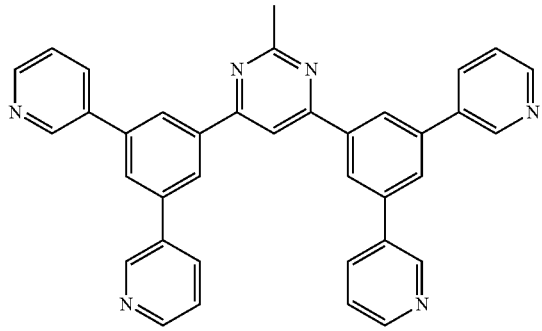

B3PYMPM

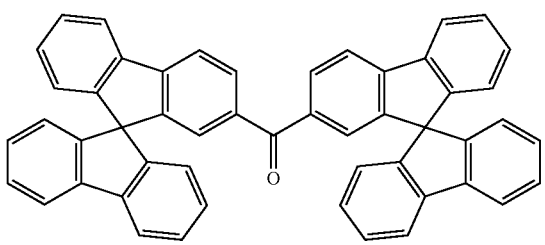

BSFM

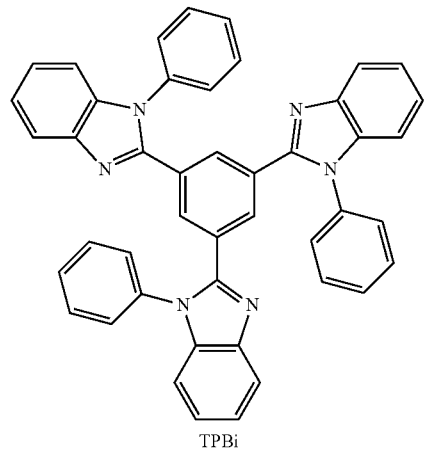

TPBi

101

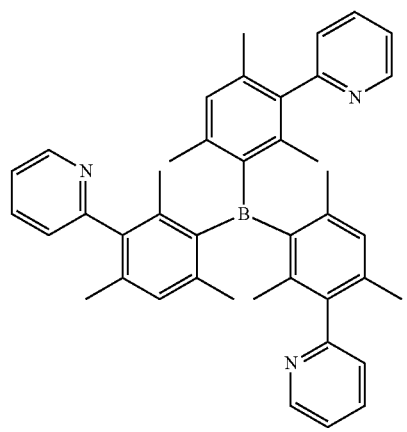

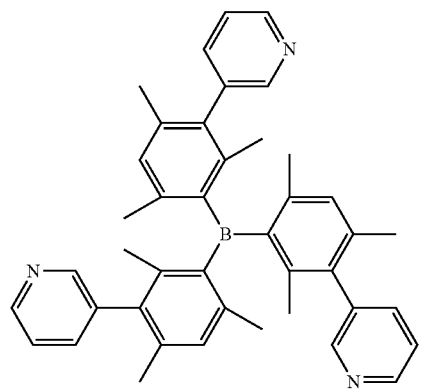

3TPYMB

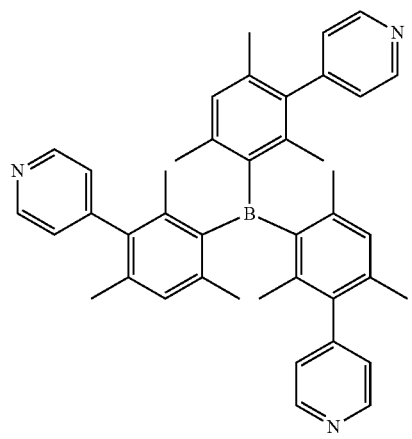

102

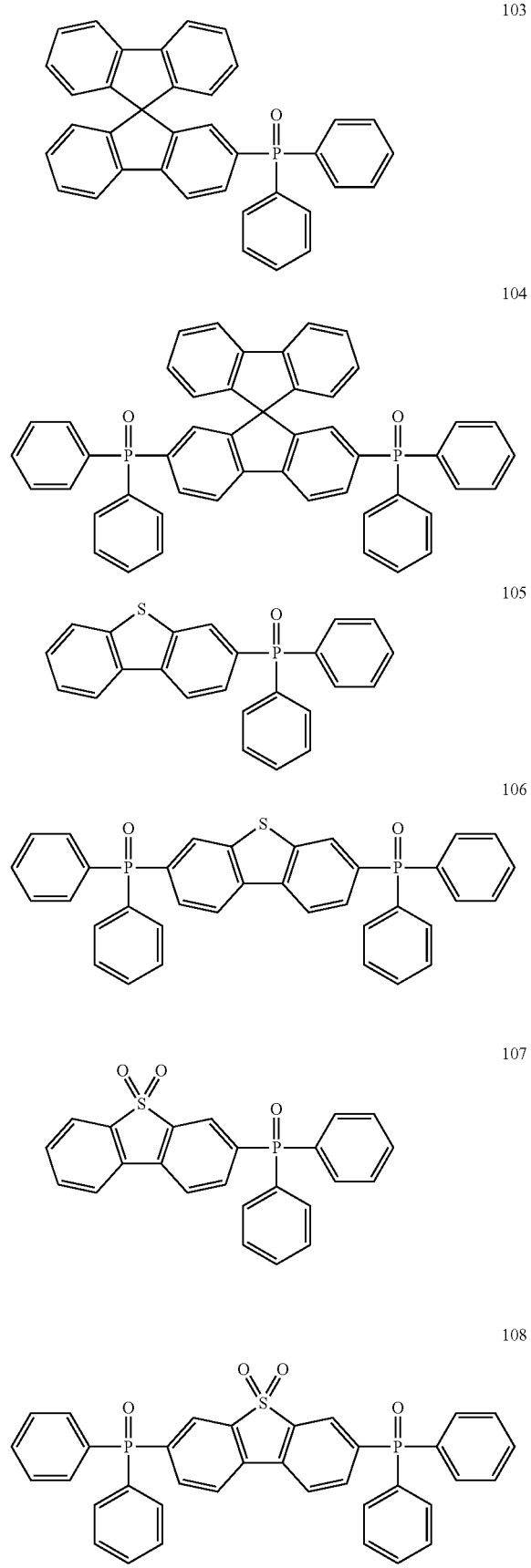
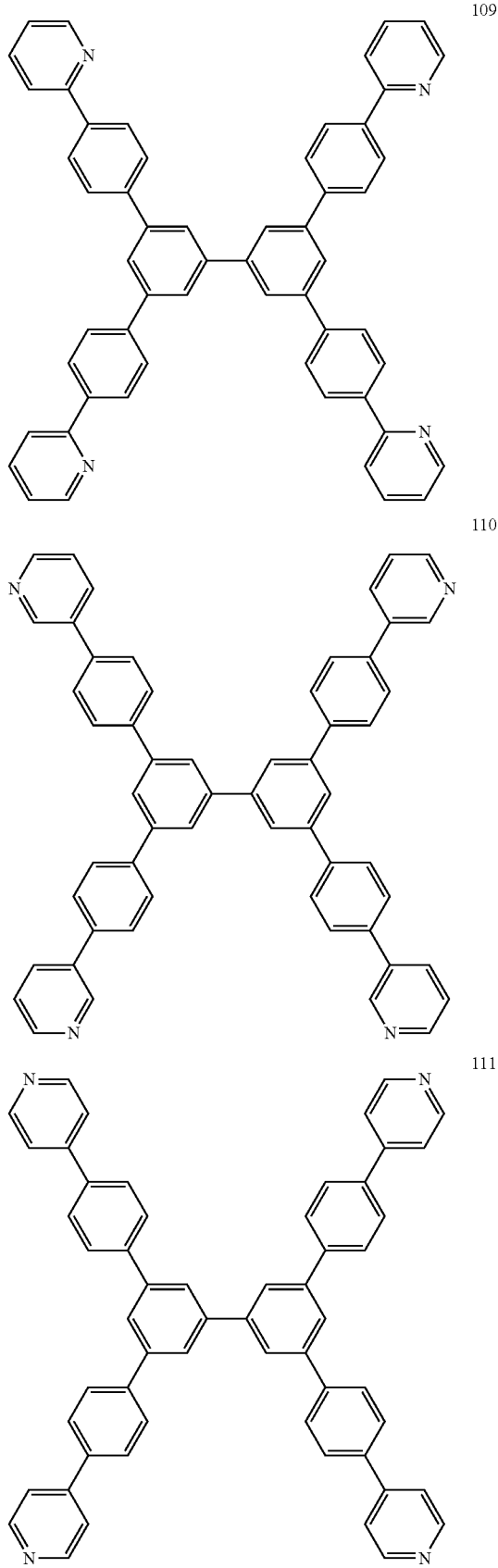

112
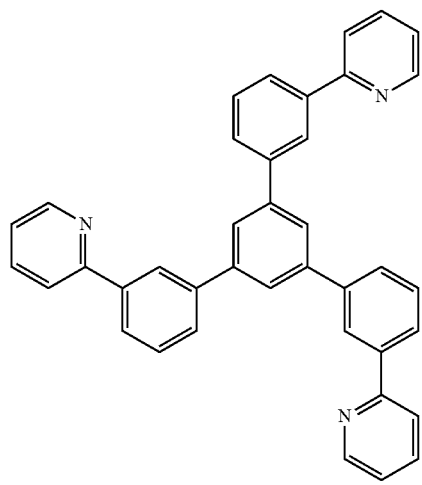
113
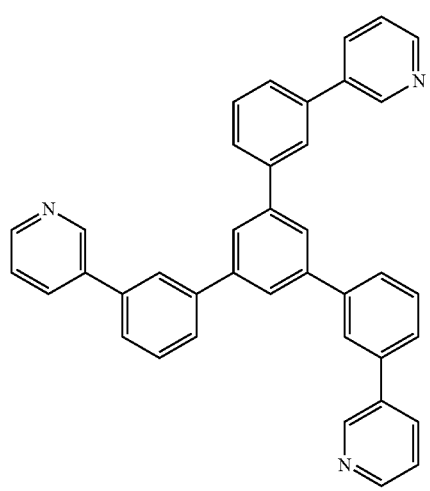
114
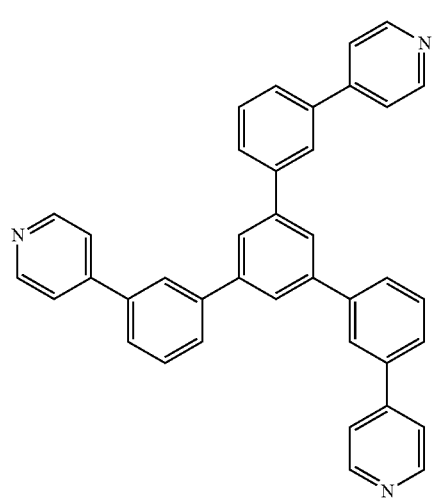
115
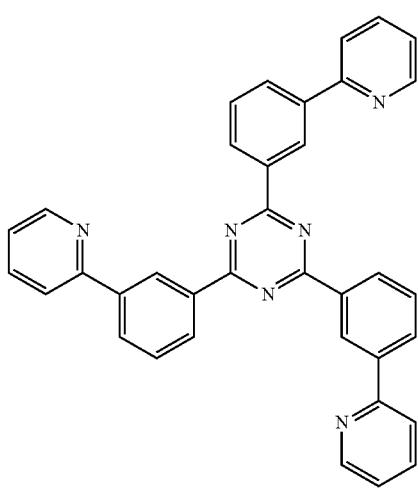
116
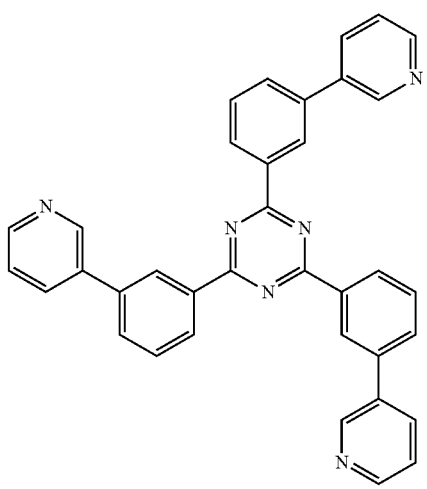
117
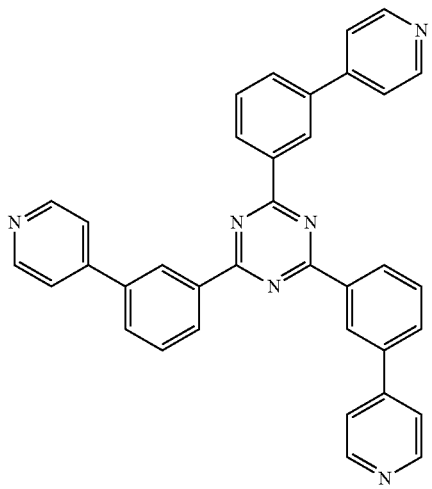

118

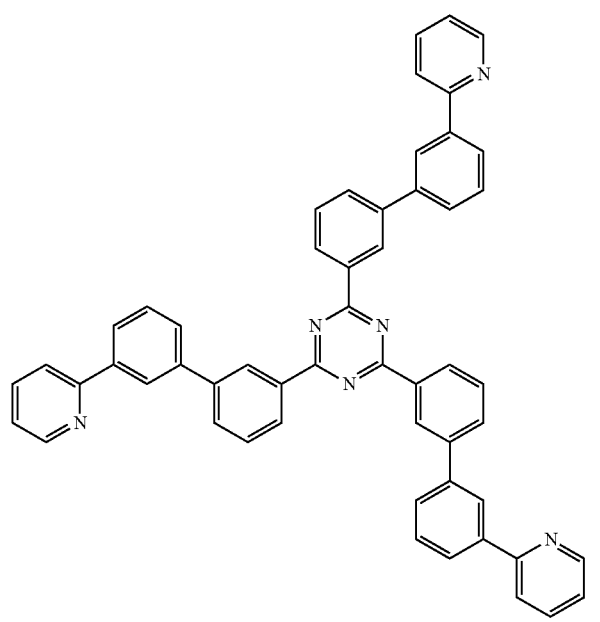

120

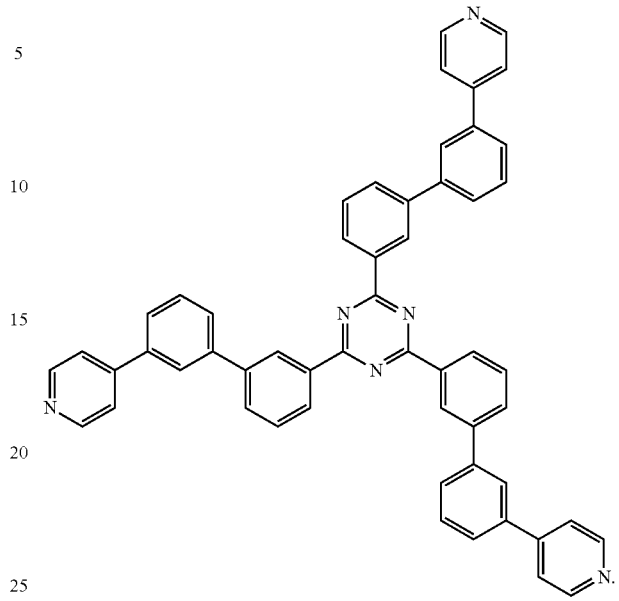

10. The organic light-emitting apparatus of claim 1, wherein the fluorescent dopant comprises a naphthalene core, a fluorene core, a spiro-bifluorene core, a benzofluorene core, a dibenzofluorene core, a phenanthrene core, an anthracene core, a fluoranthene core, a triphenylene core, a pyrene core, a chrysene core, a naphthacene core, a picene core, a perylene core, a pentaphene core, an indenoanthracene core, a tetracene core, a bisanthracene core, a core represented by one of Formulae 501-1 to 501-18, or any combination thereof:

119

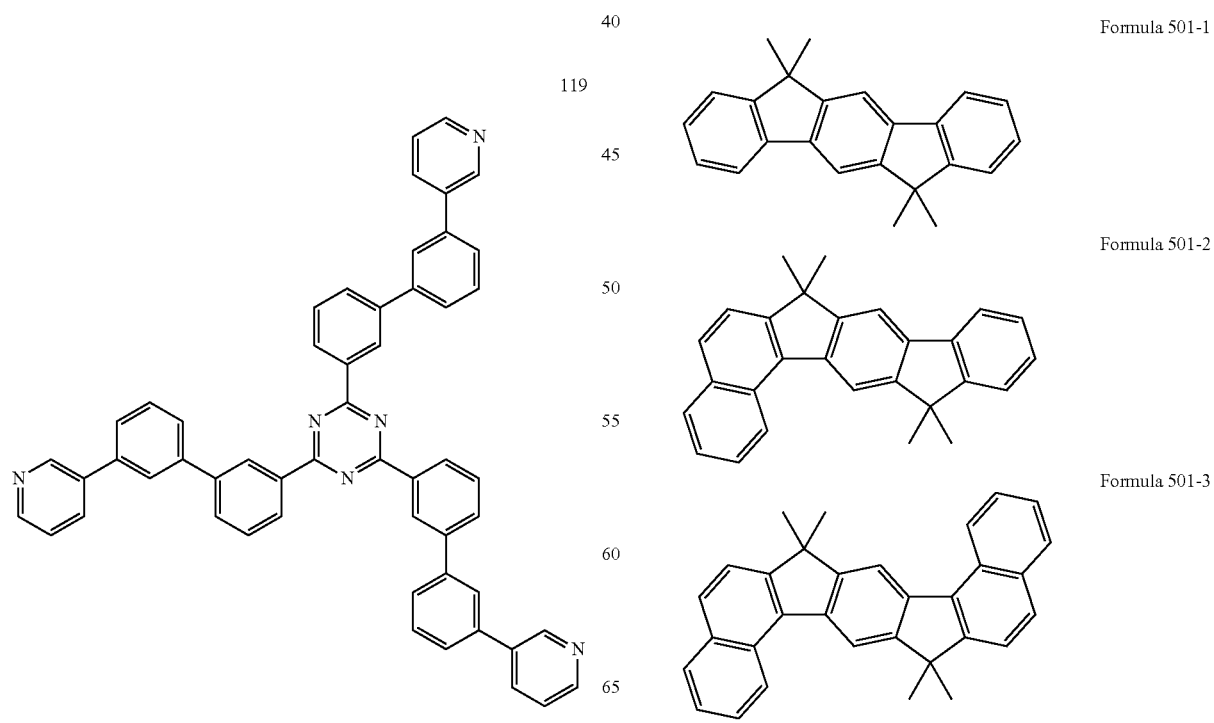

Formula 501-1

Formula 501-2

Formula 501-3

-continued
Formula 501-4
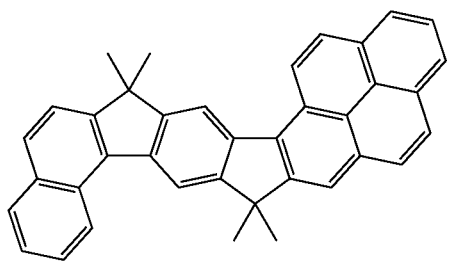
Formula 501-5
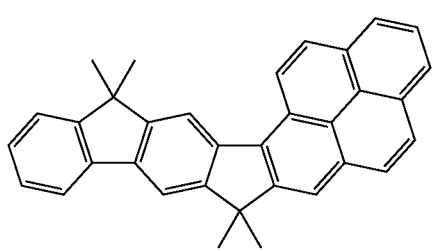
Formula 501-6
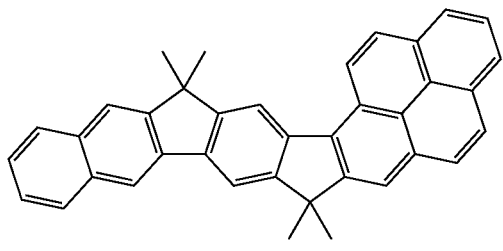
Formula 501-7
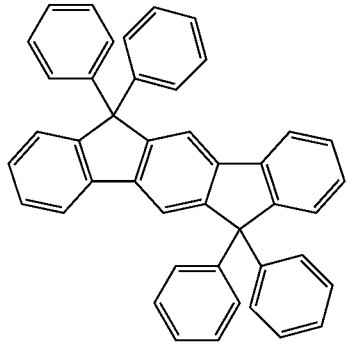
Formula 501-8
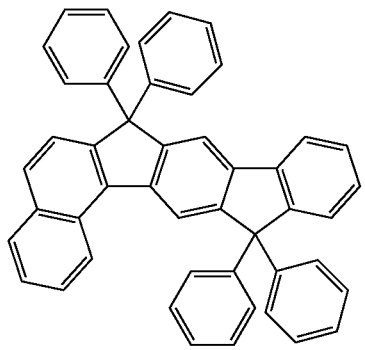
-continued
Formula 501-9
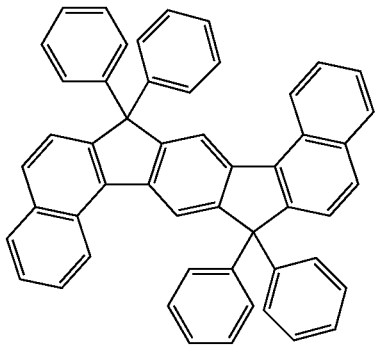
Formula 501-10
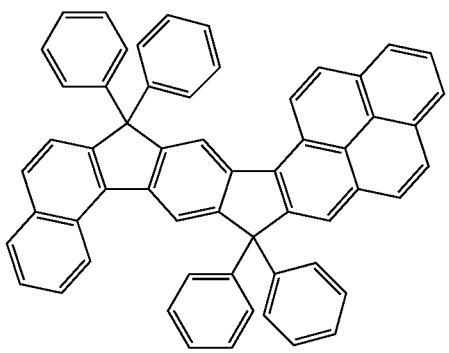
Formula 501-11
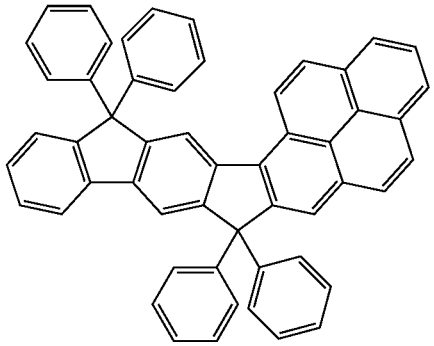
Formula 501-12
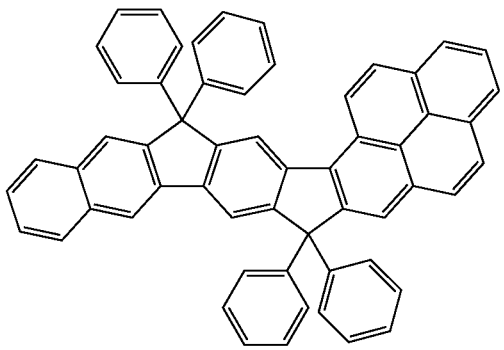

Formula 501-13
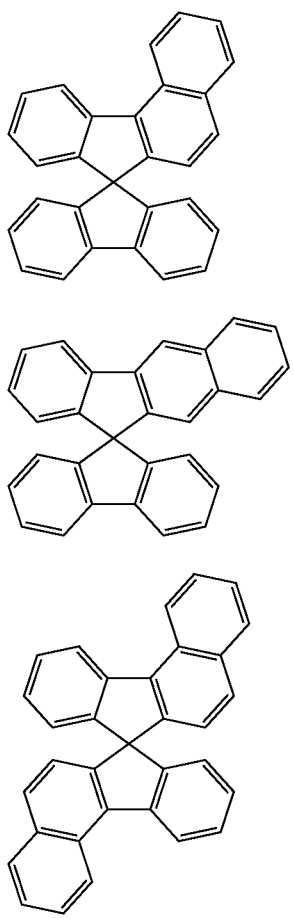
Formula 501-14
Formula 501-15
Formula 501-16
Formula 501-17
Formula 501-18
11. The organic light-emitting apparatus of claim 1, wherein the fluorescent dopant is at least one compound represented by Formula 501:
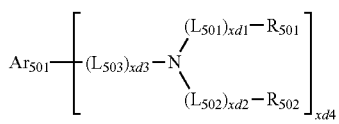
Formula 501
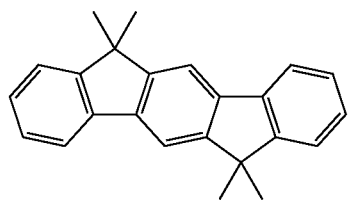
Formula 501-1
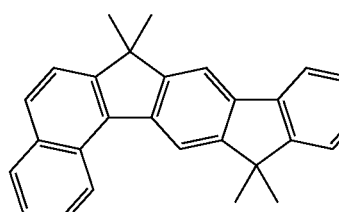
Formula 501-2
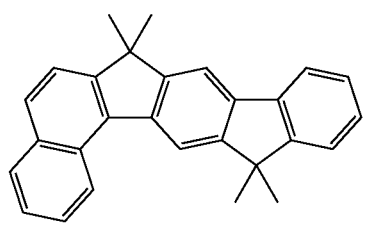
Formula 501-3
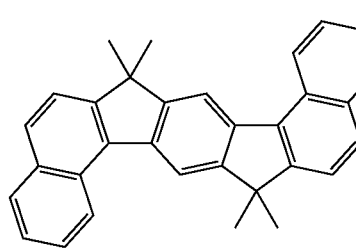
Formula 501-4
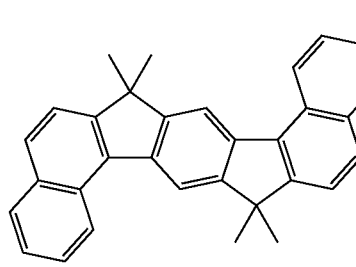
Formula 501-5
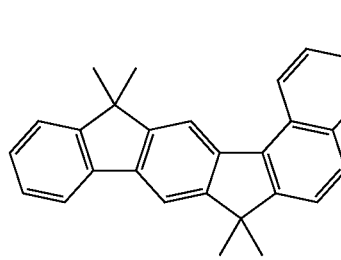
Formula 501-6
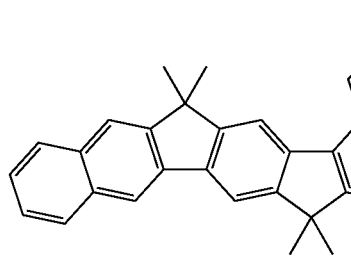

Formula 501-7
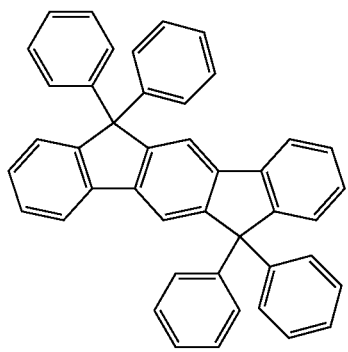
Formula 501-8
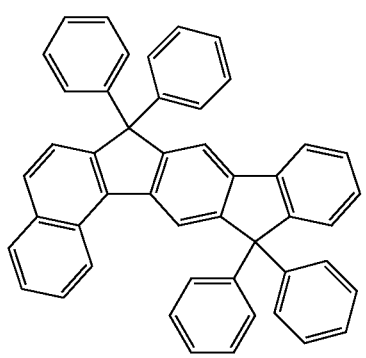
Formula 501-9
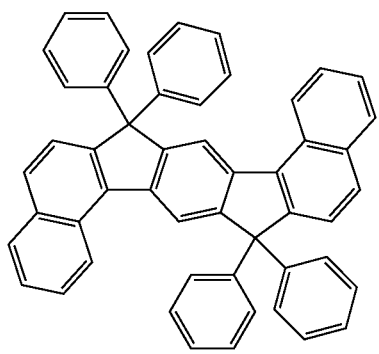
Formula 501-10
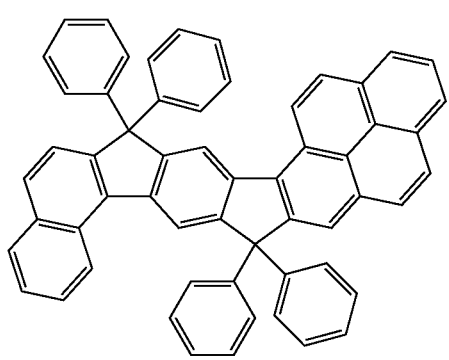
Formula 501-11
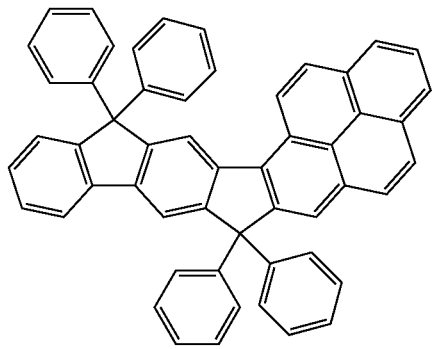
Formula 501-12
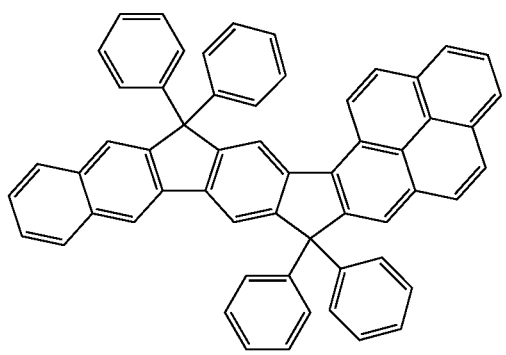
Formula 501-13
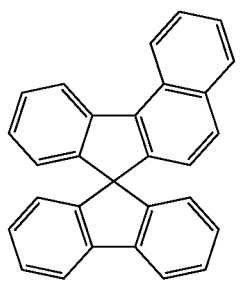
Formula 501-14
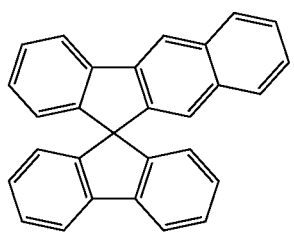
Formula 501-15
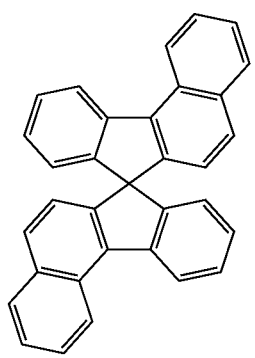

-continued

Formula 501-16

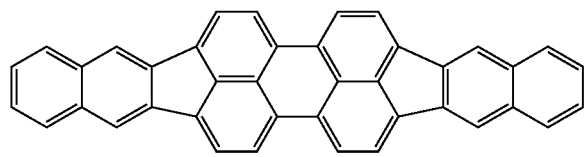

Formula 501-17

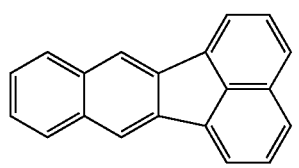

Formula 501-18

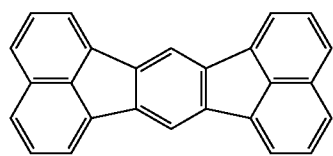

wherein, in Formula 501, $Ar_{501}$ is selected from a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, and a group represented by one of Formulae 501-1 to 501-18; and a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, and a group represented by one of Formulae 501-1 to 501-18, each substituted with at least one substituent independently selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$) (wherein $Q_{501}$ to $Q_{503}$ are each independently selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group), $L_{501}$ to $L_{503}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $R_{501}$ and $R_{502}$ are each independently selected from a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one substituent independently selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, xd1 to xd3 are each independently selected from 0, 1, 2, and 3, and xd4 is selected from 0, 1, 2, 3, 4, 5, and 6.

12. The organic light-emitting apparatus of claim 1, wherein the fluorescent dopant comprises at least one of Compounds FD(1) to FD(14), Compounds FD1 to FD13, or any combination thereof:

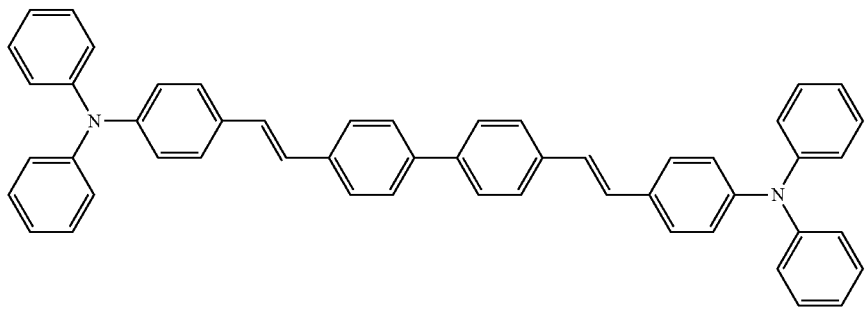
Compound FD(1)
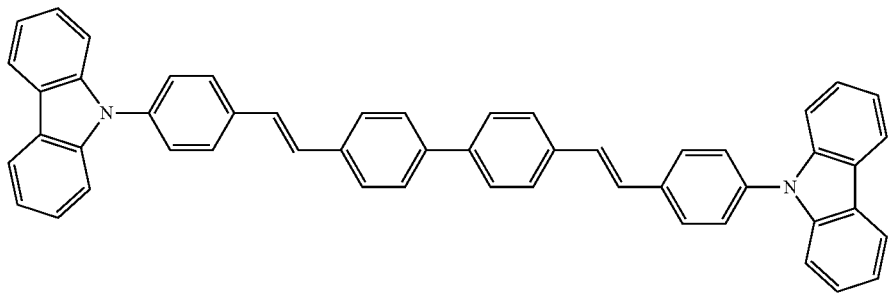
Compound FD(2)
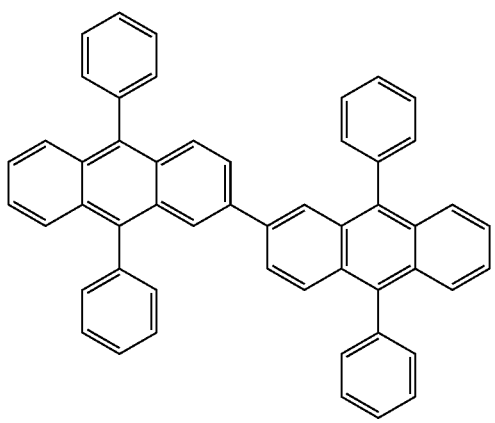
Compound FD(3)
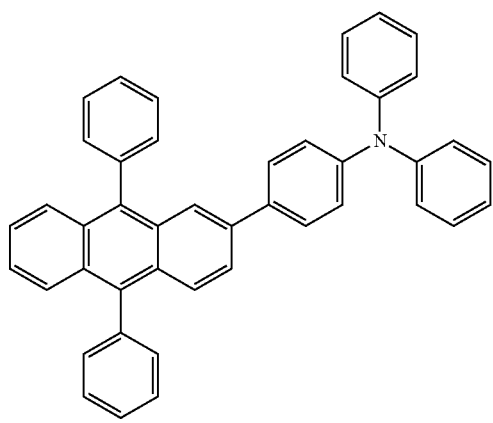
Compound FD(4)
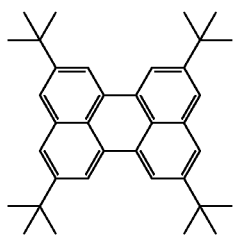
Compound FD(5)
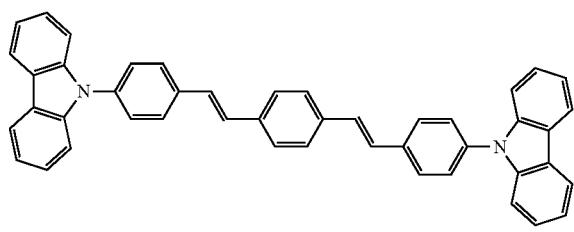
Compound FD(6)
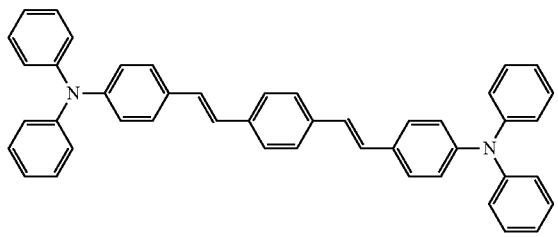
Compound FD(7)
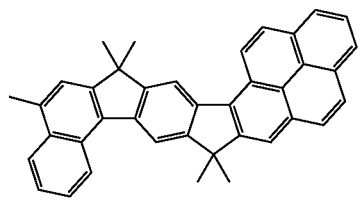
Compound FD(8)

-continued
Compound FD(9)
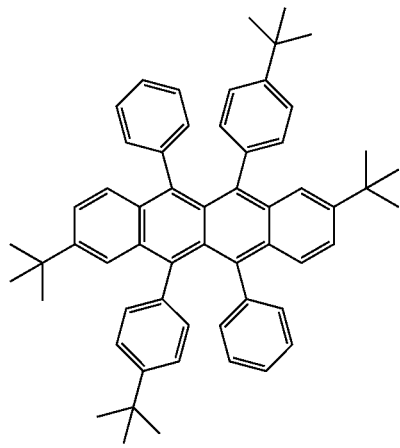
Compound FD(10)
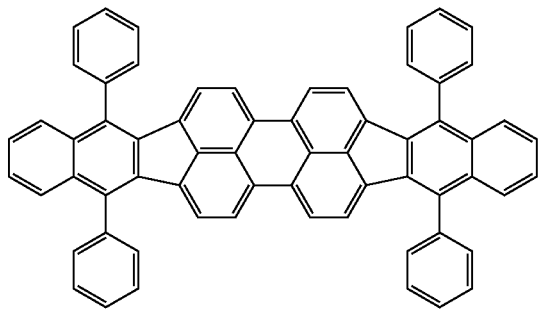
Compound FD(11)
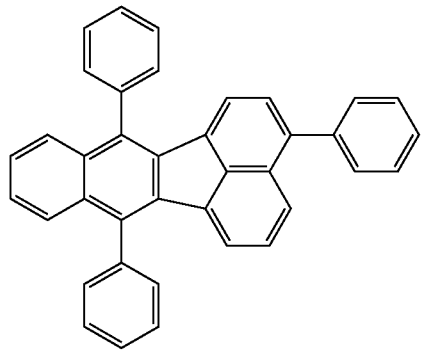
Compound FD(12)
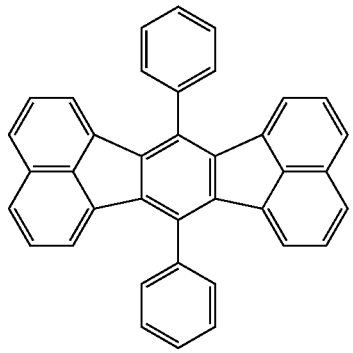
Compound FD(13)
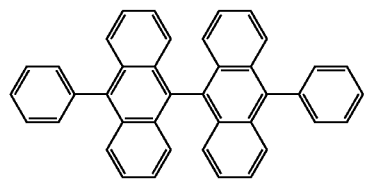
Compound FD(14)
FD1
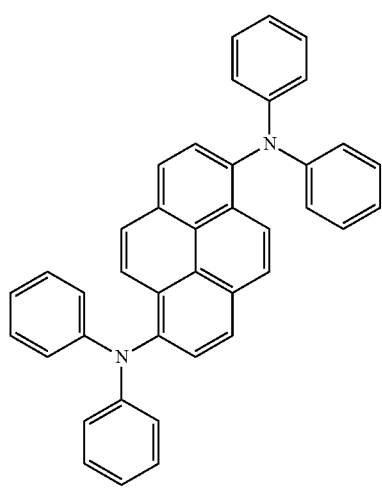
FD2
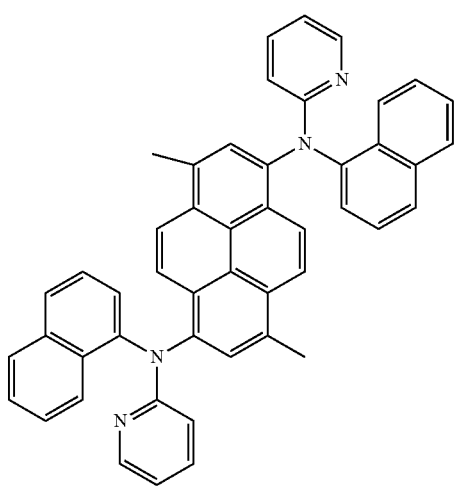

-continued
163    FD3                164    FD4
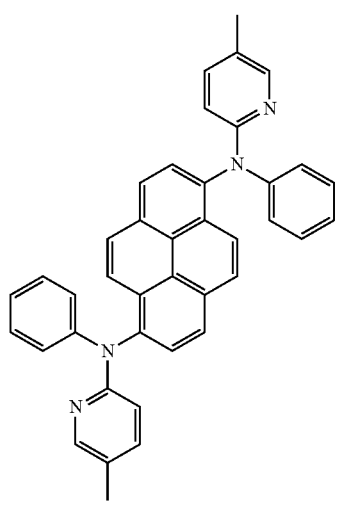
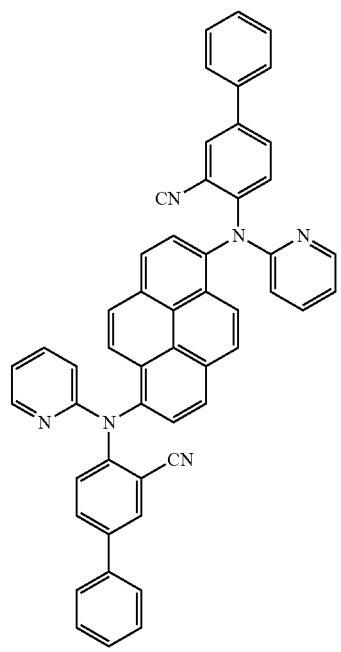
FD5                            FD6
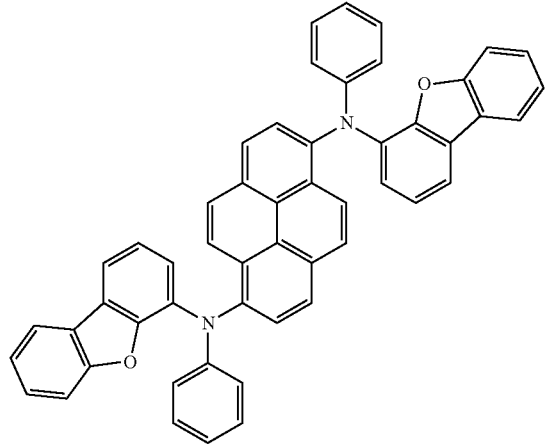
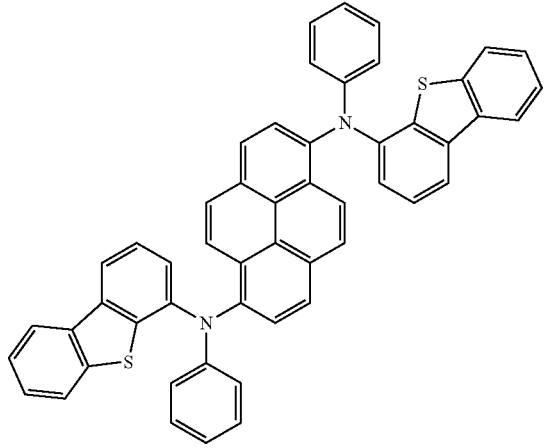
FD7                            FD8
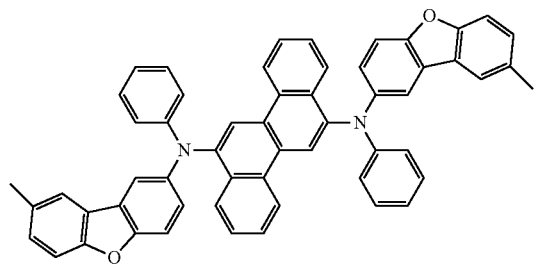
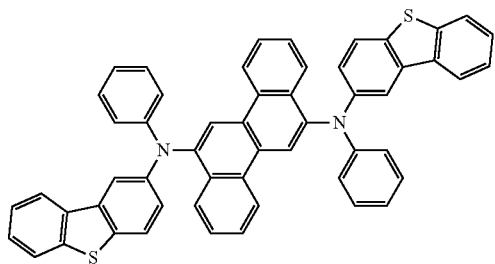

-continued
FD9
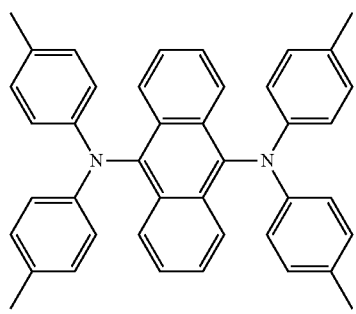
FD10
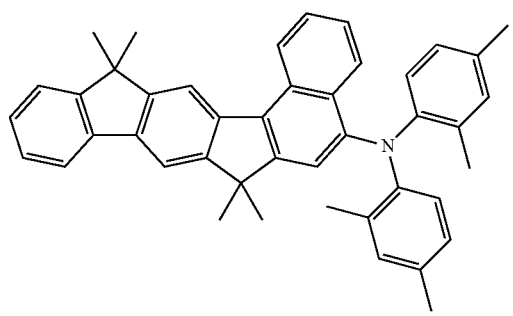
FD11
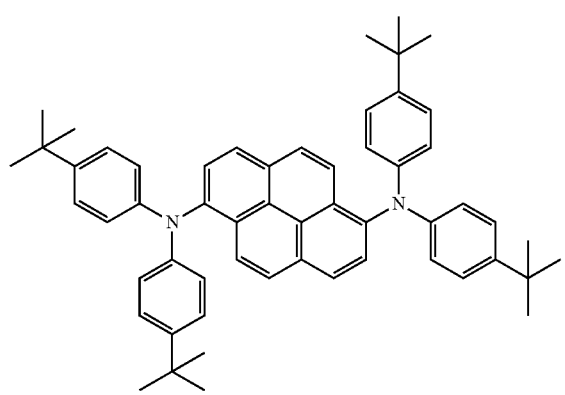
FD12
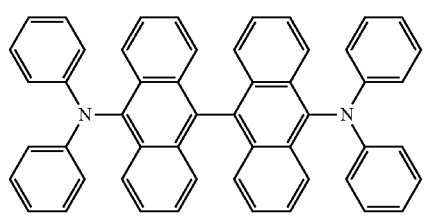
FD13
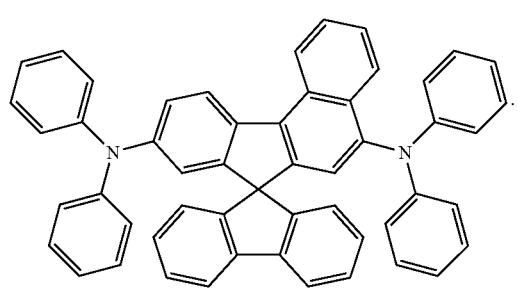

13. The organic light-emitting apparatus of claim 1, wherein the magnetic field-applying member applies a magnetic field in a range of −2000 Gauss to 2000 Gauss to the organic light-emitting device.

* * * * *